(12) United States Patent
Fukuchi et al.

(10) Patent No.: US 7,416,977 B2
(45) Date of Patent: Aug. 26, 2008

(54) METHOD FOR MANUFACTURING DISPLAY DEVICE, LIQUID CRYSTAL TELEVISION, AND EL TELEVISION

(75) Inventors: Kunihiko Fukuchi, Kanagawa (JP); Toshiyuki Isa, Kanagawa (JP); Gen Fujii, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 358 days.

(21) Appl. No.: 11/109,642

(22) Filed: Apr. 20, 2005

(65) Prior Publication Data

US 2005/0244995 A1 Nov. 3, 2005

(30) Foreign Application Priority Data

Apr. 28, 2004 (JP) ............... 2004-134154

(51) Int. Cl.
*H01L 21/44* (2006.01)
(52) U.S. Cl. ............... 438/669; 257/E21.305
(58) Field of Classification Search ............ 438/30, 438/669
See application file for complete search history.

(56) References Cited

U.S. PATENT DOCUMENTS

| | | | |
|---|---|---|---|
| 5,247,375 A | 9/1993 | Mochizuki et al. | |
| 5,483,082 A | 1/1996 | Takizawa et al. | |
| 5,580,796 A | 12/1996 | Takizawa et al. | |
| 5,610,414 A | 3/1997 | Yoneda et al. | |
| 5,908,721 A | 6/1999 | Emoto et al. | |
| 6,416,583 B1 | 7/2002 | Kitano et al. | |
| 6,429,400 B1 | 8/2002 | Sawada et al. | |
| 6,627,263 B2 | 9/2003 | Kitano et al. | |
| 6,660,545 B2 | 12/2003 | Furusawa | |
| 6,715,871 B2 | 4/2004 | Hashimoto et al. | |
| 2002/0014470 A1 | 2/2002 | Okada et al. | |
| 2002/0046681 A1 | 4/2002 | Hirose | |
| 2002/0046682 A1 | 4/2002 | Fan et al. | |
| 2002/0128515 A1 | 9/2002 | Ishida et al. | |

(Continued)

FOREIGN PATENT DOCUMENTS

EP 1340838 A1 9/2003

(Continued)

OTHER PUBLICATIONS

Tetsuo Tsutsui et al., "Electroluminescence in Organic Thin Films", Photochemical Processes in Organized Molecular Systems, Sep. 22-24, 1990, pp. 437-450.

(Continued)

*Primary Examiner*—Thao X. Le
*Assistant Examiner*—Elias Ullah
(74) *Attorney, Agent, or Firm*—Nixon Peabody LLP; Jeffrey L. Costellia

(57) ABSTRACT

An object of the present invention is to provide a method for manufacturing a display device with few steps and high yield. One feature of the invention is to form a first mask pattern having low wettability over a conductive layer, form a second mask pattern having high wettability over the conductive layer using the first mask pattern as a mask, and form a mask pattern for etching the conductive layer by removing the first mask pattern. Another feature is to form a pixel electrode by etching the conductive layer.

48 Claims, 27 Drawing Sheets

U.S. PATENT DOCUMENTS

| | | | |
|---|---|---|---|
| 2002/0136829 A1 | 9/2002 | Kitano et al. |
| 2002/0151171 A1 | 10/2002 | Furusawa |
| 2002/0182890 A1 | 12/2002 | Ishida et al. |
| 2003/0030689 A1 | 2/2003 | Hashimoto et al. |
| 2003/0054653 A1 | 3/2003 | Yamazaki et al. |
| 2003/0059975 A1 | 3/2003 | Sirringhaus et al. |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0148401 A1 | 8/2003 | Agrawal et al. |
| 2004/0050685 A1 | 3/2004 | Yara et al. |
| 2004/0075396 A1 | 4/2004 | Okumura et al. |
| 2005/0001967 A1 | 1/2005 | Chae et al. |
| 2005/0005799 A1 | 1/2005 | Hirai |
| 2005/0007398 A1 | 1/2005 | Hirai |
| 2005/0025880 A1 | 2/2005 | Masuda |
| 2005/0043186 A1 | 2/2005 | Maekawa et al. |
| 2005/0051770 A1 | 3/2005 | Ando et al. |
| 2005/0074963 A1 | 4/2005 | Fujii et al. |
| 2005/0158665 A1 | 7/2005 | Maekawa et al. |

FOREIGN PATENT DOCUMENTS

| | | |
|---|---|---|
| JP | 11-340129 | 12/1992 |
| JP | 06-202153 | 7/1994 |
| JP | 07-024579 | 1/1995 |
| JP | 09-320363 | 12/1997 |
| JP | 11-326951 | 11/1999 |
| JP | 11-340129 | 12/1999 |
| JP | 2000-035511 | 2/2000 |
| JP | 2000-039213 | 2/2000 |
| JP | 2000-068233 | 3/2000 |
| JP | 2000-089213 | 3/2000 |
| JP | 2000-188251 | 7/2000 |
| JP | 2001-068827 | 3/2001 |
| JP | 2001-093871 | 4/2001 |
| JP | 2001-179167 | 7/2001 |
| JP | 20001-179167 | 7/2001 |
| JP | 2002-066391 | 3/2002 |
| JP | 2002-151478 | 5/2002 |
| JP | 2002-151524 | 5/2002 |
| JP | 2002-237463 | 8/2002 |
| JP | 2002-237480 | 8/2002 |
| JP | 2002-289864 | 10/2002 |
| JP | 2002-324966 | 11/2002 |
| JP | 2002-359246 | 12/2002 |
| JP | 2002-359347 | 12/2002 |
| JP | 2003-017413 | 1/2003 |
| JP | 2003-080694 | 3/2003 |
| JP | 2003-197531 | 7/2003 |
| JP | 2003-311197 | 11/2003 |
| JP | 2003-347284 | 12/2003 |
| WO | WO-2001/011426 | 2/2001 |
| WO | WO-01-47044 A2 | 6/2001 |
| WO | WO-02/40742 A1 | 5/2002 |
| WO | WO-2004-070809 A1 | 8/2004 |
| WO | WO-2004/070810 | 8/2004 |
| WO | WO-2004-070811 A1 | 8/2004 |
| WO | WO-2004-070819 A1 | 8/2004 |
| WO | WO-2004-070820 A1 | 8/2004 |
| WO | WO-2004-070821 A1 | 8/2004 |
| WO | WO-2004-070822 A1 | 8/2004 |
| WO | WO-2004-070823 A1 | 8/2004 |
| WO | WO-2005-022262 A1 | 3/2005 |

OTHER PUBLICATIONS

M.A. Baldo et al., "Highly efficient phosphorescent emission from organic electroluminescent devices", Nature, vol. 395, Sep. 10, 1998, pp. 151-154.

M.A. Baldo et al., "Very high-efficiency green organic light-emitting devices based on electrophosphorescence", Applied Physics Letters, Jul. 5, 1999, vol. 75, No. 1, pp. 4-6.

Tetsuo Tsutsui et al., "High Quantum Efficiency in Organic Light-Emitting Devices with Iridium-Complex as a Triplet Emissive Center", Jpn. J. Appl. Phys., vol. 38 (1999), Part 2, No. 12B, Dec. 15, 1999, pp. L1502-L1504.

701 702 701

701 702 701

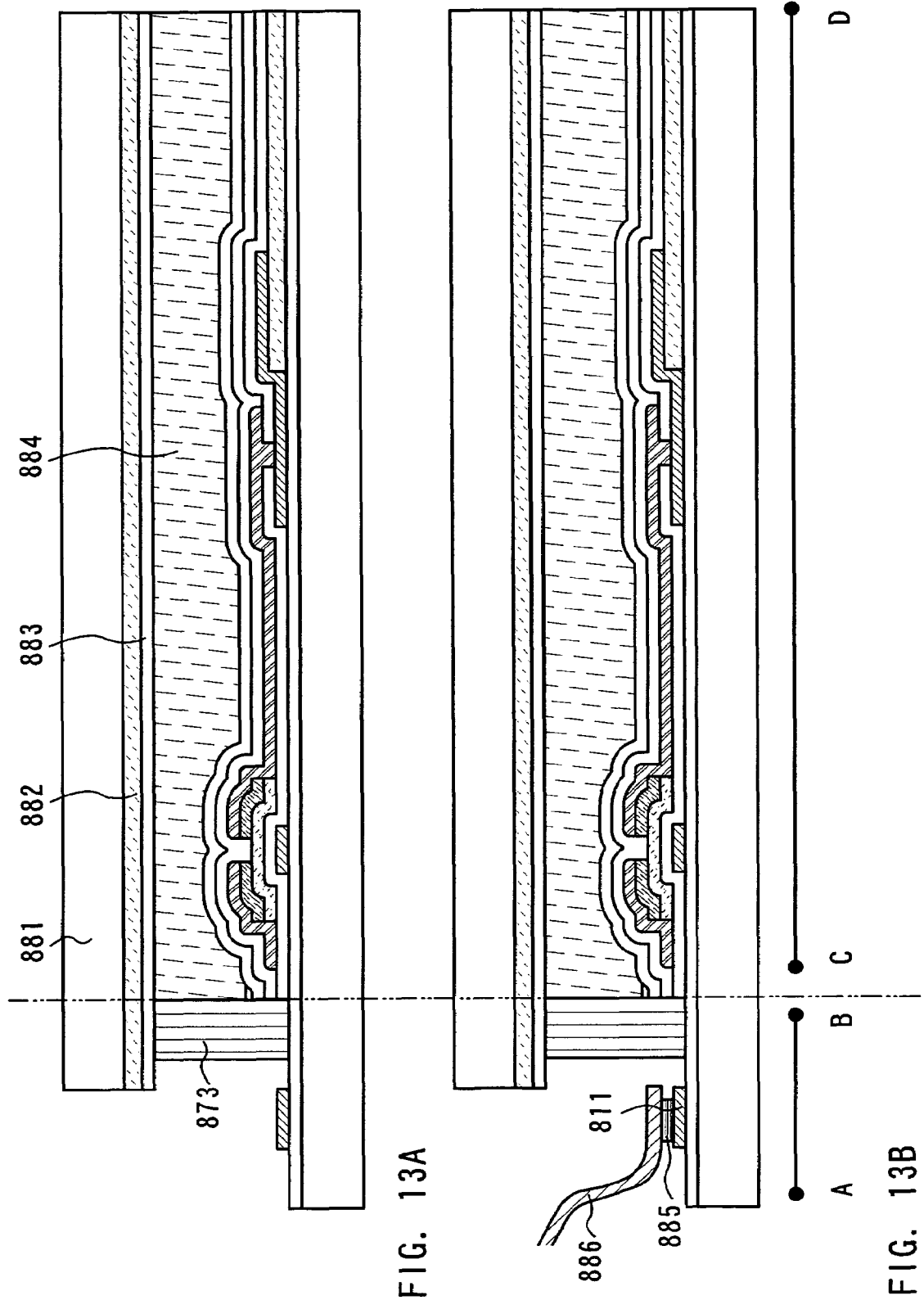

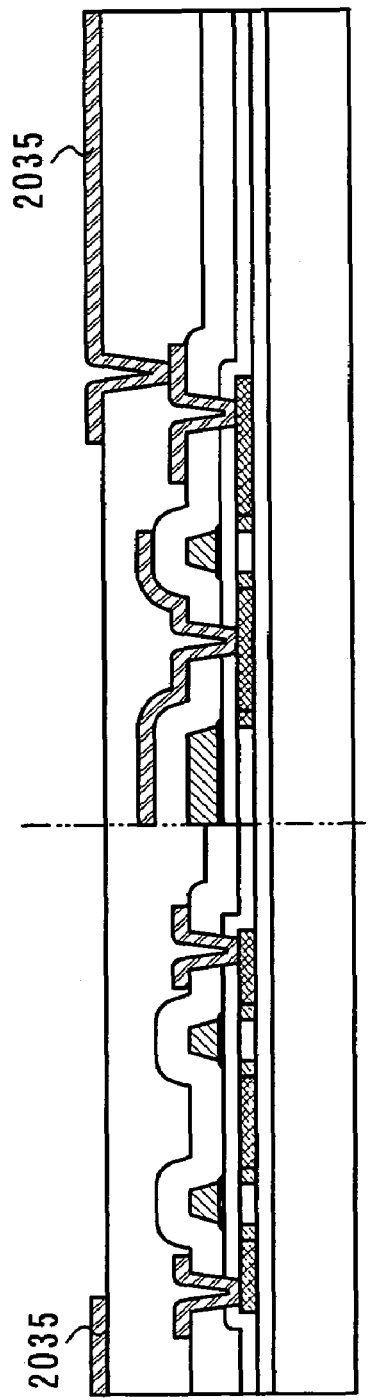
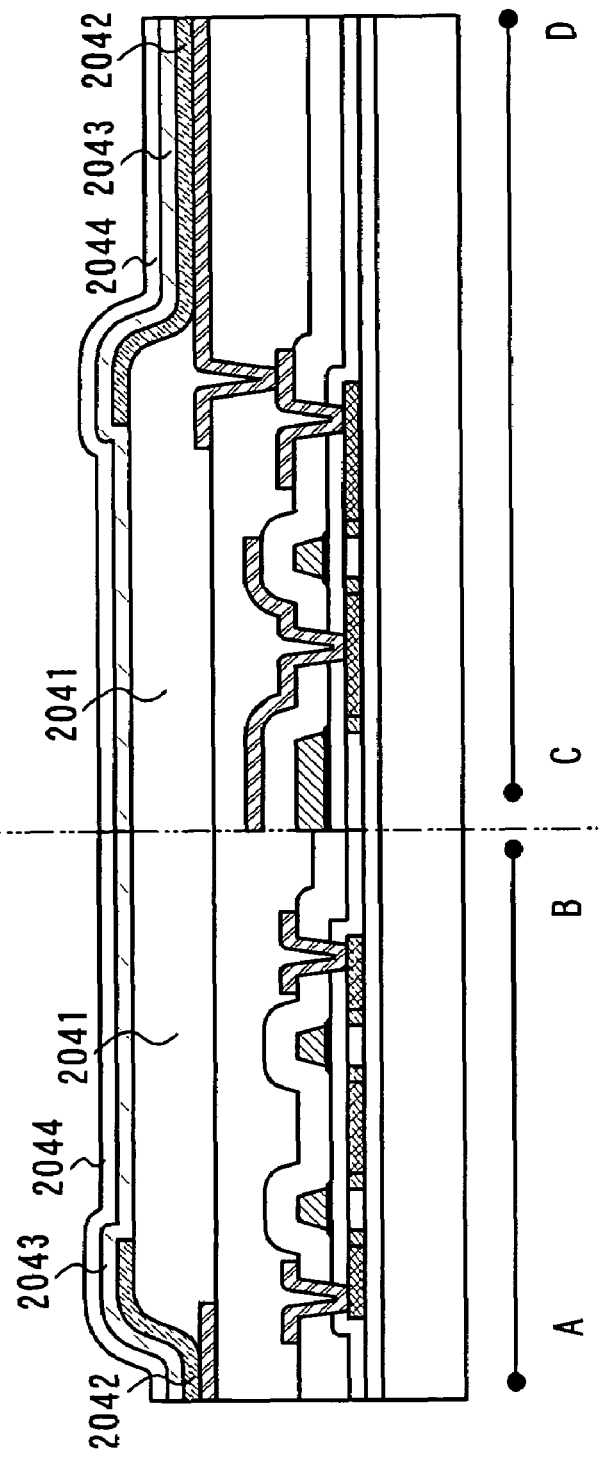
FIG. 18A
FIG. 18B

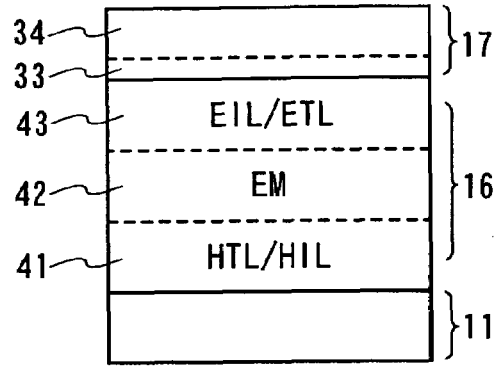
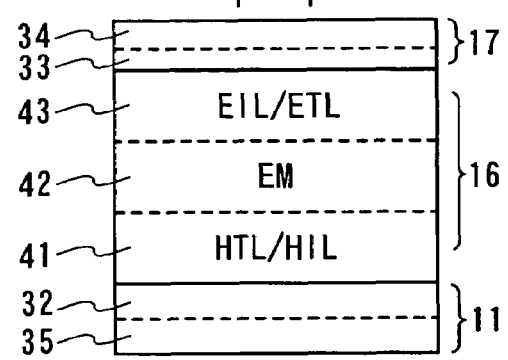
FIG. 20A  FIG. 20B
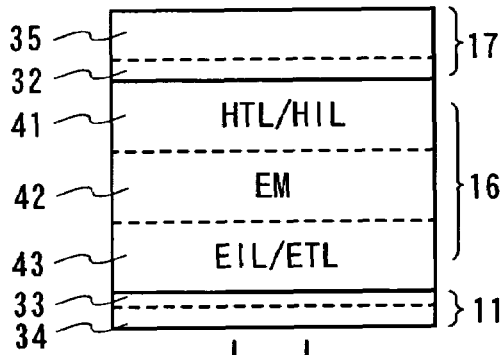
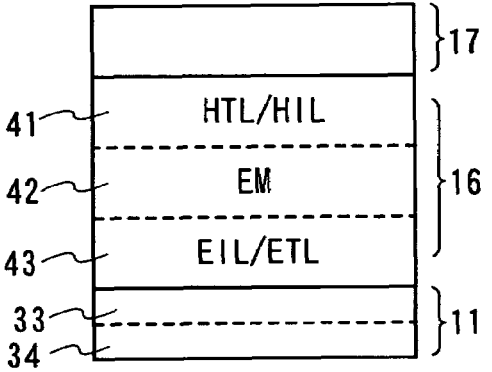
FIG. 20C  FIG. 20D
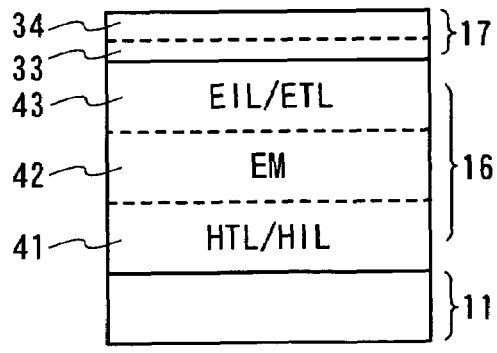
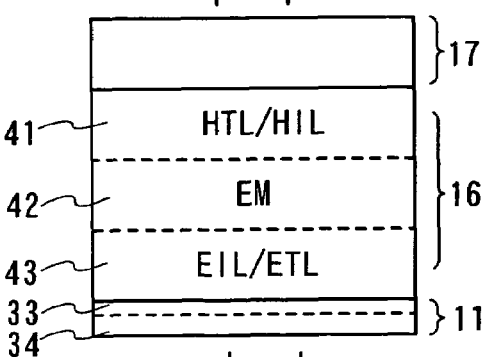
FIG. 20E  FIG. 20F

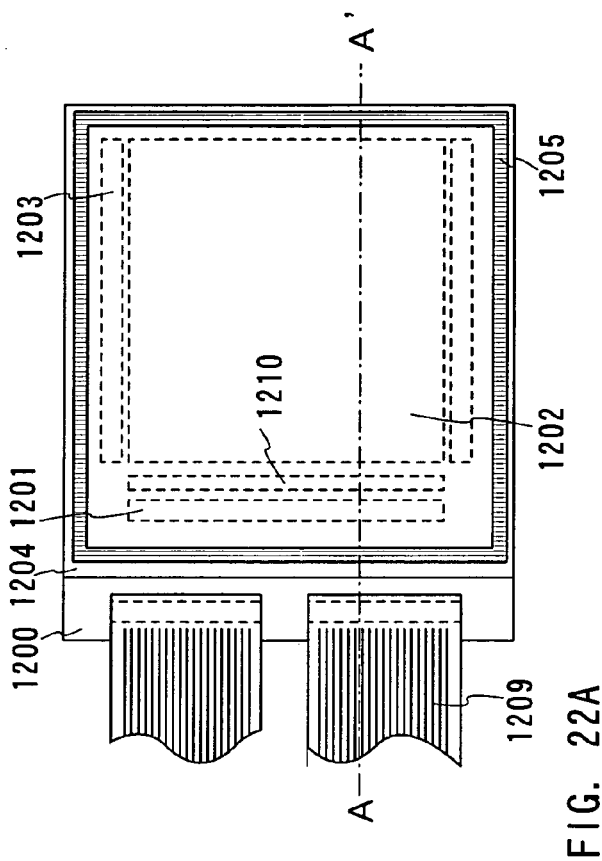
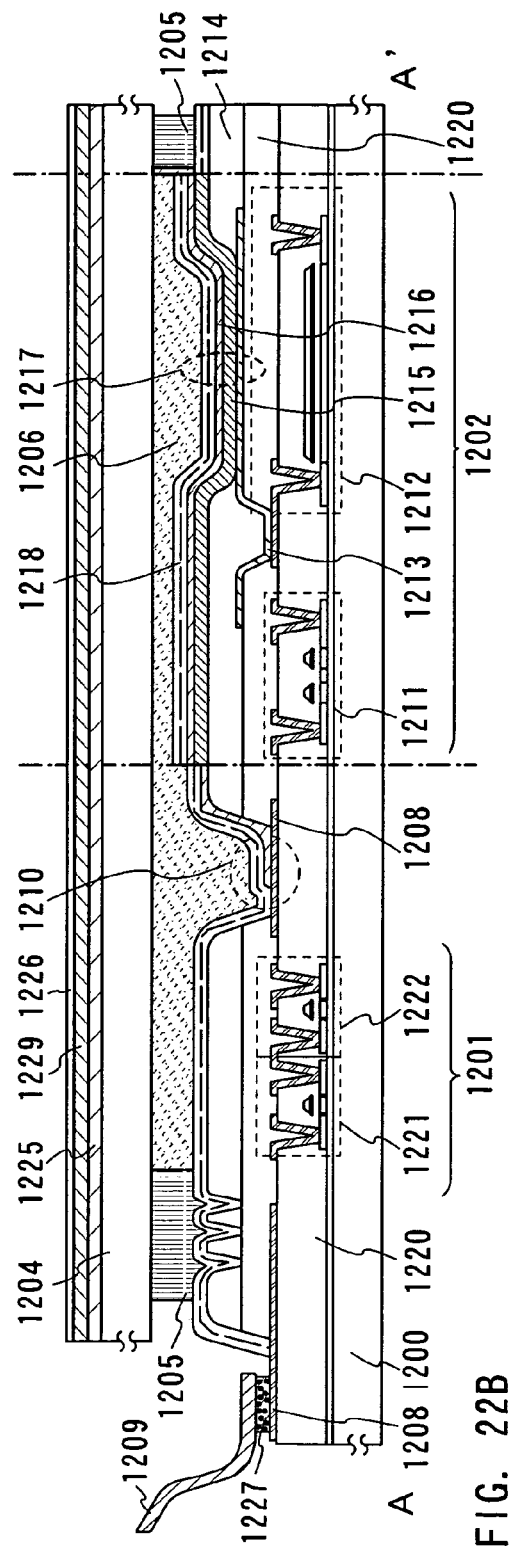
FIG. 22A
FIG. 22B

METHOD FOR MANUFACTURING DISPLAY DEVICE, LIQUID CRYSTAL TELEVISION, AND EL TELEVISION

BACKGROUND OF THE INVENTION

1. Field of the Invention

The invention relates to a display device having a pixel electrode formed by a droplet discharge method typified by an ink-jet method, and a manufacturing method thereof.

2. Description of the Related Art

A so-called active matrix drive display panel including a semiconductor element typified by a thin film transistor (hereinafter also referred to as a "TFT") over a glass substrate is manufactured by patterning according to a light exposure step using a photomask (hereinafter referred to as a photolithography step) and etching various thin films.

In the photolithography step, a resist pattern is formed by coating an entire surface of a substrate with a resist, prebaking, irradiating with ultraviolet light or the like with a photomask therebetween, and then developing. Thereafter, a film pattern of a semiconductor region, an electrode, a wiring, or the like is formed by etching and removing a thin film (a film formed of a semiconductor material, an insulating material, or a conductive material) in a portion not to be a film pattern using the resist pattern as a mask pattern to form a semiconductor element.

Reference 1 discloses a technique for forming a film over a semiconductor wafer by using an apparatus which can continuously discharge a resist from a nozzle to be a linear shape with a fine diameter in order to reduce the loss of a material required for film formation (Reference 1: Japanese Patent Laid-Open No. 2000-188251).

However, since a resist that is a material of a mask pattern is applied to a substrate using a spin coating method in a conventional step of forming a film pattern using a photolithography step, there is a problem of wasting most of a resist material as well as reducing throughput due to a number of steps of forming a mask pattern.

A light exposure apparatus used for the photolithography step has difficulty in performing light exposure treatment on a large-sized substrate at a time. Therefore, a method for manufacturing an active matrix substrate of a display device using a large-sized substrate has a problem of needing to perform light exposure plural times and generating unconformity among adjacent patterns, thereby reducing yield.

SUMMARY OF THE INVENTION

The present invention is made in view of the foregoing problems, and it is an object of the invention to provide a method for manufacturing a display device with few steps and high yield.

One main point of the invention is to form a first mask pattern having low wettability over a conductive layer, form a second mask pattern having high wettability over the conductive layer using the first mask pattern as a mask, and form a mask pattern for etching the conductive layer by removing the first mask pattern.

The first mask pattern has low wettability and tends to repel a composition. On the other hand, the second mask pattern has high wettability, and a composition to be a material of the second mask pattern is spread. A composition to be a material of the second film pattern is repelled in a hemispherical shape by the surface of the first mask pattern. Therefore, the second film pattern can be formed in a self-aligned manner.

A method for exposing an insulating layer to fluorine plasma can be given as an example of a method for forming the first mask pattern having low wettability. A method for generating fluorine plasma includes a method for generating plasma in a fluorine or fluoride atmosphere, a method for generating plasma using an electrode including dielectric having a fluorine resin.

The first mask pattern having low wettability can be formed by coating a predetermined position with a material having low wettability. A compound including a fluorocarbon chain can be given as an example of the material having low wettability.

A difference in a contact angle between the first mask pattern and the second mask pattern is preferably 30°, desirably, 40°. Accordingly, a material of the second mask pattern is repelled in a hemispherical shape by the surface of the first mask pattern, and each mask pattern can be formed in a self-aligned manner.

The second film pattern is preferably used as a mask for forming a pixel electrode.

One feature of the invention is a method for manufacturing a display device, comprising the steps of forming a first mask pattern having low wettability over a first conductive layer, forming a second mask pattern having high wettability over the first conductive layer using the first mask pattern as a mask, removing the first mask pattern, and forming a pixel electrode by etching the first conductive layer using the second mask pattern as a mask.

Another feature of the invention is a method for manufacturing a display device comprising the steps of forming a conductive film over an insulating surface, forming a first mask pattern over the conductive film, forming a second mask pattern over the conductive film and in the outer periphery of the first mask pattern, exposing a part of the conductive film by removing the first mask pattern, and forming a pixel electrode by removing the exposed portion.

Another feature of the invention is a method for manufacturing a display device comprising the steps of forming a conductive film over an insulating surface, forming a first mask pattern over the conductive film, forming a second mask pattern over the conductive film and in a region except for a region where the first mask pattern is formed, exposing a part of the conductive film by removing the first mask pattern, and forming a pixel electrode by removing the exposed portion.

Another feature of the invention is a method for manufacturing a display device comprising the steps of forming a conductive film over an insulating surface, forming a first mask pattern over the conductive film, forming a second mask pattern over the conductive film and in a region where the first mask pattern is not formed, exposing a part of the conductive film by removing the first mask pattern, and forming a pixel electrode by removing the exposed portion.

Another feature of the invention is a method for manufacturing a display device comprising the steps of forming a conductive film over an insulating surface, forming a first mask pattern over the conductive film, forming a second mask pattern over the conductive film and in the outer periphery of the first mask pattern, removing the first mask pattern, and forming a pixel electrode by removing a part of the conductive film using the second mask pattern as a mask.

Another feature of the invention is a method for manufacturing a display device comprising the steps of forming a conductive film over an insulating surface, forming a first film pattern over the conductive film, forming a second film pattern over the conductive film and in a region except for a region where the first film pattern is formed, removing the first film pattern, and forming a pixel electrode by removing a part of the conductive film using the second film pattern as a mask.

Another feature of the invention is a method for manufacturing a display device comprising the steps of forming a conductive film over an insulating surface, forming a first film pattern over the conductive film, forming a second film pattern over the conductive film and in a region where the first film pattern is not formed, removing the first film pattern, and forming a pixel electrode by removing a part of the conductive film using the second film pattern as a mask.

The first film pattern can be formed with few steps by typically using a droplet discharge method, an ink-jet method, a printing method, or the like.

The second film pattern is formed by a coating method. A droplet discharge method, an ink-jet method, a printing method, a spin coating method, a roll coating method, a slot coating method, a dipping method, or the like can typically be used.

Note that a droplet discharge method means a method for discharging a prepared composition from a nozzle according to an electrical signal to form a fine droplet and attach the fine droplet to a predetermined position.

A pixel driving element of a display device of the invention has a top gate TFT or a bottom gate TFT. Each TFT is a staggered TFT or a coplanar TFT.

The display device of the invention typically includes a liquid crystal display device, a light emitting display device, a DMD (Digital Micromirror Device), a PDP (Plasma Display Panel), a FED (Field Emission Display), an electrophoretic display device (electronic paper), and the like.

The display device of the invention also refers to a device using a display element, in other words, an image display device. Further, the display device includes all of the following modules: a module having a display panel provided with a connector such as an FPC (Flexible Printed Circuit), a TAB (Tape Automated Bonding) tape, or a TCP (Tape Carrier Package); a module having a TAB tape or a TCP provided with a printed wiring board at the end thereof; and a module having an IC (Integrated Circuit) or a CPU directly mounted on a display element by a COG (Chip On Glass) method.

Another feature of the invention is a liquid crystal television or an EL television including the display device.

According to the invention, a second mask pattern can be formed in a self-aligned manner without using a photomask by forming the second mask pattern of a material having high wettability using as a mask a first mask pattern formed of a material having low wettability by a droplet discharge method, an ink-jet method, a printing method, or the like. Therefore, a mask pattern can be formed without requiring a plurality of times of light exposure by forming a mask pattern using materials having different wettability over a large-sized substrate. In the case of using a large-sized substrate, unconformity is not generated among adjacent patterns, thereby increasing yield.

A pixel electrode or a display device having a pixel electrode can be formed with high yield by forming the second mask pattern over a conductive layer and etching the conductive layer.

A first mask pattern can be formed using a droplet discharge method by discharging a droplet to a predetermined position by changing a relative position of a substrate and a nozzle that is a discharge opening of a droplet including a material of the first mask pattern. A thickness and a width of a pattern to be formed can be adjusted depending on a nozzle diameter, the discharge amount of droplets, and a relative relationship between movement speed of a nozzle and that of a substrate to be provided with a discharged droplet. Accordingly, a mask pattern can be formed by discharging in a desired portion with high accuracy even over a large-sized substrate having a side of 1 m to 2 m or more. Thus, a display device can be manufactured with few steps and high yield. Further, cost can also be reduced.

Further, a liquid crystal television or an EL television having the display device formed according to the above-described manufacturing step can be manufactured at low cost with high throughput and yield.

BRIEF DESCRIPTION OF DRAWINGS

FIGS. 13A and 13B are cross-sectional views showing a step of manufacturing an active matrix substrate of a display device according to the present invention.

FIGS. 18A and 18B are cross-sectional views showing a step of manufacturing an active matrix substrate of a display device according to the present invention.

FIGS. 20A to 20F are cross-sectional views showing a structure of a light emitting element which can be applied to a light emitting display panel according to the present invention.

FIGS. 22A and 22B show a structure of a light emitting display module according to the present invention.

DETAILED DESCRIPTION OF THE INVENTION

Figure 1A:
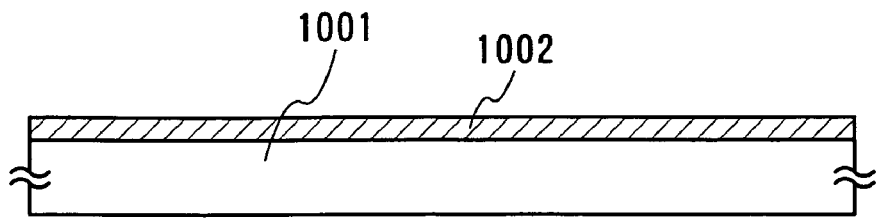
FIGS. 1A to 1F are cross-sectional views showing a step of manufacturing a pixel electrode according to the present invention.

Hereinafter, the best mode for carrying out the invention is described with reference to drawings. However, the present invention is not limited to the following description. As is easily known to a person skilled in the art, the mode and the detail of the invention can be variously changed without departing from the purpose and the scope of the present invention. The present invention is not interpreted while limiting to the following description of the embodiment mode. In addition, the same reference numeral is given to a common portion in each drawing, and detailed description is omitted.

EMBODIMENT MODE 1

This embodiment mode describes, with reference to FIGS. 1A to 1F, a step of forming a mask pattern for forming a pixel electrode by forming a first mask pattern of a material having low wettability over a conductive film, forming a second mask pattern of a material having high wettability, and removing the first mask pattern and a step of forming a pixel electrode.

A first conductive layer 1002 is formed over a substrate 1001 as shown in FIG. 1A. The first conductive layer is formed of a conductive material which can serve as a pixel electrode.

A glass substrate, a quartz substrate, a substrate formed of an insulating material such as alumina, a heat-resistant plastic substrate which can withstand a processing temperature of a later step, a silicon wafer, a metal plate, or the like can be typically used as the substrate 1001. In this case, an insulating film for preventing impurities from the substrate side from diffusing, such as a silicon oxide (SiOx) film, a silicon nitride (SiNx) film, a silicon oxynitride (SiOxNy) (x>y) film, or a silicon nitride oxide (SiNxOy) (x>y) film is preferably formed. Metal such as stainless steel, a semiconductor substrate, or the like provided with an insulating film of silicon oxide, silicon nitride, or the like on the surface thereof can also be used. In the case of using a glass substrate as the substrate 1001, a large-sized substrate of 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm, or the like can be used. In this embodiment mode, a glass substrate is used as the substrate 1001.

In the case of using a plastic substrate as the substrate 1001, it is preferable to use a substrate having a relatively high glass transition point, such as a PC (polycarbonate) substrate, a PES (polyethylene sulfone) substrate, a PET (polyethylene terephthalate) substrate, or a PEN (polyethylene naphthalate) substrate.

A light transmitting conductive film or a reflective conductive film is used as a typical material of the first conductive layer 1002. Indium tin oxide (ITO), zinc oxide (ZnO), indium zinc oxide (IZO), gallium-added zinc oxide (GZO), indium tin oxide containing silicon oxide, or the like can be given as an example of a material of the light transmitting conductive film. Metal such as aluminum (Al), titanium (Ti), silver (Ag), or tantalum (Ta), a metal material including the metal and nitrogen with a concentration of a stoichiometric composition ratio or less, titanium nitride (TiN) or tantalum nitride (TaN) that is nitride of the metal, aluminum containing nickel of 1% to 20%, or the like can be give as an example of a material of the reflective conductive film.

A sputtering method, an evaporation method, a CVD method, a coating method, or the like is appropriately used to form the conductive film 1002.

Figure 1B:
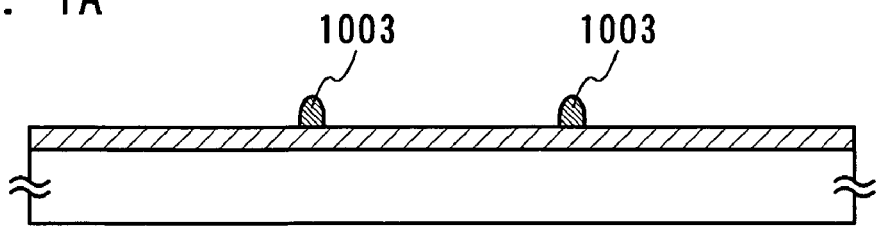

A first mask pattern 1003 is formed over the first conductive layer 1002 as shown in FIG. 1B. The first mask pattern serves as a mask for later forming a second mask pattern (a film serving as a mask for etching the conductive layer). Therefore, the first mask pattern preferably has low wettability. In other words, the surface of the first mask pattern preferably tends to repel a second mask pattern to be formed.

In this embodiment mode, the first mask pattern 1003 is formed by forming an insulating layer having high wettability in a predetermined portion and exposing the surface to fluorine plasma. Plasma treatment can be performed by preparing an electrode provided with a dielectric and generating plasma so as to expose the dielectric to the plasma using air, oxygen, or nitrogen. In this case, the dielectric need not cover the entire surface of the electrode. A fluororesin can be used as the dielectric. In the case of using a fluororesin, a $CF_2$ bond is formed over the insulating layer, thereby performing surface modification. Thus, wettability is decreased.

A material in which a water soluble resin such as polyvinyl alcohol (PVA) is mixed into a solvent such as $H_2O$ can be used as a material of the insulating layer. Further, PVA and another water soluble resin may be used in combination. An organic resin such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallyl phthalate resin can alternatively be used.

A printing method typified by screen (mimeograph) printing, offset (planographic) printing, relief printing, or gravure (intaglio) printing, or the like or a droplet discharge method can be given as an example of a method for manufacturing the insulating layer. According to the method, the insulating layer can be formed in a predetermined region.

In the case of forming the insulating layer by a droplet discharge method, a diameter of a nozzle used for a droplet discharge means is set in the range of 0.1 μm to 50 μm (favorably, 0.6 μm to 26 μm) and the amount of a composition to be discharged from the nozzle is set in the range of 0.00001 pl to 50 pl (favorably, 0.0001 pl to 10 pl). The amount of the composition to be discharged increases in proportion to the size of the diameter of the nozzle. Further, a distance between an object to be treated and the discharge opening of the nozzle is preferably as short as possible in order to drop the droplet on a desired portion. The distance is preferably set in the range of about 0.1 cm to 2 cm.

Subsequently, a second mask pattern 1004 is formed over the first conductive layer 1002 and in a region where the first mask pattern 1003 is not formed. The second mask pattern is formed of a material having higher wettability than that of the first mask pattern.

Figure 27:
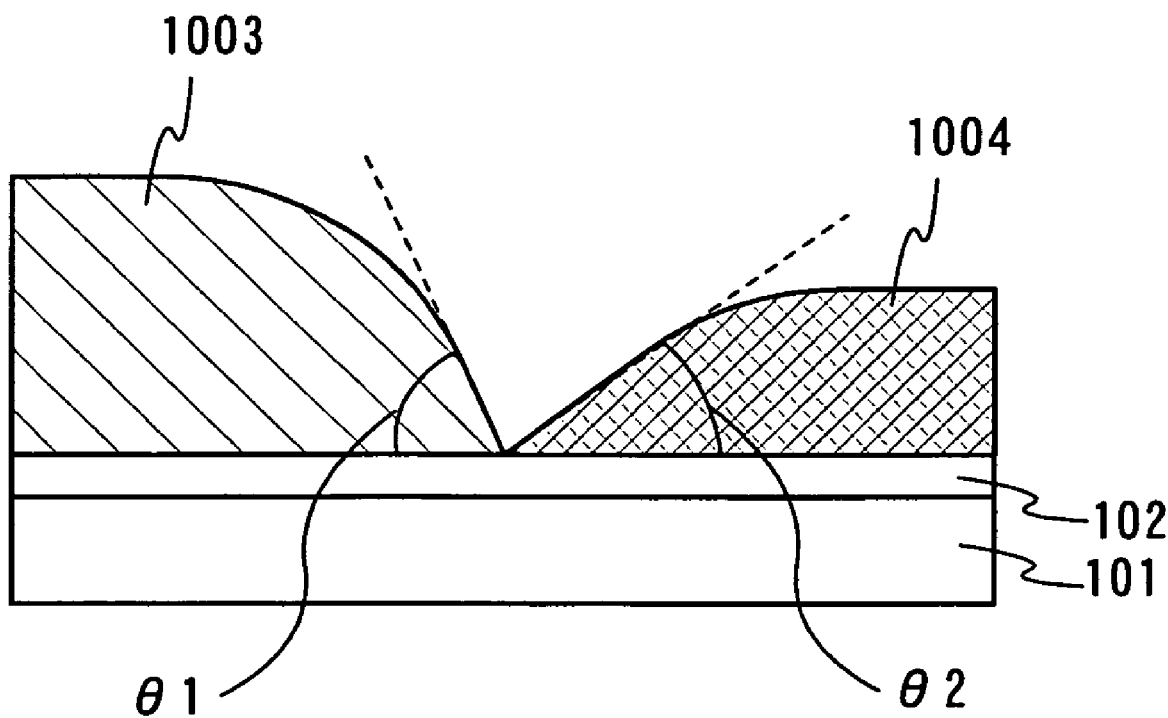
FIG. 27 shows contact angles of regions having low wettability and high wettability.

A relationship between a region having low wettability and a region having high wettability is described here with reference to FIG. 27. The region having low wettability (here, the first mask pattern 1003) means a region having a large contact angle θ1 between the surface and liquid as shown in FIG. 27. Liquid is repelled in a hemispherical shape by the surface. On the other hand, the region having high wettability (here, the second mask pattern 1004) means a region having a small contact angle θ2 between the surface and liquid. Liquid is spread on the surface.

When two regions having different contact angles are in contact with each other, a region having a relatively small contact angle is a region having high wettability and a region having a relatively large contact angle is a region having low wettability. When the two regions are coated with a composition, the composition is spread over the region having high wettability and is repelled in a hemispherical shape at the interface with the region having low wettability.

A difference between the contact angle θ1 of the region having low wettability and the contact angle θ2 of the region having high wettability is preferably 30°, desirably, 40° or more. Accordingly, a material of the region having high wettability is repelled in a hemispherical shape by the surface of the region having low wettability. Each mask pattern can be formed in a self-aligned manner. In the case of materials having a difference in contact angles of 30°, preferably 40° or more, among the forming method and the material of the first mask pattern 1003 that are mentioned, a region formed of a material having a small contact angle is a region having high wettability and a region formed of a material having a large contact angle is a region having low wettability. In the same manner, in the case of materials having a difference in contact angles of 30°, preferably 40° or more, among those to be mentioned as a material of the second mask pattern 1004, a region formed of a material having a small contact angle is a region having high wettability and a region formed of a material having a large contact angle is a region having low wettability.

Note that a contact angle further increases in the region having low wettability when the surface has irregularity. In other words, wettability is further lowered. On the other hand, a contact angle further decreases in the region having high wettability. In other words, wettability is further improved. Accordingly, a layer having uniform edge portions can be formed by coating each surface having irregularity with a material having low wettability and a material having high wettability and baking the materials.

An organic resin such as an acrylic resin, a polyimide resin, a melamine resin, a polyester resin, a polycarbonate resin, a phenol resin, an epoxy resin, polyacetal, polyether, polyurethane, polyamide (nylon), a furan resin, a diallyl phthalate resin, a novolac resin, a silicon resin, or a resist, a siloxane polymer, or polysilazane can be used for the second mask pattern 1004. Alternatively, the second mask pattern 1004 can be formed of a material having high wettability such as a composition using a polar solvent, for example, water, alcohol, ether, dimethylformamide, dimethylacetamide, dimethylsulfoxide, N-methylpyrrolidone, hexamethylphosphamide, chloroform, or methylene chloride. A coating method can be used as a formation method. Typically, a droplet discharge method, an ink-jet method, a spin coating method, a roll coating method, a slot coating method, a printing method, or the like is appropriately used. Since the material can be selectively discharged by using a droplet discharge method, the second mask pattern can be formed in a predetermined region.

Figure 1C:
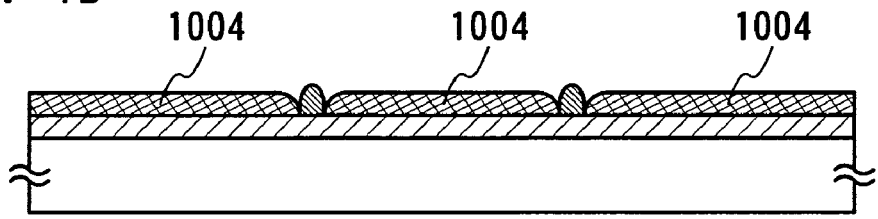
Figure 1D:
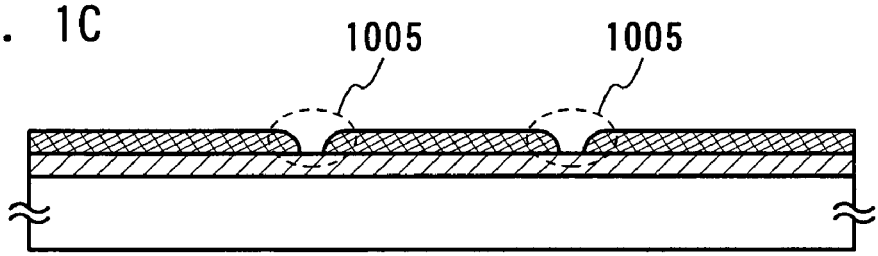

Subsequently, the first mask pattern 1003 is removed to expose a portion 1005 of the first conductive layer 1002 as shown in FIG. 1D. Oxygen ashing, a wet etching method, or the like can be appropriately used as a method for removing the first mask pattern 1003.

Figure 1E:
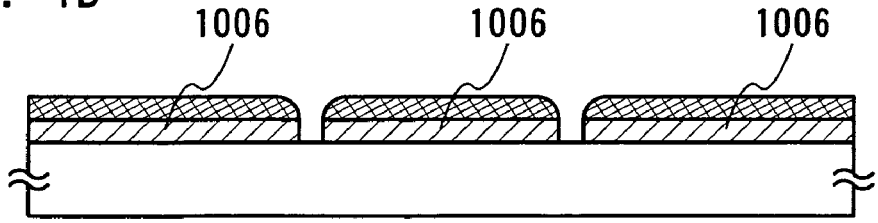

The first conductive layer 1002 is etched using the second mask pattern 1004 as a mask to form a second conductive layer 1006 having a desired shape as shown in FIG. 1E.

Figure 1F:
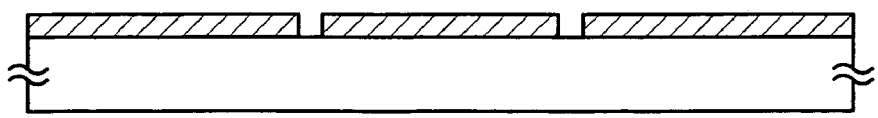

The second mask pattern 1004 is removed by a known method such as dry etching or wet etching to expose the second conductive layer 1006 as shown in FIG. 1F. The second conductive layer 1006 can be used as a pixel electrode.

According to the above steps, a conductive layer and a pixel electrode having desired shapes can be formed without using a photolithography step. A matrix substrate of a passive matrix display device can also be formed.

EMBODIMENT MODE 2

This embodiment mode describes, with reference to FIGS. 2A to 2F, a step of forming a mask pattern for forming a pixel electrode by forming a first mask pattern using a material having low wettability with the use of a compound including a fluorocarbon chain and then forming a second mask pattern using a material having high wettability and a step of forming a pixel electrode.

Figure 2A:
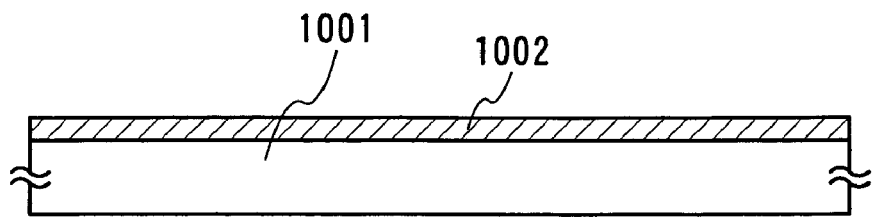
FIGS. 2A to 2F are cross-sectional views showing a step of manufacturing a pixel electrode according to the present invention.

As in Embodiment Mode 1, a first conductive layer 1002 is formed over a substrate 1001 as shown in FIG. 2A.

Figure 2B:
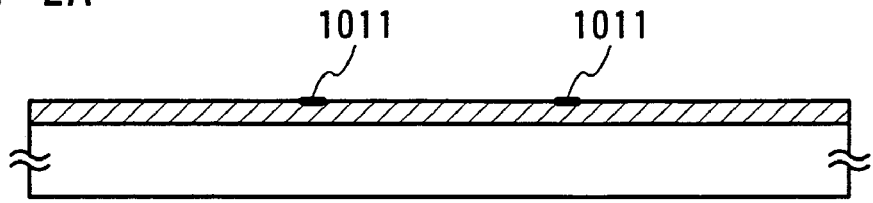

A first mask pattern 1011 is formed over the first conductive layer 1002 as shown in FIG. 2B. In this embodiment mode, a mask pattern having low wettability is formed as the first mask pattern. A material having low wettability is applied by a printing method typified by screen (stencil) printing, offset (planographic) printing, relief printing, gravure (intaglio) printing, or the like, a droplet discharge method, or the like to form the first mask pattern 1011. A silane coupling agent expressed in a chemical formula $R_n—Si—X_{(4-n)}$ (n=1, 2, or 3) is used as an example of a composition of the material having low wettability. Here, R is a comparatively inert group such as an alkyl group. X is formed with a hydrolytic group that can be bonded with a hydroxyl group or absorbed water over the substrate. Halogen, a methoxy group, an ethoxy group, an acetoxy group, or the like is given as a typical example of X.

Wettability can be further lowered by using a fluorosilane coupling agent including a fluorocarbon chain (fluoroalkyl group) as R (fluoroalkyl silane (hereinafter referred to as FAS)), which is given as a typical example of the silane coupling agent. R of FAS has a structure expressed by $(CF_3)(CF_2)_x(CH_2)_y$ (x: an integer in the range of 0 to 10, and y: an integer in the range of 0 to 4). When a plurality of R or X is bonded to Si, the R or X may be all the same or different from each other. Heptadecafluoro tetrahydro decyl triethoxysilane, heptadecafluoro tetrahydro decyl trichlorosilane, tridecafluoro tetrahydro octyl trichlorosilane, trifluoropropyl trimethoxysilane, or the like is typically used as FAS.

A hydrocarbon solvent such as n-pentane, n-hexane, n-heptane, n-octane, n-decane, dicyclopentane, benzene, toluene, xylene, durene, indene, tetrahydronaphthalene, decahydronaphthalene, or squalane, tetrahydrofuran, or the like is used as a solvent of the composition having low wettability.

In addition, a material including a fluorocarbon chain (fluororesin) can be used as an example of the composition having low wettability. Polytetrafluoroethylene (PTFE; tetrafluoroethylene resin), perfluoroalkoxy alkane (PFA; tetrafluoroethylene perfluoroalkyl vinylether copolymer resin), perfluoroethylene-propylene copolymer (PFEP; tetrafluoroethylene-hexafluoride propylene copolymer resin), ethylene-tetrafluoroethylene copolymer (ETFE; tetrafluoroethylene-ethylene copolymer resin), polyvinylidene fluoride (PVDF; vinylidene fluoride resin), polychlorotrifluoroethylene (PCTFE; ethylene chloride trifluoride resin), ethylene-chlorotrifluoroethylene copolymer (ECTFE; ethylene chloride trifluoride-ethylene copolymer resin), polytetra-fluoroethylene-perfluoro dioxole copolymer (TFE/PDD), polyvinyl fluoride (PVF; vinyl fluoride resin), or the like can be used as the fluororesin.

When the surface to which the composition having low wettability attaches is washed with ethanol, an extremely thin first mask pattern having low wettability can be formed.

Figure 2C:
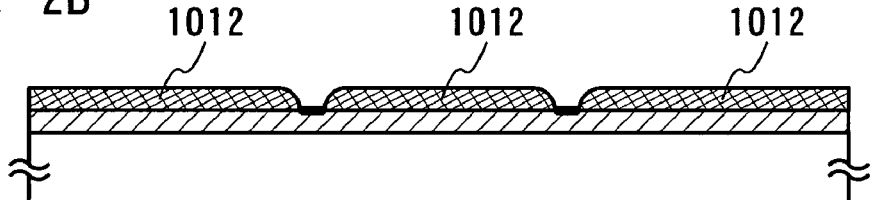

Subsequently, a second mask pattern 1012 is formed over the first conductive layer 1002 and in a region where the first mask pattern 1011 is not formed as shown in FIG. 2C. A similar material and a similar manufacturing method to those of the second mask pattern 1004 in Embodiment Mode 1 are appropriately used to form the second mask pattern.

Figure 2D:
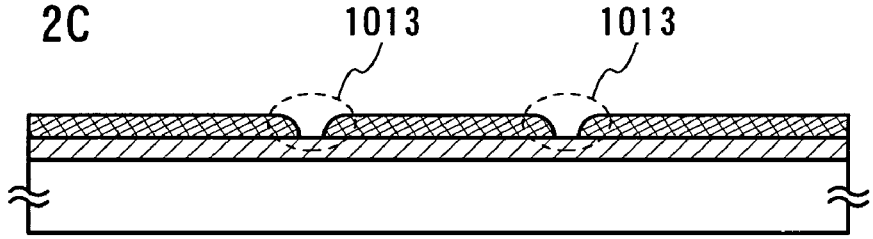

The first mask pattern 1011 is removed as in Embodiment Mode 1 to expose a portion 1013 of the fist conductive layer 1002 as shown in FIG. 2D.

Figure 2E:
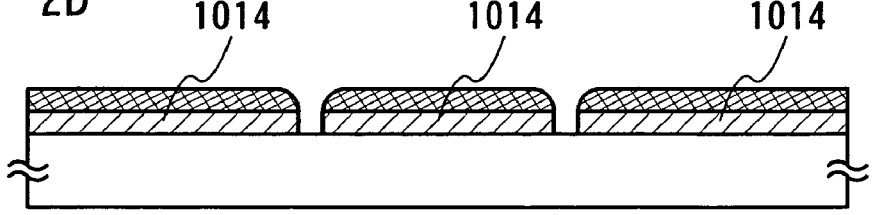

As in Embodiment Mode 1, the first conductive layer 1002 is etched using the second mask pattern 1012 as a mask to form a second conductive layer 1014 having a desired shape as shown in FIG. 2E.

Figure 2F:
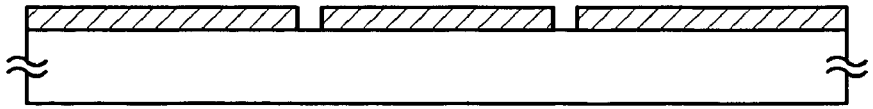

The second mask pattern 1012 is removed to expose the second conductive layer 1014 as shown in FIG. 2F. The second conductive layer 1014 can be used as a pixel electrode.

According to the above steps, a conductive layer and a pixel electrode having desired shapes can be formed without using a photolithography step. Further, a matrix substrate of a passive matrix display device can also be formed.

EMBODIMENT MODE 3

This embodiment mode describes a method for manufacturing an active matrix substrate of a display device with reference to FIGS. 3A to 3F. This embodiment mode is described using a bottom gate channel etch TFT as a pixel driving element. Note that a second conductive layer 301 is formed using Embodiment Mode 1; however, this embodiment mode is not limited thereto. Embodiment Mode 2 can also be used.

Figure 3A:
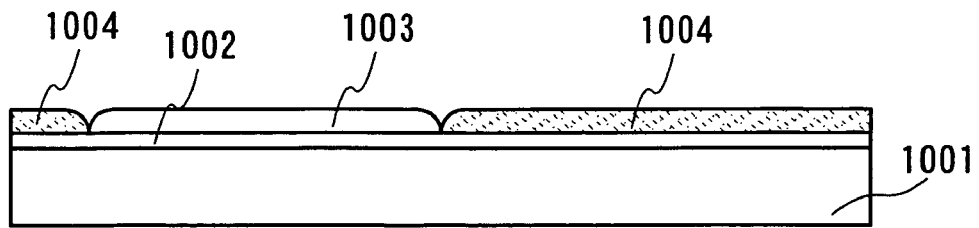
FIGS. 3A to 3F are cross-sectional views showing a step of manufacturing an active matrix substrate of a display device according to the present invention.
Figure 3B:
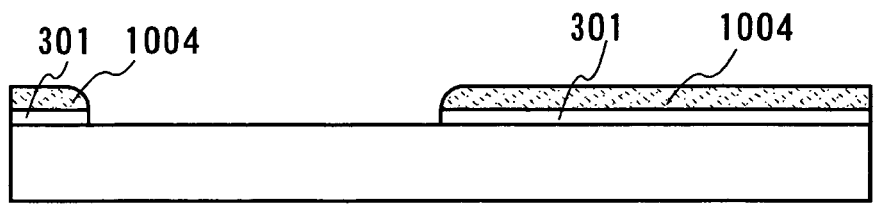

A first conductive layer 1002 is formed over a substrate 1001 as shown in FIG. 3A. After a first mask pattern 1003 is formed according to a similar step to that in Embodiment Mode 1, a second mask pattern 1004 is formed.

The first mask pattern 1003 is removed to expose a portion of the first conductive layer. The first conductive layer is etched to form the second conductive layer 301 serving as a pixel electrode. Then, the second mask pattern 1004 is removed.

Figure 3C:
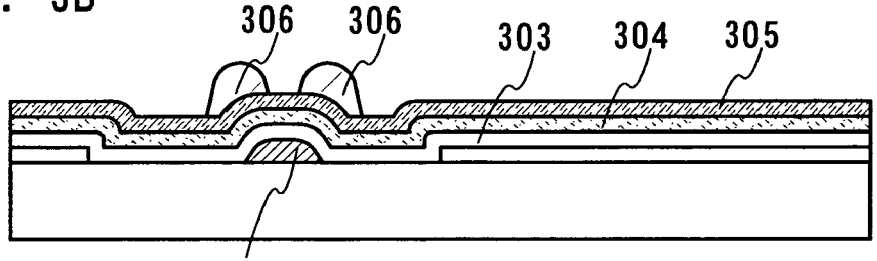

A third conductive layer 302 serving as a gate electrode is formed over the substrate 1001 as shown in FIG. 3C. The third conductive layer 302 is formed using a conductive material by a manufacturing method such as a droplet discharge method, a printing method, an electrolytic plating method, a PVD (Physical Vapor Deposition) method, a CVD (Chemical Vapor Deposition) method, or an evaporation method. In the case of using a PVD (Physical Vapor Deposition) method, a CVD (Chemical Vapor Deposition) method, an evaporation method, or the like, a conductive layer is formed by the above-described film formation method and etched into a desired shape to form the third conductive layer 302.

As a material of the third conductive layer 302, metal such as Ag, Au, Cu, Ni, Pt, Pd, Ir, Rh, W, Al, Ta, Mo, Cd, Zn, Fe, Ti, Si, Ge, Zr, or Ba can be used. Alternatively, indium tin oxide (ITO), zinc oxide (ZnO), indium zinc oxide (IZO), gallium-added zinc oxide (GZO), indium tin oxide containing silicon oxide, organic indium, organic tin, titanium nitride, or the like, which is used as a transparent conductive film, is used. In addition, the third conductive layer 302 may be formed by laminating conductive layers formed of the material.

When the second conductive layer is formed by a droplet discharge method, a conductor dissolved or dispersed in a solvent is used as a composition to be discharged from a discharge opening. Metal of the conductive material, a fine particle of silver halide, or a dispersant metal nanoparticle can be used as the conductor.

As for the composition to be discharged from a discharge opening, it is preferable to use any material of gold, silver, and copper dissolved or dispersed in a solvent, taking a specific resistance value into consideration. It is more preferable to use silver or copper which has low resistance and is inexpensive. When copper is used, a barrier film may be additionally provided as a countermeasure to an impurity. As for the solvent, an organic solvent of esters such as butyl acetate and ethyl acetate, alcohols such as isopropyl alcohol and ethyl alcohol, methyl ethyl ketone, or acetone, or the like may be used.

In the case of using copper as a wiring, an insulating or conductive material containing nitrogen such as silicon nitride, silicon oxynitride, aluminum nitride, titanium nitride, or tantalum nitride is preferably used as the barrier film. The barrier film may be formed using the insulating or conductive material by a droplet discharge method.

The viscosity of the composition used for a droplet discharge method is preferably in the range of 5 mPa·s to 20 mPa·s. This is so that the composition can be prevented from drying and smoothly discharged from a discharge opening. The surface tension of the composition is preferably 40 mN/m or less. Note that the viscosity of the composition and the like may be appropriately adjusted in accordance with a solvent to be used and intended use. For example, the viscosity of a composition in which ITO, ZnO, IZO, GZO, indium tin oxide containing silicon oxide, organic indium, organic tin, or the like is dissolved or dispersed in the solvent is 5 mPa·s to 20 mPa·s, the viscosity of a composition in which silver is dissolved or dispersed in the solvent is 5 mPa·s to 20 mPa·s, and the viscosity of a composition in which gold is dissolved or dispersed in the solvent is 10 mPa·s to 20 mPa·s.

The diameter of a particle of the conductor is preferably made as small as possible for the purpose of preventing a clogged nozzle and for manufacturing a high-definition pattern, although it depends on the diameter of each nozzle, a desired shape of a pattern, and the like. Preferably, the diameter of the particle of the conductive material is 0.1 µm or less. The composition is formed by a known method such as an electrolyzing method, an atomizing method, a wet reduction method, or the like, and the particle size thereof is typically approximately 0.5 µm to 10 µm. However, when a gas evaporation method is employed, a nanoparticle protected by a dispersant is minute, approximately 7 nm. When each surface of nanoparticles is covered with a coating, the nanoparticles do not cohere in the solvent and are uniformly dispersed in the solvent at room temperature, and show a property similar to that of liquid. Accordingly, it is preferable to use a coating.

The step of discharging the composition may be performed under reduced pressure. This is because the solvent of the composition is evaporated during a period from the point of discharge to the point of landing on an object to be treated, and thus, later steps of drying and baking of the composition can be omitted or shortened. After discharging the composition, either or both steps of drying and baking is/are performed at normal pressure or under reduced pressure depending on the kind of the composition by laser light irradiation, rapid thermal annealing, a heating furnace, or the like. Each step of drying and baking is a step of heat treatment. For example, drying is performed for three minutes at 100° C. and baking is performed for 15 minutes to 120 minutes at temperatures from 200° C. to 350° C., each of which has a different purpose, temperature, and period. The substrate may be heated to favorably perform the steps of drying and baking. The temperature of heating the substrate at the time depends on a material of the substrate or the like, but it is set at 100° C. to 800° C. (preferably, 200° C. to 350° C.). According to the steps, fusion and welding are accelerated by evaporating the solvent in the composition or chemically removing a dispersant and hardening and shrinking a resin of the composition. The steps are performed in an oxygen atmosphere, a nitrogen atmosphere, or an atmospheric air. The steps are preferably performed in an oxygen atmosphere where the solvent of the composition is easily removed. However, a binder formed of an organic material remains in the conductive layer depending on the heating temperature, atmosphere, or time.

In this embodiment mode, a conductive layer containing silver as its main component is formed as the third conductive layer 302 by selectively discharging a composition in which silver particles of several nm are dispersed (hereinafter referred to as "Ag paste") and drying and baking the same. Note that the third conductive layer is formed of conductor particles which irregularly overlap one another in three dimensions. Consequently, the surface thereof has slight irregularity. A plurality of particles is baked and is increased in size according to the heat of the third conductive layer 302 and its heating time. Therefore, a difference in surface height of the third conductive layer 302 becomes large.

Subsequently, a first insulating layer 303 serving as a gate insulating film, a first semiconductor film 304, and a conductive second semiconductor film 305 are formed over the second conductive layer 301 and the third conductive layer 302. The first insulating layer 303 is formed by a thin film formation method such as a plasma CVD method or a sputtering method to be a single layer of an insulating film containing silicon such as a silicon nitride film, a silicon oxide film, or the like or to have a laminated structure thereof. The first insulating layer preferably has a sequentially laminated structure of a silicon nitride film (silicon nitride oxide film), a silicon oxide film, and a silicon nitride film (silicon nitride oxide film) from the side in contact with the gate electrode. Since the gate electrode is in contact with the silicon nitride film in this structure, deterioration due to oxidation can be prevented.

Alternatively, the first insulating layer 303 can be formed using an insulating composition by a droplet discharge method, an ink-jet method, or a coating method typified by a spin coating method, a roll coating method, a slot coating method, a sol-gel method, or a dipping method. As a typical example of the insulating composition, a composition dispersed with inorganic oxide particles, polyimide, polyamide, polyester, acrylic, PSG (phosphosilicate glass), BPSG (borophosphosilicate glass), silicate SOG (Spin on Glass), alkoxy silicate SOG, or polysilazane SOG, siloxane polymer, or the like can be appropriately used.

The first semiconductor film 304 is formed using a film having any state of semiconductors selected from an amorphous semiconductor, a semi-amorphous semiconductor in which an amorphous state and a crystalline state are mixed (also referred to as a SAS), a microcrystalline semiconductor in which a crystal grain of 0.5 nm to 20 nm can be observed in an amorphous semiconductor, and a crystalline semiconductor. Specifically, a microcrystalline state in which a crystal grain of 0.5 nm to 20 nm can be observed is referred to as microcrystal (μc). In any case, a semiconductor film mainly containing silicon, silicon germanium (SiGe), or the like with a thickness of 10 nm to 60 nm can be used.

The SAS means a semiconductor having an intermediate structure between an amorphous structure and a crystalline structure (including a single crystal and a polycrystal) and having a third state which is stable in terms of free energy. The SAS includes a crystalline region having short-range order and lattice distortion. A crystalline region of 0.5 nm to 20 nm can be observed in at least a part of a region in the film. When silicon is contained as a main component, a Raman spectrum is shifted to a lower frequency side than 520 $cm^{-1}$. A diffraction peak of (111) or (220) to be caused by a crystal lattice of silicon is observed in X-ray diffraction. In addition, the SAS contains hydrogen or halogen of 1 atomic % or more to terminate a dangling bond.

The SAS can be obtained by performing glow discharge decomposition on a silicide gas. $SiH_4$ is given as a typical silicide gas. In addition, $Si_2H_6$, $SiH_2Cl_2$, $SiHCl_3$, $SiCl_4$, $SiF_4$, or the like can also be used as the silicide gas. The silicide gas may be diluted with hydrogen or fluorine, or hydrogen or fluorine and one or more rare gas elements of helium, argon, krypton, and neon, thereby making formation of the SAS easy. At this time, the silicide gas is preferably diluted so that a dilution ratio thereof ranges from 10 times to 1000 times. Alternatively, the SAS can be formed using $Si_2H_6$ and $GeF_4$ and using a method for diluting with a helium gas. The formation of a film by glow discharge decomposition is preferably performed under reduced pressure and may be performed with pressures in the range of approximately 0.1 Pa to 133 Pa. High-frequency powers of 1 MHz to 120 MHz, preferably, 13 MHz to 60 MHz may be supplied to perform glow discharge. A substrate heating temperature is preferably 300° C. or less, and a recommended substrate heating temperature is 100° C. to 250° C.

A crystalline semiconductor film can be formed by crystallizing an amorphous-semiconductor film or a SAS by heating or laser irradiation. Alternatively, a crystalline semiconductor film may be directly formed. In this case, a crystalline semiconductor film can be directly formed using a fluorine gas such as $GeF_4$ or $F_2$ and a silane gas such as $SiH_4$ or $Si_2H_6$ and utilizing heat or plasma.

The second semiconductor film 305 is conductive. An element belonging to Group 15 of the periodic table, typically, phosphorus or arsenic is added to the second semiconductor film 305 in the case of forming an n-channel TFT. An element belonging to Group 13, typically, boron is added in the case of forming a p-channel TFT. The second semiconductor film is formed by a plasma CVD method using a silicide gas mixed with a gas including an element belonging to Group 13 or 15 such as boron, phosphorus, or arsenic. Alternatively, the conductive second semiconductor film can be formed by forming a semiconductor film, coating the semiconductor film with a composition including an element belonging to Group 13 or 15, and irradiating the composition with a laser beam. A laser beam emitted from a known pulsed laser or continuous wave laser is appropriately used as the laser beam.

Subsequently, a third mask pattern 306 is formed over the second semiconductor film 305. The third mask pattern is preferably formed of a heat resistant high molecular weight material. It is preferably formed by discharging a high molecular weight material which has an aromatic ring or a heterocyclic ring as a main chain and includes at least a highly polar heteroatom group in an aliphatic moiety by a droplet discharge method. As a typical example of such a high molecular weight material, polyimide, polybenzimidazole, or the like can be used. In the case of using polyimide, the third mask pattern 306 can be formed by discharging a composition including polyimide from a discharge opening to the second semiconductor film 305 and then baking at 200° C. for 30 minutes.

Figure 3D:
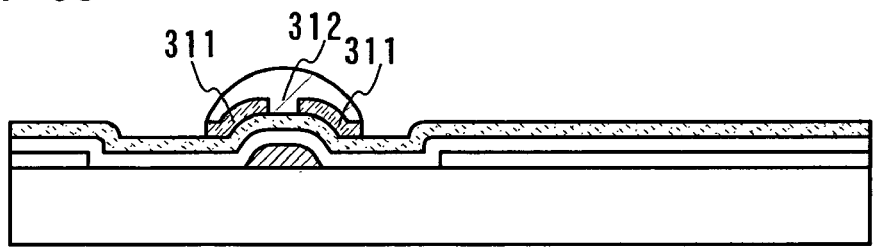

Next, the second semiconductor film 305 is etched using the third mask pattern 306 to form a first semiconductor region (also referred to as a source region and a drain region, or a contact layer) 311 as shown in FIG. 3D. Thereafter, the third mask pattern is removed.

The first semiconductor film can be etched using a chlorine gas typified by $Cl_2$, $BCl_3$, $SiCl_4$, $CCl_4$, or the like, a fluorine gas typified by $CF_4$, $SF_6$, $NF_3$, $CHF_3$, or the like, or $O_2$.

A fourth mask pattern 312 is formed over the first semiconductor region 311 and the first semiconductor film 304 therebetween. The fourth mask pattern can be formed using a similar material to that of the third mask pattern.

Figure 3E:
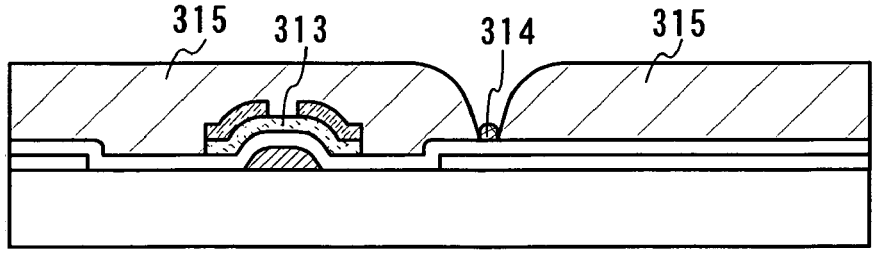

The first semiconductor film 304 is etched using the fourth mask pattern 312 as a mask to form a second semiconductor region (channel formation region) 313 as shown in FIG. 3E. The etching condition of the first semiconductor film can be applied to that of the second semiconductor film. Thereafter, the fourth mask pattern is removed by treatment using a removing solution or ashing treatment using oxygen.

Note that the second semiconductor region 313 can be formed of an organic semiconductor material by a printing method, a droplet discharge method, or the like. In this case, the etching step is not required; therefore, the number of steps can be decreased. As the organic semiconductor material used in the invention, it is preferable to use a π-conjugated high molecular weight material whose skeleton is formed by a conjugated double bond. Typically, a soluble high molecular weight material such as polythiophene, poly(3-alkylthiophene), a polythiophene derivative, or pentacene can be used.

In addition, a material capable of forming the second semiconductor region by forming and treating a soluble precursor can be applied to the invention as the organic semiconductor material. As such an organic semiconductor material formed by using a precursor, polyphenylene vinylene, poly(2,5-thienylene vinylene), polyacetylene, a polyacetylene derivative, polyalkylene vinylene, or the like can be used.

When a precursor is converted into an organic semiconductor, a reactive catalyst such as a hydrogen chloride gas may be added in addition to performing heat treatment. Toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like can be used as a typical solvent for dissolving such a soluble organic semiconductor material.

In the case of using the organic semiconductor for the second semiconductor region 313, a conductive layer formed of an organic conductive material such as polyacetylene, polyaniline, PEDOT (poly-ethylenedioxythiophen), or PSS (poly-styrenesulphonate) can be formed instead of the first semiconductor region 311.

Alternatively, a conductive layer formed of a metal element can be used instead of the first semiconductor region 311. In this case, many of organic semiconductor materials are p-type semiconductors which transport holes as carriers. Therefore, it is preferable to use metal having a high work function so as to have an ohmic contact with the semiconductor layer.

Specifically, it is preferable to use metal such as gold, platinum, chromium, palladium, aluminum, indium, molybdenum, nickel, or an alloy thereof or the like. The conductive layer can be formed using conductive paste including such metal or an alloy by a printing method or a droplet discharge method.

Further, the second semiconductor region formed of an organic semiconductor material, the conductive layer formed of an organic conductive material, and the conductive layer formed of a metal element may be laminated.

In the case where the second semiconductor region is formed of a SAS, a structure having the source region and the drain region covering the gate electrode can be employed as in this embodiment mode. In place of the structure, a so-called self alignment structure having edge portions of the source region and the drain region aligned with an edge portion of the gate electrode can also be employed. Further, a structure having the source region and the drain region formed at a certain distance from the gate electrode without covering it can be employed. This structure can reduce off-current. Thus, in the case of using the TFT as a switching element of a display device, contrast can be enhanced. Furthermore, a TFT may be formed to have a so-called multi-gate structure having the second semiconductor region covering a plurality of gate electrodes. This structure can also reduce off-current.

Figure 3F:
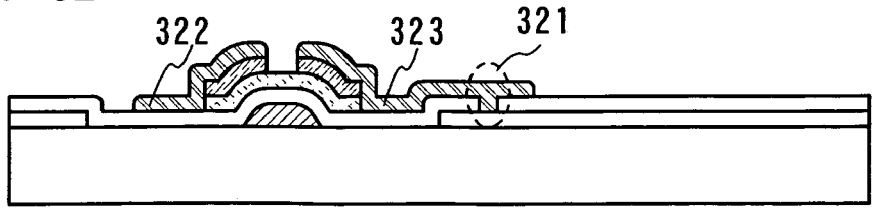

Subsequently, an opening 321 is formed as shown in FIG. 3F. The opening can be formed by appropriately using a known photolithography step, etching method using a mask pattern formed by a droplet discharge method, or the like. Here, as shown in FIG. 3E, a fifth mask pattern 314 is formed in a part of a region where the second conductive layer 301 is overlapped with the first insulating layer 303, and a sixth mask pattern 315 is formed in the outer periphery of the fifth mask pattern. The fifth mask pattern is formed in a region where an opening is to be formed. A material having low wettability is formed in a predetermined region as the fifth mask pattern by appropriately using a similar method to that of the first mask pattern. The sixth mask pattern is formed by discharging a material having high wettability using a similar method to that of the second mask pattern. Then, the fifth mask pattern is removed to expose a portion of the first insulating layer 303. The exposed region of the first insulating layer 303 is removed using the sixth mask pattern to expose a portion of the second conductive layer 301 as well as to form the opening 321 as shown in FIG. 3F.

Subsequently, fourth conductive layers 322 and 323 serving as a source electrode and a drain electrode are formed using a conductive material over the first semiconductor region 311. At this time, one of the fourth conductive layers (in FIG. 3E, the fourth conductive layer 323) is connected to the first conductive layer through the opening 321. The fourth conductive layers can be formed using a similar material by a similar formation method to those of the third conductive layer. Here, the fourth conductive layers 322 and 323 are formed by selectively discharging a composition in which silver particles of several nm are dispersed (Ag paste) by a droplet discharge method and drying the composition.

Subsequently, a passivation film is preferably formed over the fourth conductive layers 322 and 323. The passivation film can be formed of silicon nitride, silicon oxide, silicon nitride oxide, silicon oxynitride, aluminum oxynitride, aluminum oxide, diamond like carbon (DLC), nitrogen-containing carbon (CN), or another insulating material by a thin film formation method such as a plasma CVD method or a sputtering method.

According to the above steps, an active matrix substrate of a display device can be manufactured with high yield.

EMBODIMENT MODE 4

This embodiment mode describes a method for manufacturing an active matrix substrate of a display device with reference to FIGS. 4A to 4E. This embodiment mode is described using a bottom gate channel protective TFT as a pixel driving element. Note that a second conductive layer 301 is formed using Embodiment Mode 1; however, this embodiment mode is not limited thereto. Embodiment Mode 2 can also be used.

Figure 4A:
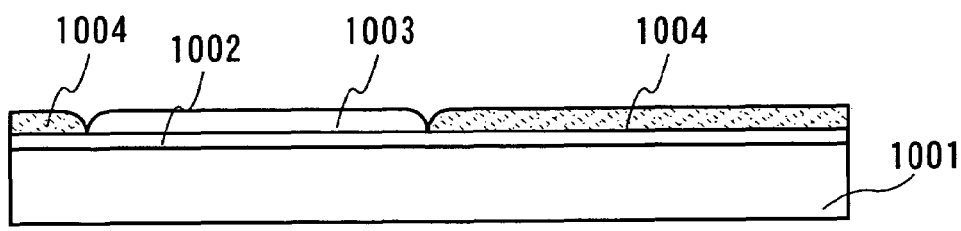
FIGS. 4A to 4E are cross-sectional views showing a step of manufacturing an active matrix substrate of a display device according to the present invention.
Figure 4B:
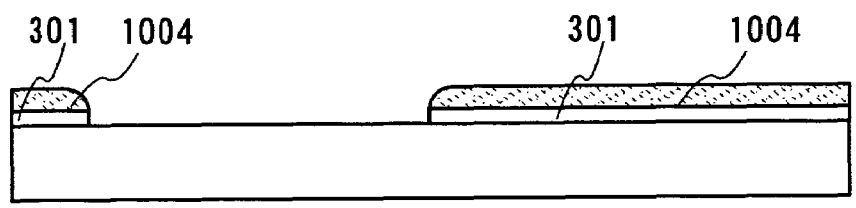

As shown in FIGS. 4A and 4B, the second conductive layer 301 serving as a pixel electrode is formed over a substrate 1001 according to a similar step to that in Embodiment Mode 3. Then, the second mask pattern 1004 is removed.

Figure 4C:
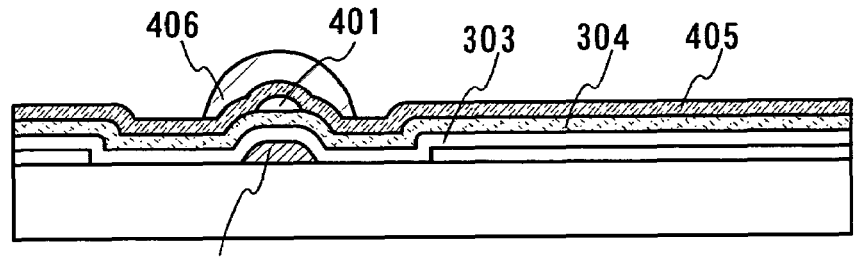

As in Embodiment Mode 3, a third conductive layer 302 serving as a gate electrode is formed over the substrate 1001, and a first insulating layer 303 serving as a gate insulating film and a first semiconductor film 304 are formed over the second conductive layer 301 and the third conductive layer 302 as shown in FIG. 4C. A protective film 401 is formed over the first semiconductor film 304 and above the third conductive layer 302. The protective film 401 can be formed of a similar material by a similar formation method to those of the third mask pattern 306 described in Embodiment Mode 3.

Subsequently, a second semiconductor film (a conductive semiconductor film) 405 is formed. Note that the second semiconductor film 405 can be formed of a similar material by a similar method to those of the second semiconductor film 305 in Embodiment Mode 3. Then, a third mask pattern 406 is formed. The third mask pattern 406 is formed of a similar material by a similar method to those of the third mask pattern 306 in Embodiment Mode 3.

Figure 4D:
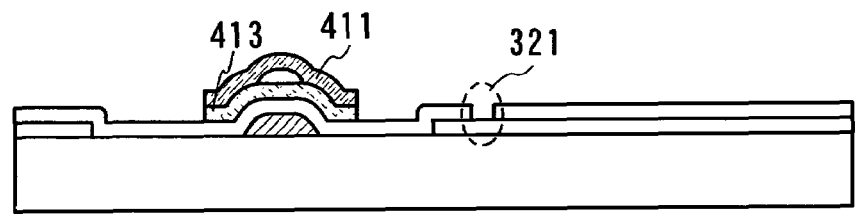

The first semiconductor film and the second semiconductor film are etched using the third mask pattern to form a first semiconductor region 411 and a second semiconductor region 413 as shown in FIG. 4D. Thereafter, the third mask pattern is removed. Then, an opening 321 is formed as in Embodiment Mode 3.

Figure 4E:
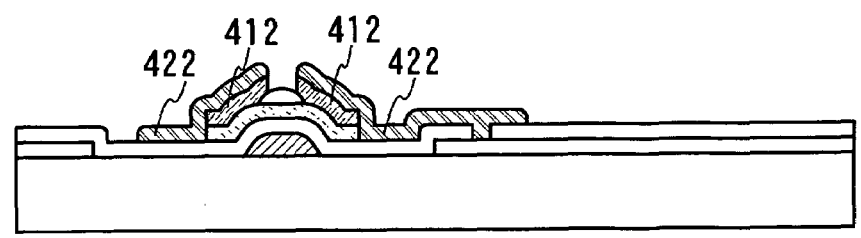

A fourth conductive layer 422 serving as a source electrode and a drain electrode is formed using a conductive material over the first semiconductor region 411 and the opening 321 as shown in FIG. 4E. An exposed portion of the first semiconductor region 411 is etched using the fourth conductive layer 422 as a mask and is divided to form a source region and a drain region 412. The protective film 401 is exposed by the step.

Note that a method for forming the source region and the drain region is not limited to this embodiment mode. The step of manufacturing the first semiconductor region described in Embodiment Mode 3 may also be employed. Likewise, the step of forming the source region and the drain region in this embodiment mode may be applied to Embodiment Mode 3.

According to the above steps, an active matrix substrate of a display device can be manufactured with high yield.

EMBODIMENT MODE 5

Figure 5A:
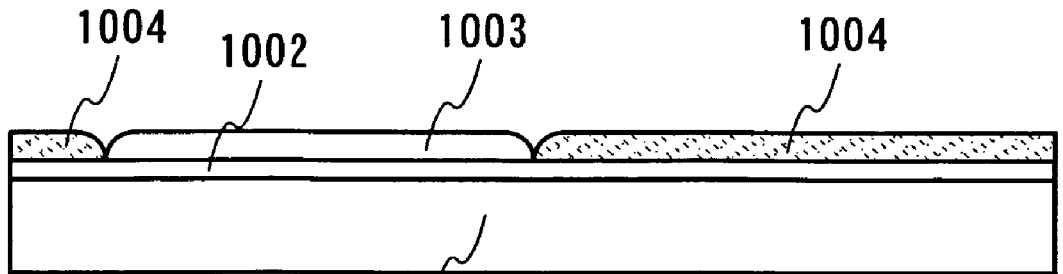
FIGS. 5A to 5D are cross-sectional views showing a step of manufacturing an active matrix substrate of a display device according to the present invention.
Figure 5B:
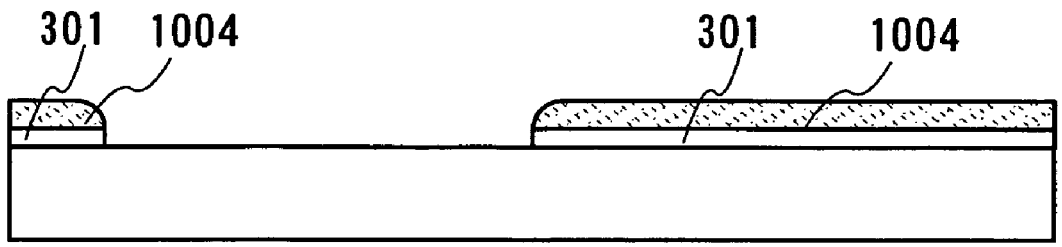
Figure 5C:
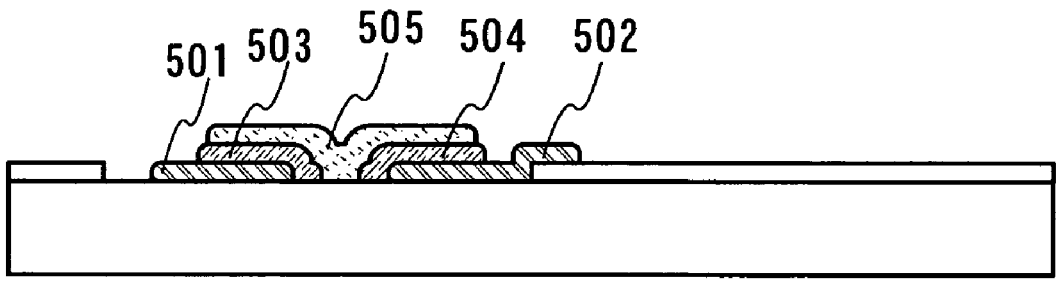
Figure 5D:
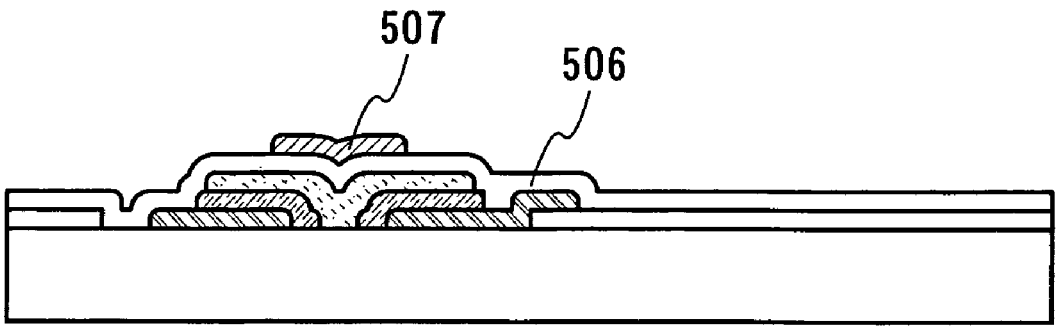

This embodiment mode describes a method for manufacturing an active matrix substrate of a display device using a top gate staggered TFT with reference to FIGS. 5D to 5D. Note that a second conductive layer 301 is formed using Embodiment Mode 1; however, this embodiment mode is not limited thereto. Embodiment Mode 2 can also be used.

As shown in FIGS. 5A and 5B, the second conductive layer 301 serving as a pixel electrode is formed over a substrate 1001 according to a similar step to that in Embodiment Mode 3. Then, a second mask pattern 1004 is removed.

Third conductive layers 501 and 502 serving as a source electrode and a drain electrode are formed over the substrate 1001 as shown in FIG. 5C. A similar material and a similar manufacturing method to those of the third conductive layer 302 in Embodiment Mode 3 can be appropriately used to form the third conductive layers. Note that one of the third conductive layers is formed to connect to the second conductive layer 301. Here, the third conductive layer 502 is connected to the second conductive layer 301.

Conductive first semiconductor regions 503 and 504 are formed over the third conductive layers. A similar material and a similar manufacturing method to those of the first semiconductor region 311 in Embodiment Mode 3 are appropriately used to from the first semiconductor regions 503 and 504. Here, the first semiconductor regions are formed by discharging an organic conductive material to a predetermined position by a droplet discharge method. Note that the first semiconductor regions serve as a source region and a drain region.

Subsequently, a second semiconductor region 505 is formed.

A first insulating layer 506 and a fourth conductive layer 507 are formed as shown in FIG. 5D. Since the first insulating layer 506 serves as a gate insulating film, it is formed of a similar material by a similar formation step to those of the first insulating layer 303 in Embodiment Mode 3. Since the fourth conductive layer 507 serves as a gate electrode, it is formed of a similar material by a similar method to those of the third conductive layer 302 in Embodiment Mode 3.

According to the above steps, an active matrix substrate of a display device can be manufactured with high yield.

EMBODIMENT MODE 6

A method for manufacturing an active matrix substrate of a display device using a top gate coplanar TFT of the invention is described with reference to FIGS. 6A to 6E. Note that a third conductive layer 615 is formed using Embodiment Mode 1; however, this embodiment mode is not limited thereto. Embodiment Mode 2 can also be used.

Figure 6A:
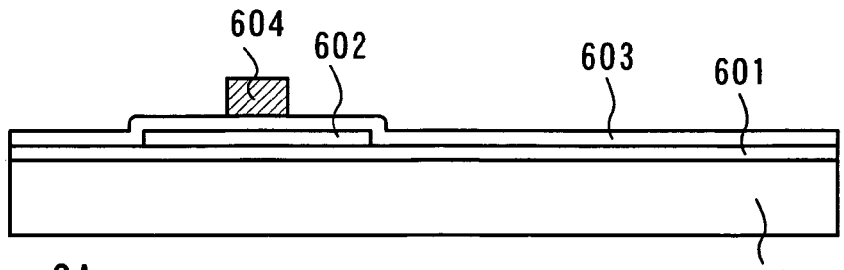
FIGS. 6A to 6E are cross-sectional views showing a step of manufacturing an active matrix substrate of a display device according to the present invention.

A first insulating layer 601 is formed over a substrate 1001 as shown in FIG. 6A. The first insulating layer 601 serves as a blocking film for preventing impurities from the substrate from diffusing into a semiconductor region to be formed. Thus, a base film formed of an insulating film such as a silicon oxide film, a silicon nitride film, or a silicon oxynitride film is formed as the first insulating layer 601. The base film is formed to be a single layer film or to have a laminated structure of two or more layers.

Then, a semiconductor region 602 is formed over the first insulating layer 601. A semiconductor film having an amorphous structure is formed by a known method (a sputtering method, an LPCVD method, a plasma CVD method, or the like). Thereafter, a crystalline semiconductor film obtained by performing known crystallization treatment (a laser crystallization method using laser light emitted from a pulsed laser, a thermal crystallization method, a thermal crystallization method using a metal catalyst such as nickel, or the like) or the SAS, the AS, or the like described in Embodiment Mode 3 is patterned according to a photolithography step and etched to form the semiconductor region.

Alternatively, a continuous wave laser may be used for the laser crystallization method. In this case, in crystallizing the amorphous semiconductor film, it is preferable to apply second to fourth harmonics of a fundamental wave by using a solid laser which can continuously oscillate in order to obtain a crystal with a large grain size. Typically, a second harmonic (532 nm) or a third harmonic (355 nm) of a Nd:YVO$_4$ laser (a fundamental wave, 1064 nm) may be applied. In the case of using the continuous wave laser, laser light emitted from a continuous wave YVO$_4$ laser having output of 10 W is converted to a harmonic by a nonlinear optical element. There is also a method for emitting a harmonic by putting YVO$_4$ crystal and the nonlinear optical element in a resonator Then, the harmonic is preferably shaped into rectangular or elliptical laser light on an irradiated surface by an optical system and an object to be treated is irradiated therewith. At this time, the energy density of approximately 0.01 MW/cm$^2$ to 100 MW/cm$^2$ (preferably, 0.1 MW/cm$_2$ to 10 MW/cm$^2$) is required. The semiconductor film may be irradiated with the laser light by being moved relative to the laser light at the speed of approximately 10 cm/s to 200 cm/s. The semiconductor region is formed to have a thickness of 25 nm to 150 nm (preferably, 30 nm to 80 nm). There is no particular limitation on a material of the crystalline semiconductor film; however, the semiconductor region may be formed of silicon, germanium, a silicon-germanium (SiGe) alloy, or the like.

Alternatively, the organic semiconductor material mentioned as the material of the second semiconductor region 313 in Embodiment Mode 3 may be used.

Subsequently, a second insulating layer 603 serving as a gate insulating film is formed over the semiconductor region 602 and the first insulating layer 601. The second insulating layer 603 can be formed of a similar material by a similar manufacturing method to those of the first insulating layer 303 described in Embodiment Mode 3.

A first conductive layer 604 serving as a gate electrode is formed. The first conductive layer is formed of a similar material to that of the third conductive layer 302 described in Embodiment Mode 3. The first conductive layer may be manufactured using an ICP etching apparatus as well as the step described in Embodiment Mode 3 and may be a conductive layer having a tapered end (tapered portion). The angle of the tapered portion (taper angle) is defined as an angle formed by a substrate surface (horizontal plane) and a tilted portion of the tapered portion. The taper angle of the conductive layer can be in the range of 5° to 45° by appropriately selecting etching conditions.

Figure 6B:
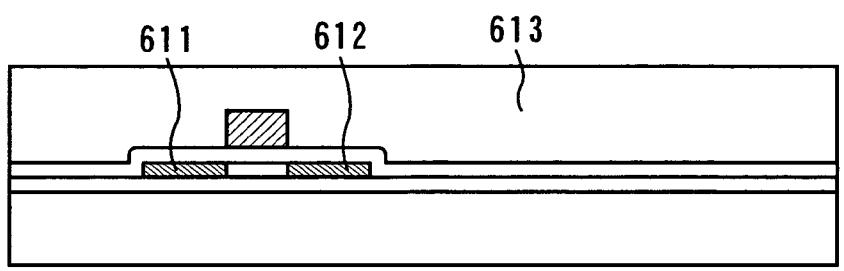

As shown in FIG. 6B, impurities are added to the semiconductor region 602 using the first conductive layer 604 as a mask. After an insulating film containing hydrogen is formed, it is heated at temperatures from 400° C. to 550° C. to activate the impurity element added to the semiconductor region. Then, the semiconductor region is hydrogenated to form impurity regions (a source region and a drain region) 611 and 612. Note that a GRTA method, an LRTA method, or a laser annealing method can be used as the step of activation or hydrogenation in place of the heat treatment. In addition, gettering can also be performed at the same time as activation in the case where the semiconductor film is crystallized using a metal element which promotes crystallization, typically, nickel.

Note that a single-gate TFT is described in this embodiment mode; however, this embodiment mode is not limited thereto. A multi-gate TFT may also be used. In addition, a self alignment TFT is described; however, this embodiment mode is not limited thereto. An LDD (Lightly Doped Drain) or GOLD (Gate-drain Overlapped LDD) TFT can also be used. In the LDD structure, a region to which an impurity element is added in low concentration is provided between a channel formation region and a source region or drain region formed by adding an impurity element in high concentration. The region is referred to as an LDD region. The TFT having this structure can reduce an off-current value. In the GOLD structure, the LDD region is overlapped with a gate electrode with a gate insulating film therebetween. The structure is effective in relieving an electric field in the vicinity of the drain and preventing deterioration due to hot carrier injection.

Subsequently, a second insulating layer 613 is formed over the substrate. The second insulating layer can be formed of an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular weight material such as polyimide, aromatic polyamide, or polybenzimidazole; an inorganic siloxane polymer including a Si—O—Si bond among compounds that contain silicon, oxygen, and hydrogen and formed by using a siloxane polymer material as a starting material, typified by silica glass; or an organic siloxane polymer in which hydrogen bonded with silicon is substituted by an organic group such as methyl or phenyl, typified by an alkyl siloxane polymer, an alkyl silsesquioxane polymer, a hydrosilsesquioxane polymer, or a hydroalkyl silsesquioxane polymer. The second insulating layer is formed by a known method such as a CVD method, a coating method, or a printing method. Note that forming the second insulating layer by a coating method typified by a spin coating method, a roll coating method, or a slot coating method can planarize the surface of the second insulating layer and is suitable for a later step of forming a mask for forming a pixel electrode. Here, the second insulating layer 613 is formed by a coating method.

Figure 6C:
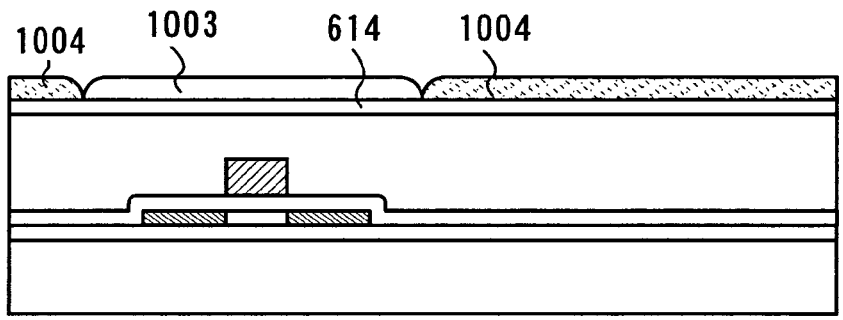
Figure 6D:
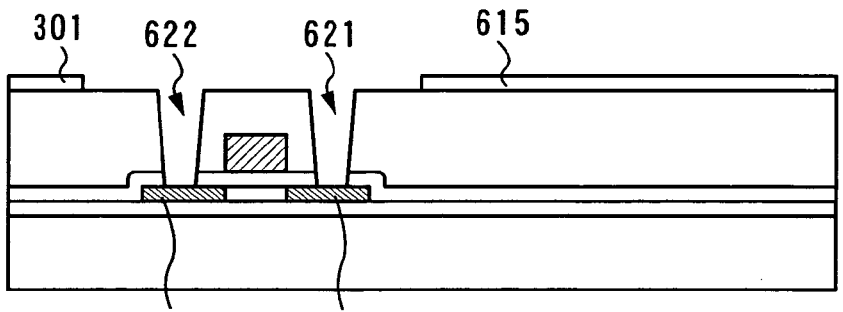

A second conductive layer 614 is formed over the second insulating layer 613 as shown in FIG. 6C. The second conductive layer 614 is formed of a similar material by a similar method to those of the first conductive layer 1002 described in Embodiment Mode 1. After a first mask pattern 1003 is formed over the second conductive layer 614 using a material having low wettability, a second mask pattern 1004 is formed. The first mask pattern is removed to expose a portion of the second conductive layer 614, and the second conductive layer 614 is then etched using the second mask pattern to form a third conductive layer 615 as shown in FIG. 6D. The second insulating layer 613 and the first insulating layer 603 are partly removed according to a photolithography step and an etching step to expose portions of the impurity regions 611 and 612 of the semiconductor region, thereby forming openings 621 and 622.

Figure 6E:
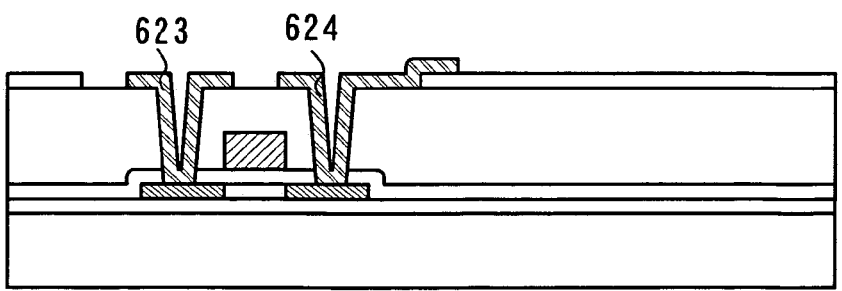

Fourth conductive layers 623 and 624 are formed in the openings as shown in FIG. 6E. The fourth conductive layers 623 and 624 serve as a source electrode and a drain electrode. One of the fourth conductive layers is connected to the third conductive layer 615 serving as a pixel electrode.

According to the above steps, an active matrix substrate of a display device can be manufactured with high yield.

EMBODIMENT MODE 7

Figure 9:
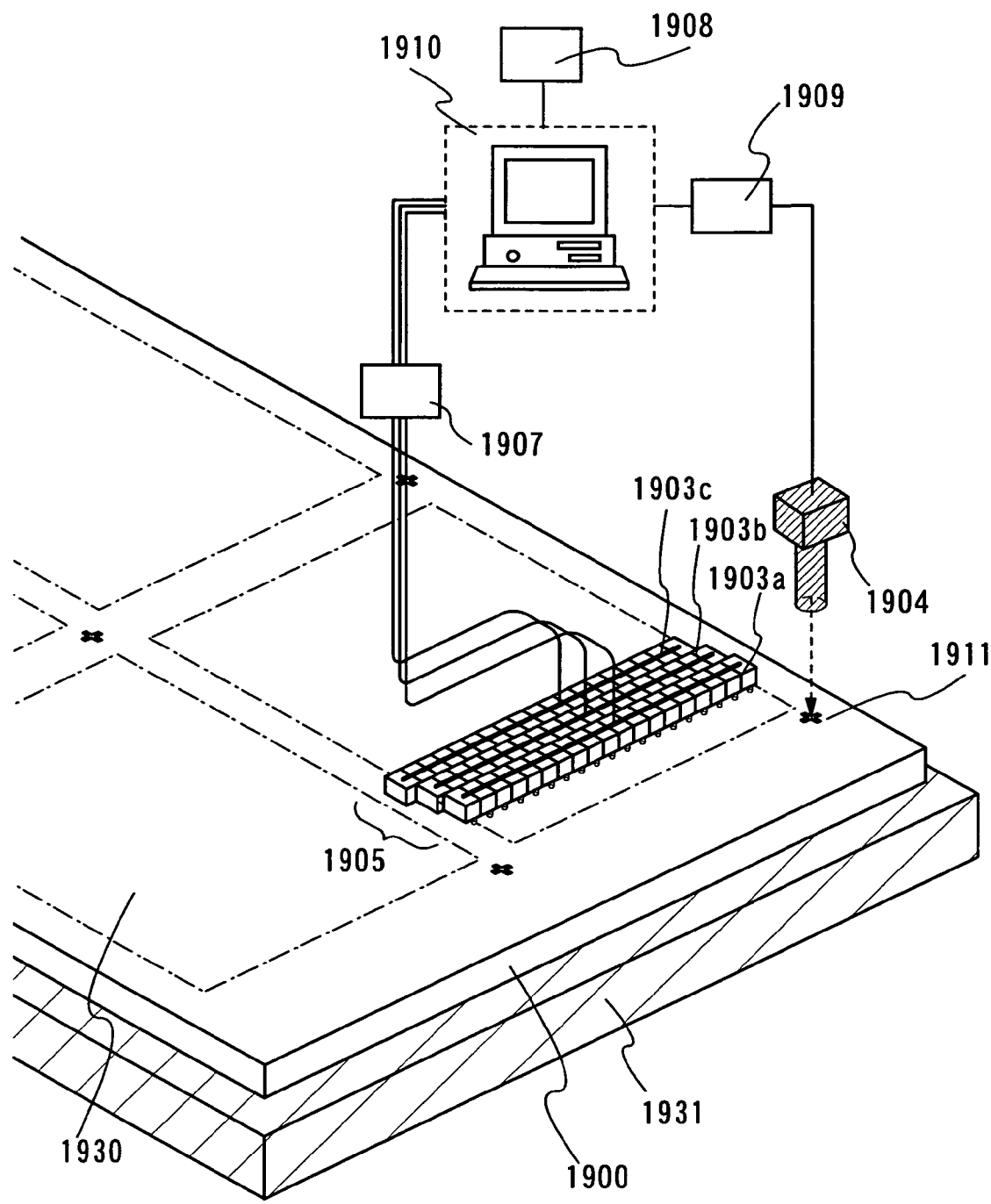
FIG. 9 shows a droplet discharge apparatus which can be applied to the present invention.

A droplet discharge apparatus which can be used for mask pattern formation in the above embodiment mode is described in this embodiment mode. In FIG. 9, a region where one panel 1930 is to be formed is shown in dashed line over a substrate 1900.

FIG. 9 shows one mode of a droplet discharge apparatus used to form a pattern such as a wiring. A droplet discharge means 1905 has a head, and the head has a plurality of nozzles. The case of having three heads (1903a, 1903b, and 1903c) each provided with ten nozzles is described in this embodiment mode. However, the number of nozzles and heads can be set in accordance with treatment area, steps, or the like.

The heads are connected to a control means 1907, and the control means controls the heads by a computer 1910, so that a preset pattern can be drawn. A position of drawing may be determined by, for example, using a marker 1911 that is formed over the substrate 1900 or the like fixed to a stage 1931 as a reference point. Alternatively, the position of drawing may be determined by using an edge of the substrate 1900 as a reference point. The reference point is detected by an imaging means 1904 such as a CCD, and changed into a digital signal by an image processing means 1909. Then, the digital signal is recognized by the computer 1910, and a control signal is generated and transmitted to the control means 1907. When the pattern is drawn in this manner, a distance between a pattern formation face and a tip of the nozzle may be set 0.1 cm to 5 cm, preferably, 0.1 cm to 2 cm, more preferably, approximately 0.1 cm. Landing accuracy of a droplet is improved by making the distance short as described above.

At this time, information on a pattern to be formed over the substrate 1900 is stored in a storage medium 1908, and a control signal is transmitted to the control means 1907 based on the information, so that the heads 1903a, 1903b, and 1903c can be individually controlled. In other words, droplets including different materials can be discharged from each nozzle of the heads 1903a, 1903b, and 1903c. For example, the nozzles of the heads 1903a and 1903b can discharge a droplet including an insulating film material and the nozzles of the head 1903c can discharge a droplet including a conductive film material.

Further, the nozzles of the head can also be individually controlled. Since the nozzles can be individually controlled, different compositions can be discharged from a specific nozzle. For example, one head 1903a can be provided with a nozzle which discharges a composition including a conductive film material and a nozzle which discharges a composition including an insulating film material.

Note that the nozzles are connected to a tank filled with compositions.

In the case of performing droplet discharge treatment on large area, such as a formation step of an interlayer insulating film, a composition including an interlayer insulating film material is preferably discharged from all nozzles. Further, a composition including an interlayer insulating film material is preferably discharged from all nozzles of a plurality of heads. Accordingly, throughput can be improved. Naturally, in the interlayer insulating film formation step, droplet discharge treatment may be performed on large area by discharging a composition including an interlayer insulating film material from one nozzle and by moving the nozzle over the substrate a plurality of times.

Pattern formation on large mother glass can be performed by moving the head in zigzag or shuttling the head. At this time, the head may be moved relative to the substrate a plurality of times. When the head is moved over the substrate, the head is preferably inclined toward a moving direction.

When a plurality of panels is formed out of large mother glass, the head preferably has a width equal to that of one panel. This is because a pattern can be formed in the region where the panel 1930 is to be formed by moving the head once; thus, high throughput can be expected.

The head may have a width narrower than that of the panel. At this time, a plurality of heads having a narrow width may be arranged in series to have a width equal to that of one panel. Bending of the heads, which is concerned as a width of the head becomes broader, can be prevented from occurring by arranging a plurality of heads having a narrow width in series. Naturally, a pattern may be formed by moving a head having a narrow width a plurality of times.

A step of discharging a composition by a droplet discharge method as described above is preferably performed under reduced pressure. This is because a solvent of the composition is evaporated during a period from the point of discharge to the point of landing on an object to be treated, and thus, both steps of drying and baking of the composition can be omitted. It is preferable to perform the step under reduced pressure, since an oxide film or the like is not formed over a conductor. In addition, the step of dropping the composition may be performed in a nitrogen atmosphere or an organic gas atmosphere.

A piezo method can be employed as a droplet discharge method. The piezo method is utilized also for an inkjet printer since it has superior droplet controllability and a high degree of freedom for ink selection. Note that the piezo method includes a bender type (typically, an MLP (Multi Layer Piezo) type), a piston type (typically, an MLChip (Multi Layer Ceramic Hyper Integrated Piezo Segments) type), a side wall type, and a roof wall type. Alternatively, a droplet discharge method using a thermal method which makes a heating element generate heat to generate bubbles, thereby pushing out a solution may be employed depending on a solvent of the solution.

EXAMPLE 1

A step of forming a conductive layer serving as a pixel electrode according to Embodiment Mode 1 is described in this example with reference to FIGS. 1A to 1F and FIGS. 7A and 7B.

A first conductive layer 1002 was formed over a glass substrate 1001 by a sputtering method as shown in FIG. 1A. Here, ITO containing silicon oxide was formed as the first conductive layer.

Water-soluble polyvinyl alcohol (PVA) was discharged to a region to be between pixel electrodes by a droplet discharge method as shown in FIG. 1B. The PVA was exposed to $CF_4$ plasma to form a first mask pattern 1003 having low wettability.

A resist containing polyimide as its main component was applied by a droplet discharge method and temporarily baked at temperatures from 50° C. to 150° C. to form a second mask pattern 1004 having high wettability as shown in FIG. 1C.

Figure 7A:
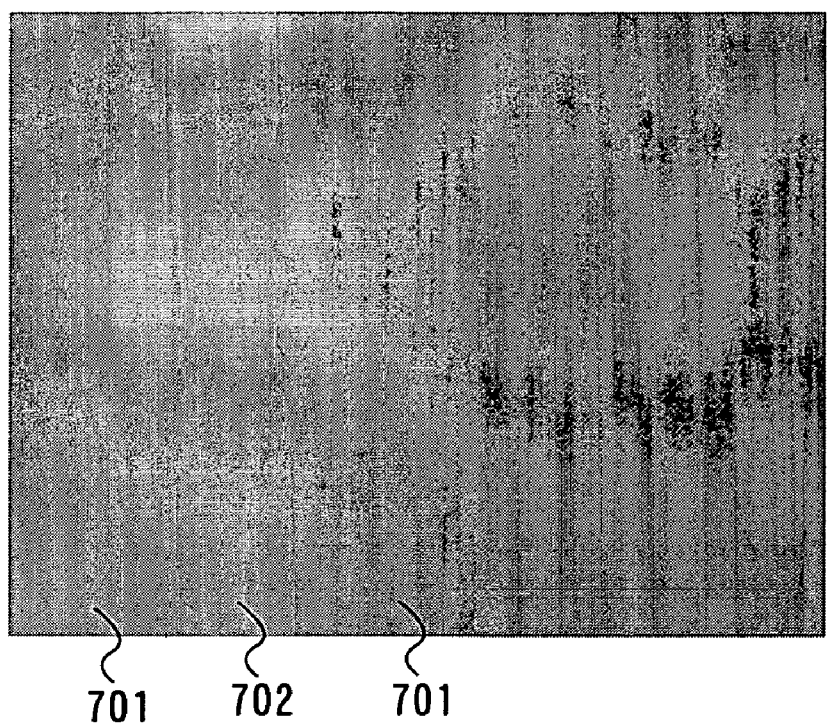
FIGS. 7A and 7B are top views showing a mask pattern for forming a pixel electrode according to the present invention.
Figure 7B:
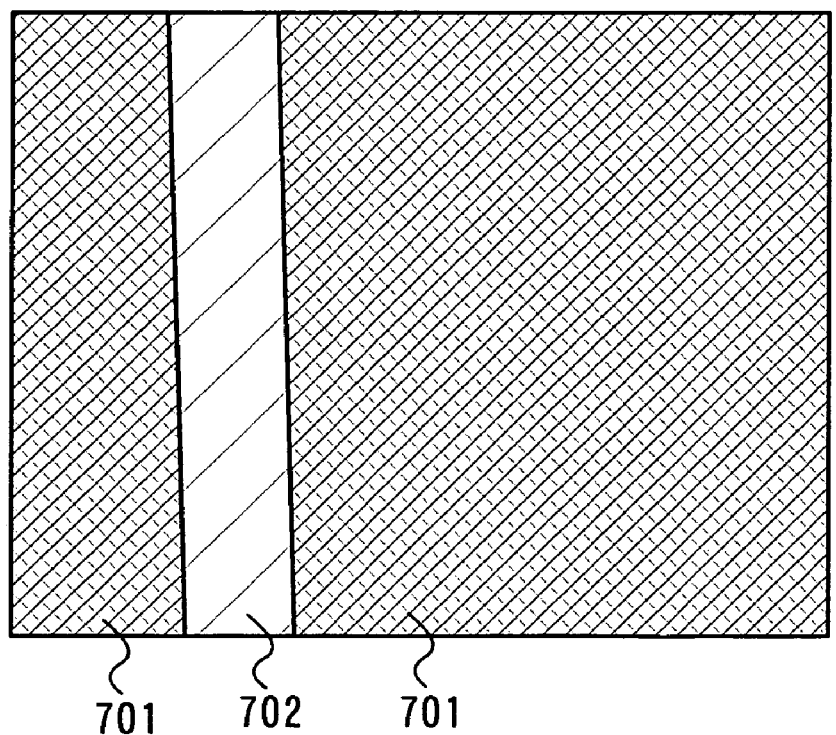

The substrate surface was washed with pure water to remove the first mask pattern 1003 as shown in FIG. 1D. A top view at the time is shown in FIGS. 7A and 7B. FIG. 7A is an optical micrograph of an upper surface of the substrate, and FIG. 7B is a schematic diagram of FIG. 7A. It is found that the PVA that is the first mask pattern is removed and a second mask pattern 701 is provided over a first conductive layer 702.

After fully baking the second mask pattern at temperatures from 160° C. to 250° C., the first conductive layer was partly etched using the second mask pattern to form a second conductive layer 1006 serving as a pixel electrode.

EXAMPLE 2

A step of forming a conductive layer serving as a pixel electrode according to Embodiment Mode 2 is described in this example with reference to FIGS. 2A to 2F and FIGS. 8A and 8B.

A first conductive layer 1002 was formed over a glass substrate 1001 by a sputtering method as shown in FIG. 2A. Here, ITO containing silicon oxide was formed as the first conductive layer.

A fluorosilane coupling agent was discharged to a region to be between pixel electrodes by a droplet discharge method as shown in FIG. 2B. Then, the fluorosilane coupling agent was baked at temperatures from 50° C. to 150° C. and firmly fixed to form a first mask pattern 1011 having low wettability.

A resist containing polyimide as its main component was applied by a droplet discharge method and baked at temperatures from 160° C. to 250° C. to form a second mask pattern 1012 having high wettability as shown in FIG. 2C.

Figure 8A:
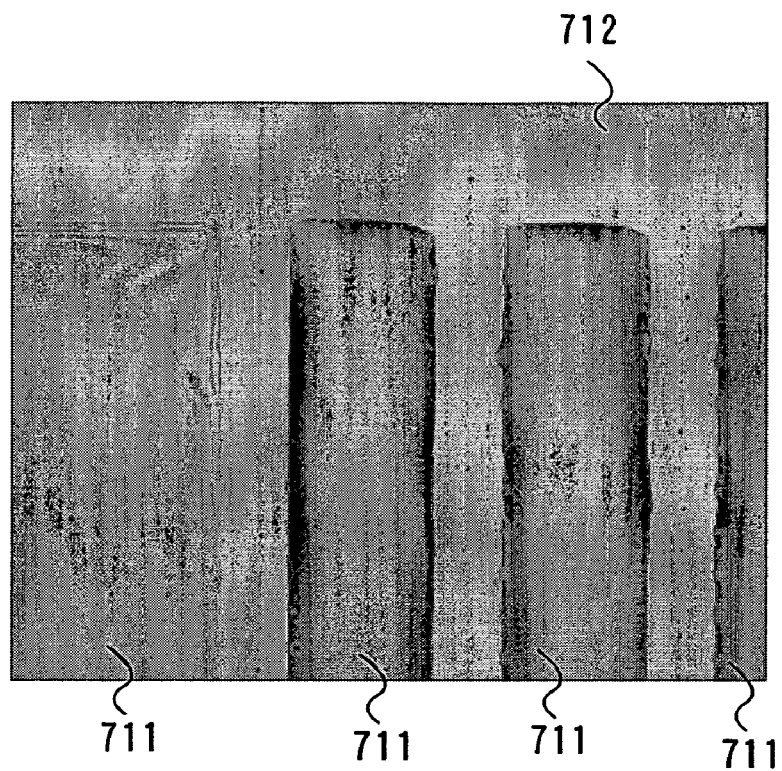
FIGS. 8A and 8B are top views showing a mask pattern for forming a pixel electrode according to the present invention.
Figure 8B:
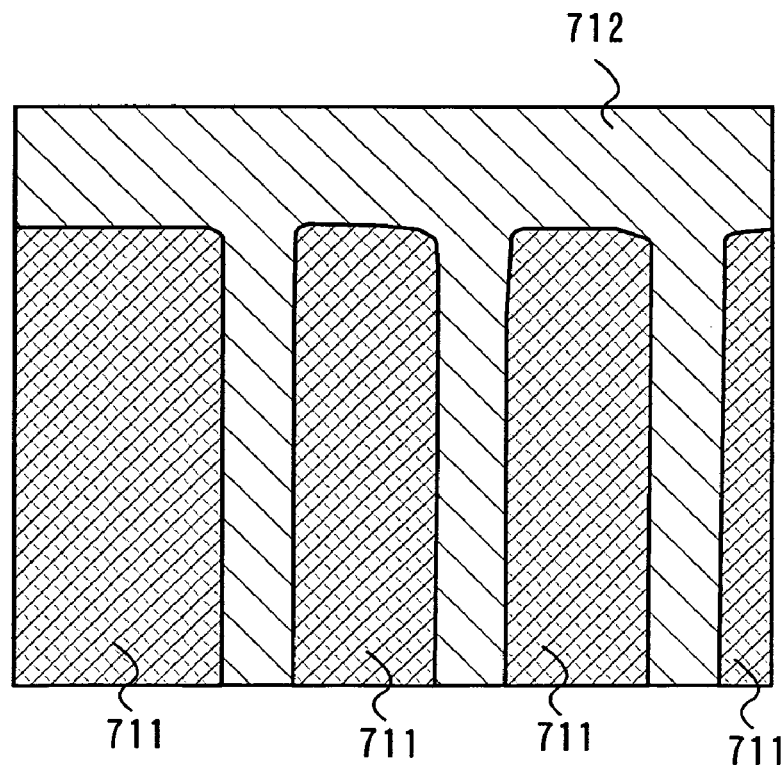

The first mask pattern was removed by ashing using oxygen as shown in FIG. 2D. A top view at the time is shown in FIGS. 8A and 8B. FIG. 8A is an optical micrograph of an upper surface of the substrate, and FIG. 8B is a schematic diagram of FIG. 8A. It is found that the fluorosilane coupling agent that is the first mask pattern is removed and a second mask pattern 711 is provided over a first conductive layer 712.

The first conductive layer was partly etched using the second mask pattern to form a second conductive layer 1014 serving as a pixel electrode.

EXAMPLE 3

Figure 14:
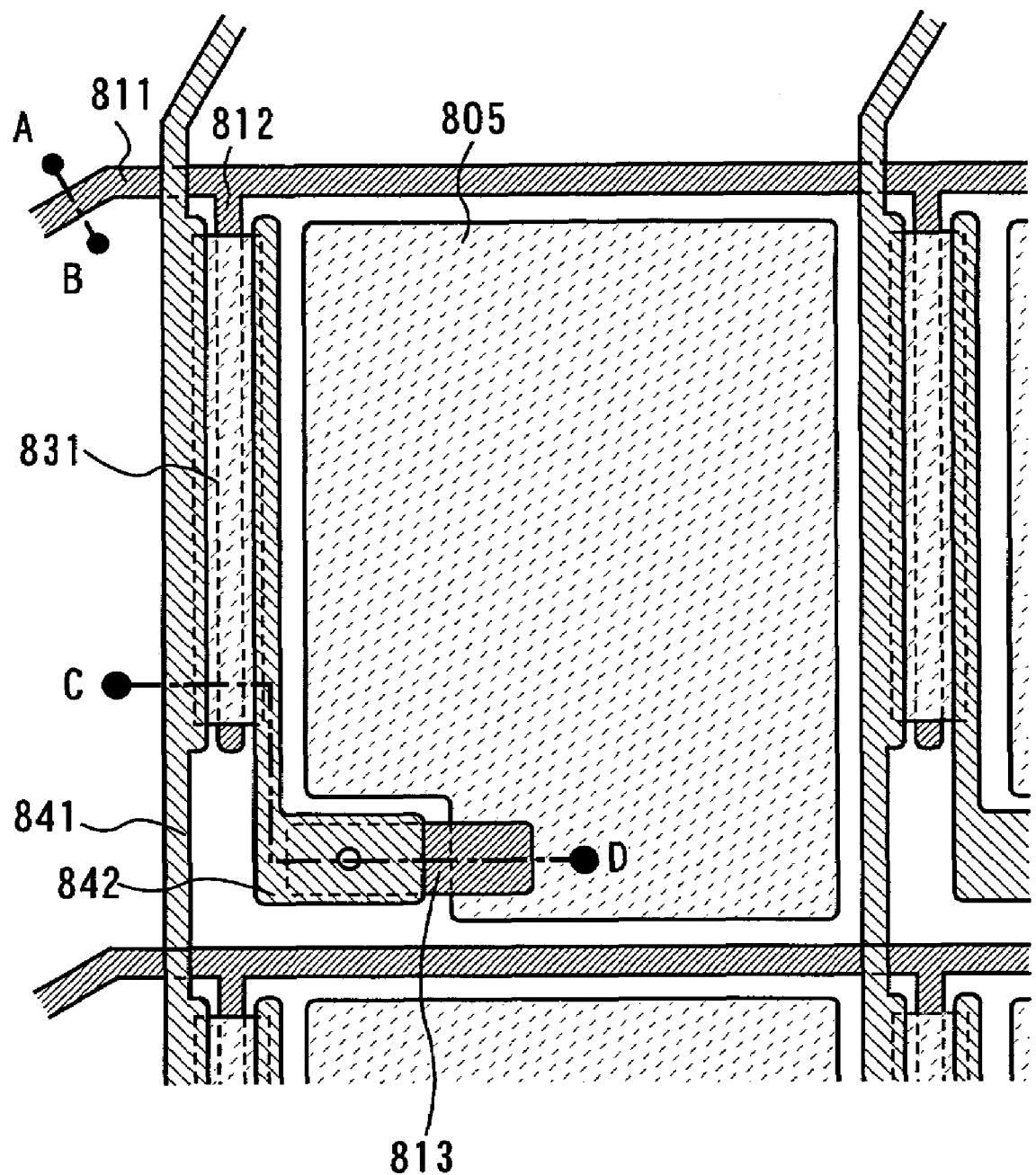
FIG. 14 is a top view showing a step of manufacturing an active matrix substrate of a display device according to the present invention.

A method for manufacturing an active matrix substrate and a display panel having the active matrix substrate is described with reference to FIGS. 10A to 14. This example is described using a liquid crystal display panel as a display panel. FIG. 14 is a plan view of an active matrix substrate, and a longitudinal section structure corresponding to line A-B in a connection terminal portion and line C-D in a pixel portion is schematically shown in FIGS. 10A to 10D, 11A to 11C, 12A to 12C, and 13A and 13B. In this example, a second conductive layer is formed using Embodiment Mode 2; however, this example is not limited thereto. Embodiment Mode 1 can also be used.

Figure 10A:
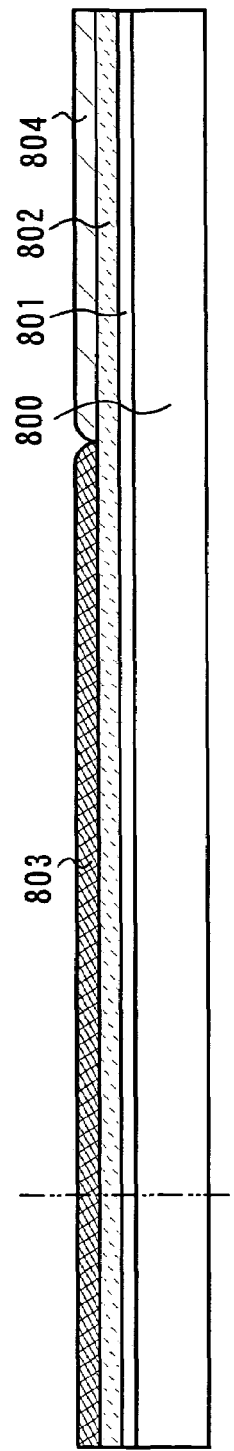
FIGS. 10A to 10D are cross-sectional views showing a step of manufacturing an active matrix substrate of a display device according to the present invention.

The surface of a substrate 800 is oxidized at a temperature of 400° C. to form an insulating film 801 having a thickness of 100 nm as shown in FIG. 10A. The insulating film serves as an etching stopper film of a conductive film to be formed. Subsequently, a first conductive film is formed over the insulating film 801. An AN100 glass substrate manufactured by Asahi Glass Co., Ltd. is used as the substrate 800. Indium tin oxide (ITO) containing silicon oxide is formed as a first conductive layer 802 by a sputtering method to have a thickness of 110 nm.

A first mask pattern 803 is formed by a droplet discharge method. A second mask pattern 804 is formed by a droplet discharge method. The first mask pattern 803 is formed by discharging a material having low wettability, here, a composition in which a fluorosilane coupling agent is dissolved in an alcohol solvent by a droplet discharge method. The second mask pattern 804 is formed by discharging polyimide by a droplet discharge method and baking polyimide by heating at 200° C. for 30 minutes.

Figure 10B:
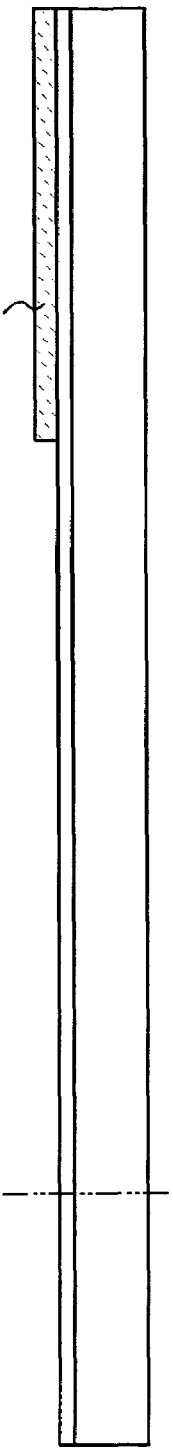

After the first mask pattern 803 is removed by ashing using oxygen, a portion of the first conductive layer 802 not covered with the second mask pattern 804 is removed by etching as shown in FIG. 10B. The second mask pattern 804 is removed to form a second conductive layer 805.

Figure 10C:
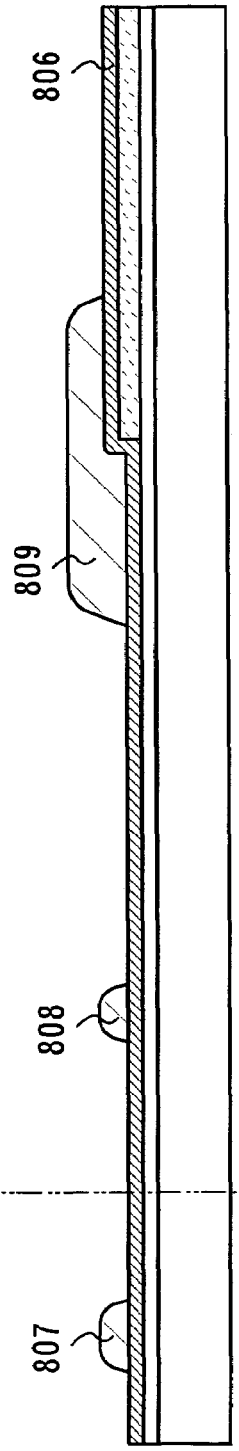

A third conductive layer 806 is formed as shown in FIG. 10C. The third conductive layer is formed of metal such as Ag, Au, Cu, Ni, Pt, Pd, Ir, Rh, W, Al, Ta, Mo, Cd, Zn, Fe, Ti, Si, Ge, Zr, or Ba or nitride of the metal. The third conductive layer 806 is preferably formed of a conductive material which is hard to form oxide when in contact with the second conductive layer. The third conductive layer is appropriately formed by a CVD method, a sputtering method, an evaporation method, or the like. Here, a tungsten film is formed by a sputtering method as the third conductive layer 806.

Figure 10D:
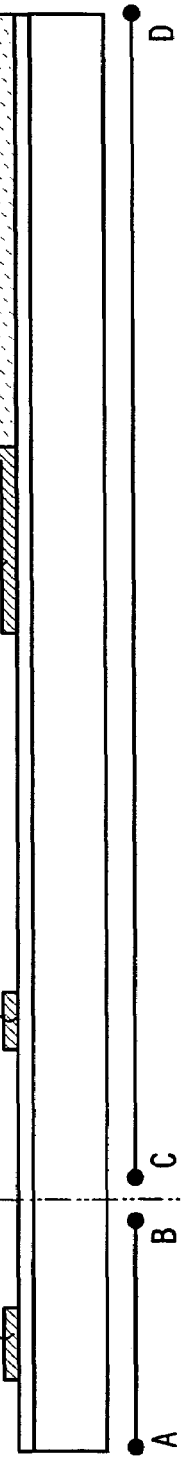

Third mask patterns 807 to 809 are formed as shown in FIG. 10D. The third mask patterns 807 to 809 are discharged over a region where a gate wiring layer, a gate electrode layer, and a connection conductive layer are to be formed.

The third conductive layer 806 is partly etched using the third mask patterns to form a gate wiring layer 811, a gate electrode layer 812, and a connection conductive layer 813. The third mask patterns are removed using a removing solution. Here, the third mask patterns are formed using polyimide by a droplet discharge method.

Figure 11A:
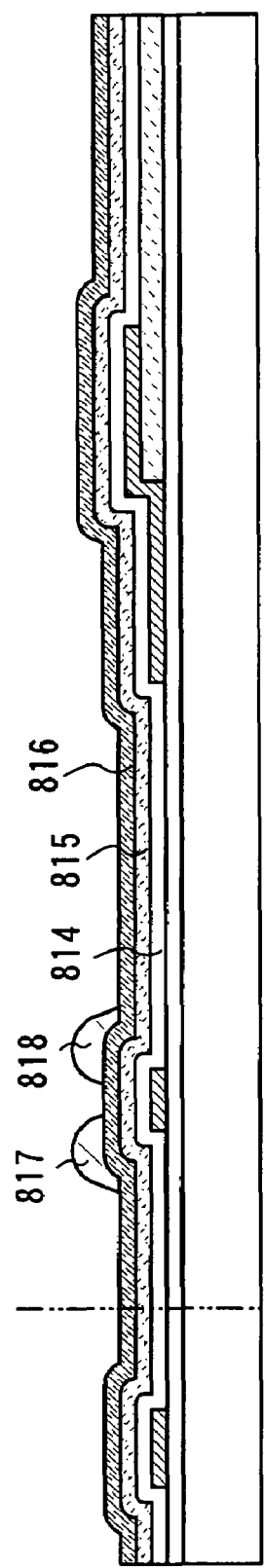
FIGS. 11A to 11C are cross-sectional views showing a step of manufacturing an active matrix substrate of a display device according to the present invention.

A gate insulating film 814 is formed by a plasma CVD method as shown in FIG. 11A. A silicon oxynitride film (H: 1.8%, N: 2.6%, O: 63.9%, Si: 31.7%) having a thickness of 110 nm is formed as the gate insulating film 814 by a plasma CVD method with the use of $SiH_4$ and $N_2O$ (a flow ratio of $SiH_4:N_2O=1:200$) in a chamber heated at 400° C.

A first semiconductor film 815 and a second semiconductor film 816 which shows n-type conductivity are formed. An amorphous silicon film is formed as the first semiconductor film 815 to have a thickness of 150 nm by a plasma CVD method. After removing an oxide film on the surface of the amorphous silicon film, a semi-amorphous silicon film is formed as the second semiconductor film 816 to have a thickness of 50 nm by using a silane gas and a phosphine gas.

Fourth mask patterns 817 and 818 are formed over the second semiconductor film. Here, polyimide is discharged to the second semiconductor film by a droplet discharge method and heated at 200° C. for 30 minutes to form the fourth mask patterns. The fourth mask patterns 817 and 818 are formed over a region where a first semiconductor region is to be formed.

Figure 11B:
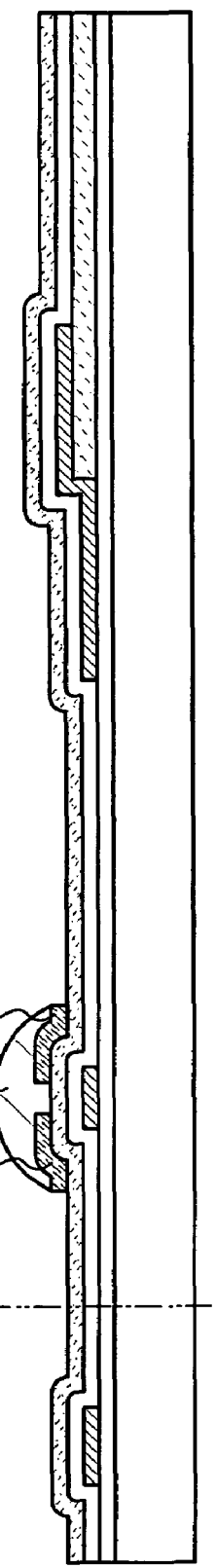

Subsequently, the second semiconductor film 816 is etched using the fourth mask patterns to form first semiconductor regions (source and drain regions and a contact layer) 821 and 822 as shown in FIG. 11B. The second semiconductor film is etched using a mixed gas with a flow ratio of $CF_4:O_2=10:9$. Thereafter, the fourth mask patterns 817 and 818 are removed using a removing solution.

Figure 11C:
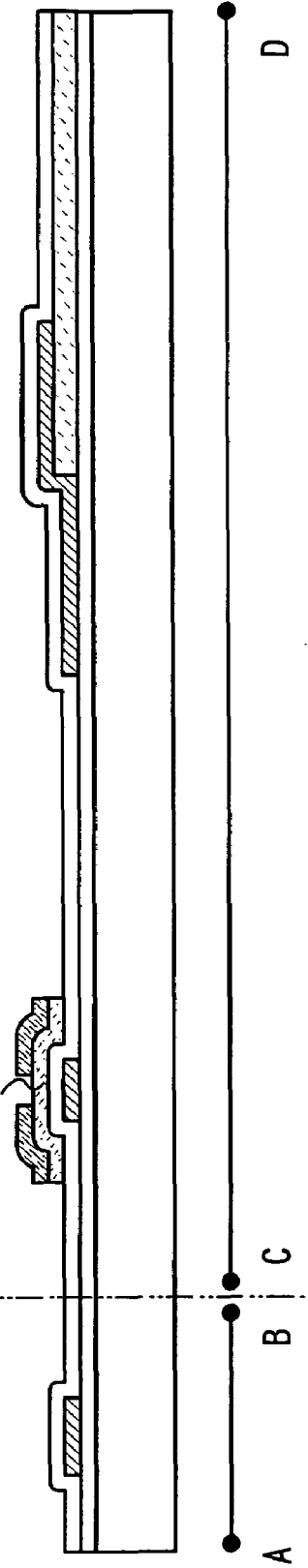

A fifth mask pattern 823 is formed to cover the first semiconductor regions 821 and 822 and the first semiconductor film 815 formed therebetween. The fifth mask pattern is formed of a similar material by a similar method to those of the fourth mask patterns. The first semiconductor film 815 is etched using the fifth mask pattern to form a second semiconductor region 831 and to partly expose the gate insulating film 814 as shown in FIG. 11C. The first semiconductor film is etched using a mixed gas with a flow ratio of $CF_4:O_2=10:9$, and then, ashing using oxygen is performed. Thereafter, the fifth mask pattern 823 is removed using a removing solution.

Figure 12A:
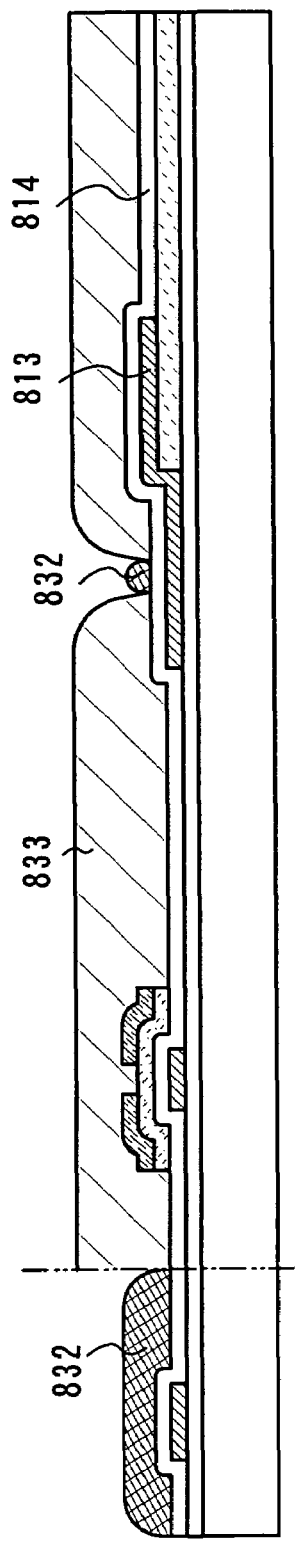
FIGS. 12A to 12C are cross-sectional views showing a step of manufacturing an active matrix substrate of a display device according to the present invention.

A sixth mask pattern 832 is formed as shown in FIG. 12A. A composition having low wettability is discharged by a droplet discharge method to a region where the gate insulating film 814 and the connection conductive layer 813 are overlapped with each other and a connection terminal portion to form the sixth mask pattern. Here, a composition of a fluorosilane coupling agent dissolved in an alcohol solvent is used as the composition having low wettability. The sixth mask pattern 832 is a protective film for forming a seventh mask pattern used to form a contact hole in a region where a drain electrode is to be connected to the connection conductive layer 813. The seventh mask pattern is a protective film to expose the conductive layer of the connection terminal portion.

The seventh mask pattern 833 is formed. The seventh mask pattern is a mask for forming a first contact hole and is formed by discharging polyimide by a droplet discharge method and heating at 200° C. for 30 minutes. At this time, the sixth mask pattern 832 is formed of a material having low wettability and the seventh mask pattern 833 is formed of a material having high wettability. Therefore, the seventh mask pattern 833 is not formed in a region where the sixth mask pattern is formed.

The sixth mask pattern 832 is removed by oxygen ashing to partly expose the gate insulating film 814. The exposed portion of the gate insulating film is etched using the seventh mask pattern 833. Here, the gate insulating film is etched using $CHF_3$. Thereafter, the seventh mask pattern is removed by oxygen ashing and etching using a removing solution.

Figure 12B:
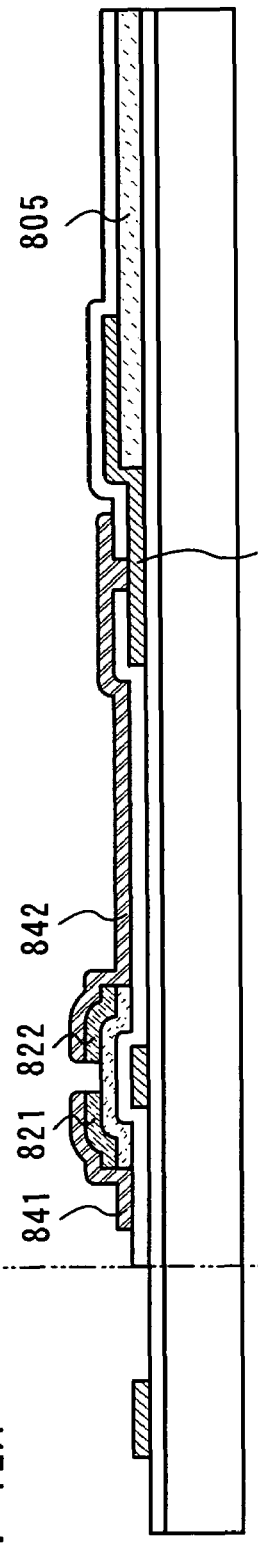

Fourth conductive layers 841 and 842 are formed by a droplet discharge method as shown in FIG. 12B. The fourth conductive layers 841 and 842 serve as a source wiring layer and a drain wiring layer. Here, the fourth conductive layer 841 is formed to connect to the first semiconductor region 821, and the fourth conductive layer 842 is formed to connect to the first semiconductor region 822 and the connection conductive layer 813. A composition dispersed with Ag (silver) particles is discharged and dried by heating at 100° C. for 30 minutes and thereafter baked by heating at 230° C. for an hour in an atmosphere with an oxygen concentration of 10% to form the fourth conductive layers 841 and 842.

The second conductive layer 805 is connected to the connection conductive layer 813. Since the connection conductive layer 813 is connected to the fourth conductive layer 842, the second conductive layer 805 is electrically connected to the fourth conductive layer 842. In this example, the fourth conductive layer 842 is formed of silver (Ag) and the second conductive layer 805 is formed of ITO containing silicon oxide. However, these are not directly connected to each other, so silver is not oxidized. Thus, the second conductive layer 805 and the fourth conductive layer 842 can be electrically connected to each other without increasing contact resistance.

According to the above steps, an active matrix substrate can be formed. Note that a plane structure corresponding to a longitudinal section structure taken along line A-B and line C-D in FIG. 12B is shown in FIG. 14, so it may be referred to as well.

Figure 12C:
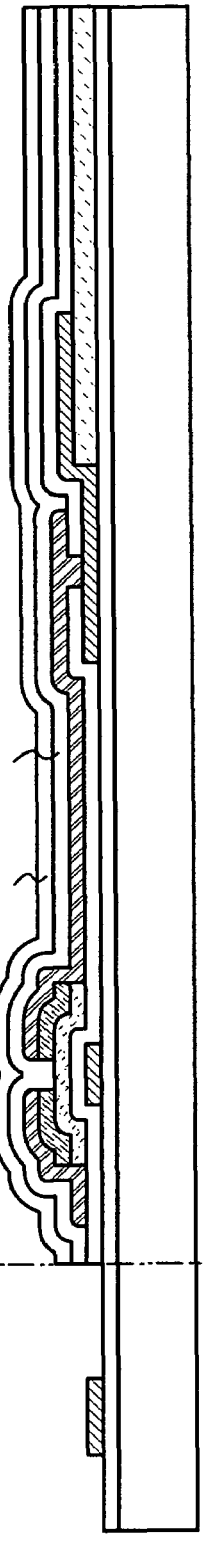

A protective film 843 is formed as shown in FIG. 12C. A silicon nitride film having a thickness of 100 nm is formed as the protective film by a sputtering method using a silicon target and argon and nitrogen (a flow ratio of $Ar:N_2=1:1$) as a sputtering gas.

Subsequently, an insulating film is formed by a printing method or a spin coating method to cover the protective film 843. Then, rubbing is performed on the insulating film to form an orientation film 872. Note that the orientation film 872 can be formed by an oblique evaporation method.

A sealant 873 in the shape of a closed loop is formed by a droplet discharge method in a peripheral region of the pixel portion as shown in FIG. 13A. A liquid crystal material is dropped by a dispenser method (dropping method) inside the closed loop formed by the sealant 873.

Figure 15A:
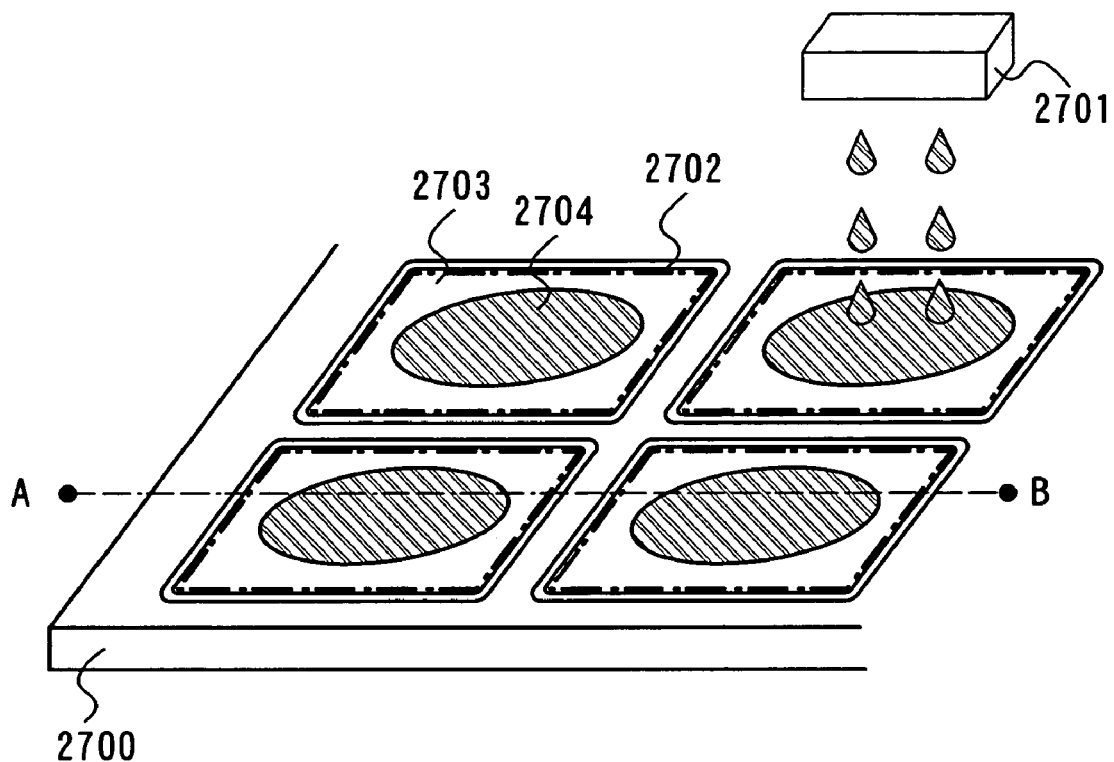
FIGS. 15A and 15B show a liquid crystal dropping method which can be applied to the present invention.

Here, a step of dropping a liquid crystal material is described with reference to FIGS. 15A and 15B. FIG. 15A is a perspective view showing a step of dropping a liquid crystal material with a dispenser 2701, and FIG. 15B is a cross-sectional view taken along line A-B in FIG. 15A.

A liquid crystal material 2704 is dropped or discharged from the dispenser 2701 to cover a pixel portion 2703 surrounded by a sealant 2702. A liquid crystal layer can be formed by moving the dispenser 2701 or by moving a substrate 2700 with the dispenser 2701 fixed. In addition, a plurality of dispensers 2701 may be provided to drop a liquid crystal material to a plurality of pixel portions at a time.

Figure 15B:
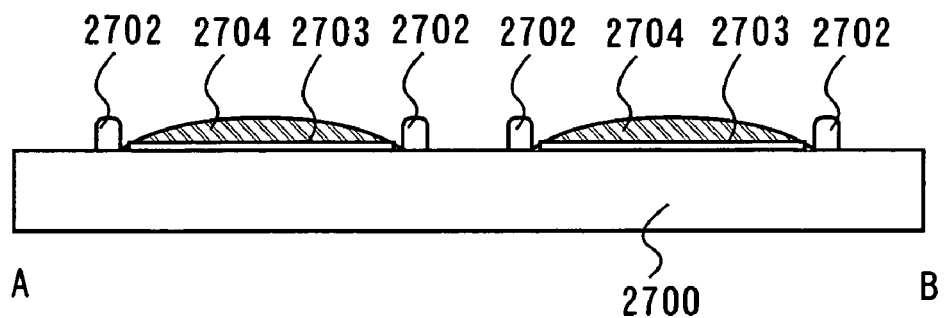

As shown in FIG. 15B, the liquid crystal material 2704 can be selectively dropped or discharged only to a region surrounded by the sealant 2702.

Subsequently, as shown in FIG. 13BA, an opposing substrate 881 provided with an orientation film 883 and a second pixel electrode (opposing electrode) 882 is attached to the active matrix substrate and ultraviolet curing is performed in vacuo. Thus, a liquid crystal layer 884 is formed which is the liquid crystal material sandwiched between the active matrix substrate and the opposing substrate.

The sealant 873 may be mixed with a filler, and the opposing substrate 881 may be provided with a color filter, a shielding film (black matrix), or the like. Instead of a dispenser method (a dropping method), a dipping method (a pumping method) that injects a liquid crystal material using a capillary phenomenon after attaching the opposing substrate can be used as a method for forming the liquid crystal layer 884.

Here, the liquid crystal material is dropped onto the pixel portion. However, a liquid crystal material may be dropped onto an opposing substrate side; then, a substrate having a pixel portion may be attached thereto.

In the case where an insulating film is formed over each edge portion of the gate wiring layer 811 and a source wiring layer (not shown), after removing the insulating film, FPCs (an FPC 886 to be connected to the gate wiring layer and a connection terminal to be connected to the source wiring layer which is not shown) are attached with a conductive layer 885 therebetween as shown in FIG. 13B. Further, a connection portion of each wiring layer and connection terminal is preferably sealed with a sealing resin. This structure can prevent moisture from a section from entering and deteriorating the pixel portion. According to the above steps, a liquid crystal display panel can be formed.

According to the above steps, a liquid crystal display panel can be manufactured. Note that a protective circuit, typically, a diode or the like for preventing electrostatic damage may be provided between the FPC and the source wiring (gate wiring) or in the pixel portion. In this case, electrostatic damage can be prevented by manufacturing according to a similar step to that of the above-described TFT and by connecting the gate wiring layer of the pixel portion to the drain or source wiring layer of the diode.

Note that any of Embodiment Modes 1 to 7 can be applied to this example.

EXAMPLE 4

A method for manufacturing a light emitting display panel as a display panel is described in this example with reference to FIGS. 17A and 17B, 18A and 18B, and 19. A plane structure of a pixel portion is shown in FIG. 19, and FIGS. 17A and 17B and 18A and 18B schematically show a longitudinal section structure corresponding to line A-B and line C-D of the pixel portion in FIG. 19. A first conductive layer is formed using Embodiment Mode 2 in this example; however, this example is not limited thereto. Embodiment Mode 1 can also be used.

Figure 17A:
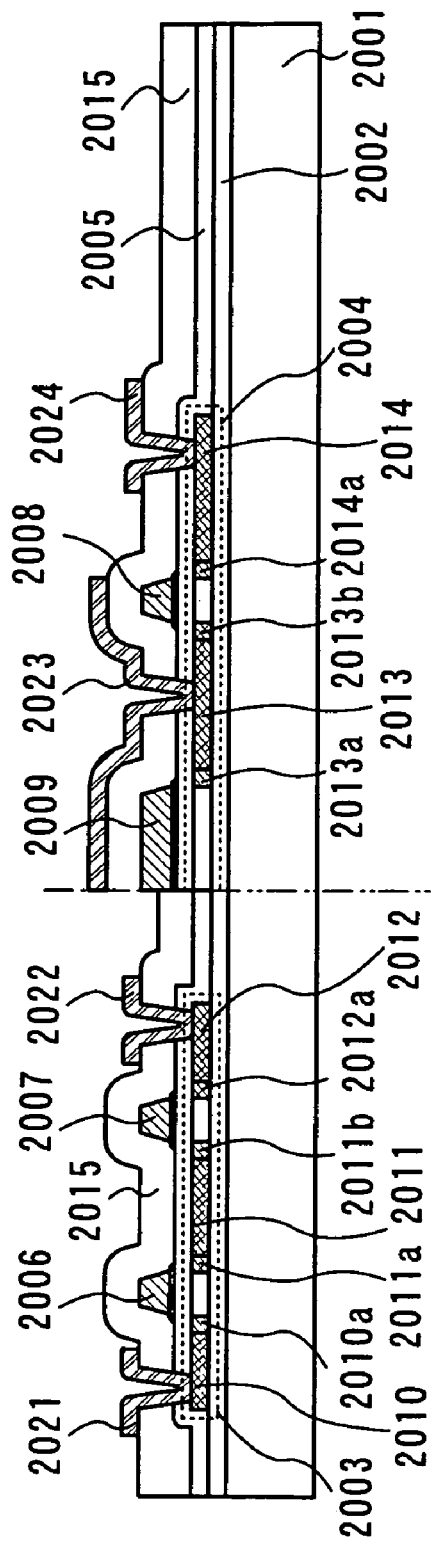
FIGS. 17A and 17B are cross-sectional views showing a step of manufacturing an active matrix substrate of a display device according to the present invention.

A first insulating layer 2002 is formed over a substrate 2001 to have a thickness of 100 nm to 1000 nm as shown in FIG. 17A. Here, the first insulating layer 2002 is formed by laminating a silicon oxide film formed by a plasma CVD method to have a thickness of 100 nm and a silicon oxide film formed by a low-pressure thermal CVD method to have a thickness of 480 nm.

An amorphous semiconductor film is formed to have a thickness of 10 nm to 100 nm. Here, an amorphous silicon film is formed by a low-pressure thermal CVD method to have a thickness of 50 nm. The amorphous semiconductor film is crystallized. In this example, the amorphous silicon film is irradiated with laser light to form a crystalline silicon film. An unnecessary portion of the crystalline silicon film is removed to form semiconductor regions 2003 and 2004. A second insulating layer 2005 serving as a gate insulating film is formed. Here, a silicon oxide film is formed as the second insulating layer 2005 by a CVD method.

A channel doping step of adding a p-type or n-type impurity element in low concentration to a region to become a channel region of a TFT is entirely or selectively performed. This channel doping step is a step for controlling a threshold voltage of the TFT. Note that boron is added by an ion doping method in which dioxane ($B_2H_6$) is plasma-activated without mass separation. Naturally, an ion implantation method with mass separation may be used.

A first conductive layer is formed, patterned, and etched to form second conductive layers 2006 to 2008 serving as gate electrodes and a second conductive layer 2009 serving as a capacitor wiring. Here, a conductive film formed by laminating a TaN film and a W film is formed as the second conductive layers 2006 to 2009 by a sputtering method.

Phosphorus is added to the semiconductor regions in a self-aligned manner using the second conductive layers 2006 to 2009 as masks to form low-concentration impurity regions 2010a, 2011a, 2011b, 2012a, 2013a, 2013b, and 2014a and high-concentration impurity regions 2010 to 2014. The phosphorus concentration in the low concentration impurity regions and that in the high concentration impurity regions are adjusted to be $1\times10^{16}$ atoms/cm$^3$ to $5\times10^{18}$ atoms/cm$^3$ (typically, $3\times10^{17}$ atoms/cm$^3$ to $3\times10^{18}$ atoms/cm$^3$) and $1\times10^{20}$ atoms/cm$^3$ to $1\times10^{21}$ atoms/cm$^3$ (typically, $2\times10^{20}$ atoms/cm$^3$ to $5\times10^{20}$ atoms/cm$^3$), respectively. Note that regions of the semiconductor regions 2003 and 2004 overlapped with the second conductive layers 2006 to 2008 becomes channel formation regions.

A third insulating layer 2015 is formed to cover the second conductive layers 2006 to 2009. Here, an insulating film containing hydrogen is formed. Thereafter, the impurity element added to the semiconductor region is activated and the semiconductor regions are hydrogenated. Here, a silicon nitride oxide film (SiNO film) obtained by a PCVD method is used as the insulating film containing hydrogen.

Third conductive layers are formed after openings are formed to reach the semiconductor regions. A source wiring 2021, a first connection wiring 2022, a power supply line 2023, and a second connection wiring 2024 are formed as the third conductive layers. In this example, a laminated film having a three-layer structure is formed by sequentially laminating a Ti film, an aluminum film containing nickel of 1% to 20%, and a Ti film by a sputtering method and is etched into a desired shape to form the third conductive layers.

Figure 17B:
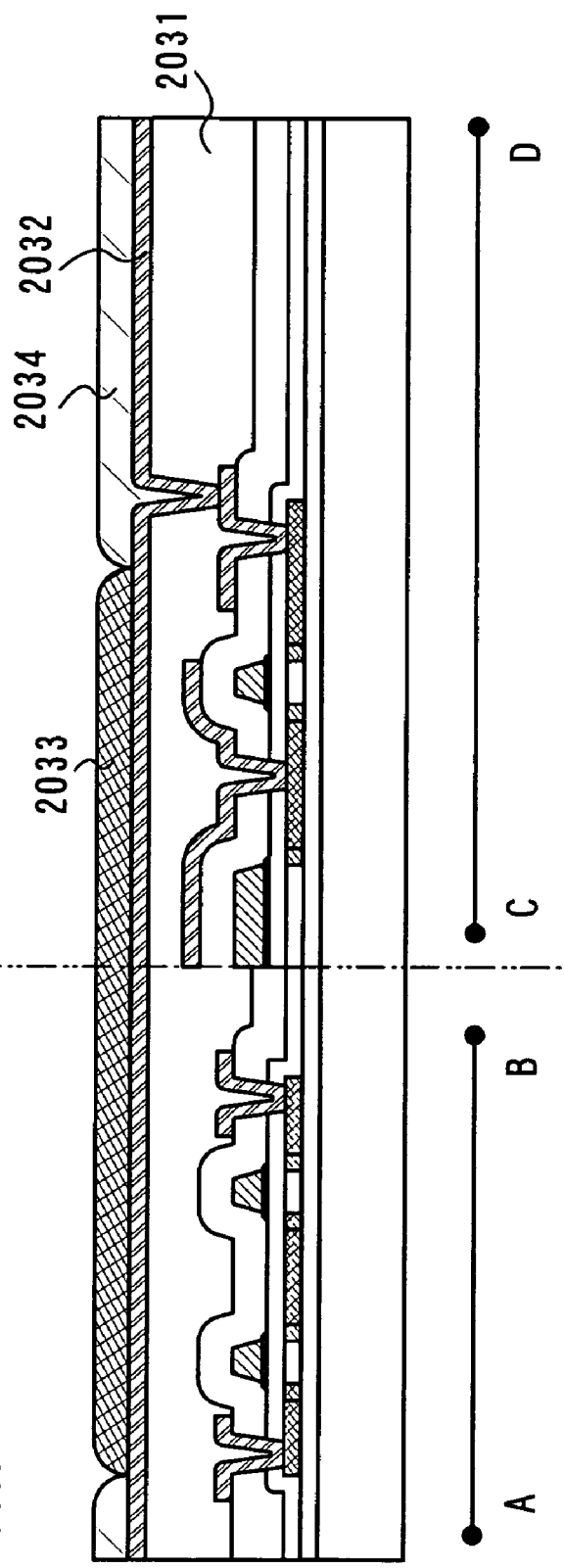
Figure 19:
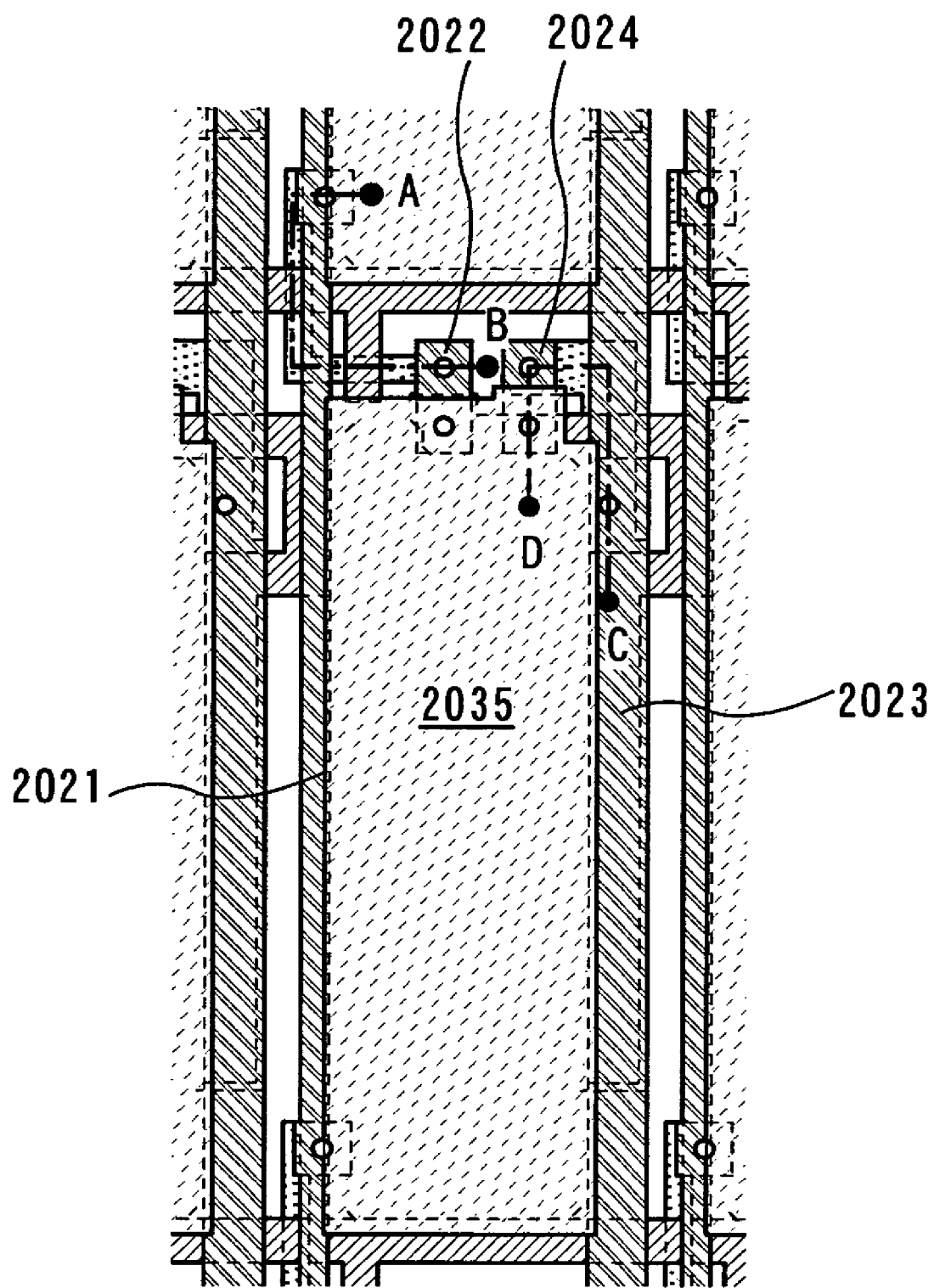
FIG. 19 is a top view showing a step of manufacturing an active matrix substrate of a display device according to the present invention.

A fourth insulating layer 2031 is formed as shown in FIG. 17B. An insulating layer which can be planarized is preferable for the fourth insulating layer. The insulating layer which can be planarized is formed by applying an inorganic material (silicon oxide, silicon nitride, silicon oxynitride, or the like) or photosensitive or non-photosensitive organic material (polyimide, acrylic, polyamide, polyimide amide, a resist, or benzocyclobutene). Alternatively, the insulating layer can have a laminated structure thereof. Another film used as a planarizing film may be an insulating film formed of a SiOx film containing an alkyl group obtained by a coating method, for example, an insulating film including an inorganic siloxane polymer typified by silica glass or an organic siloxane polymer typified by an alkyl siloxane polymer, an alkyl silsesquioxane polymer, a hydrosilsesquioxane polymer, a hydroalkyl silsesquioxane polymer, or the like. As an example of a siloxane polymer, PSB-K1 or PSB-K31 that is a coating insulating film material manufactured by Toray Industries, Inc. or ZRS-5PH that is a coating insulating film material manufactured by Catalysts & Chemicals Industries Co., Ltd. can be given. Here, an acrylic resin is formed. Note that stray light from a light emitting element to be formed is absorbed by the fourth insulating layer, when an organic material in which a material absorbing visible light such as a black pigment or a coloring matter is dissolved or dispersed is used for the fourth insulating layer; thus, the contrast of each pixel can be enhanced.

An opening is formed in the fourth insulating layer by known photolithography and etching, and a portion of the semiconductor region 2004 (the high-concentration impurity region) is exposed. Then, a fourth conductive layer 2032 is formed. The fourth conductive layer 2032 is formed by laminating a reflective conductive film and a transparent conductive film. Here, an aluminum film containing nickel of 1% to 20% and ITO containing silicon oxide are laminated by a sputtering method. Note that aluminum containing nickel of 1% to 20% is preferable because it is not electrically corroded even when in contact with ITO that is oxide.

A first mask pattern 2033 is formed by a droplet discharge method. A second mask pattern 2034 is formed by a droplet discharge method. The first mask pattern 2033 is formed by discharging a material having low wettability, here, a composition of a fluorosilane coupling agent dissolved in an alcohol solvent by a droplet discharge method. Polyimide is discharged by a droplet discharge method and baked by heating at 200° C. for 30 minutes to form the second mask pattern 2034.

After the first mask pattern 2033 is removed by ashing using oxygen, a portion of the fourth conductive layer 2032 which is not covered with the second mask pattern 2034 is removed by etching as shown in FIG. 18A. The second mask pattern 2034 is removed to form a fifth conductive layer 2035. The fifth conductive layer 2035 serves as a first pixel electrode.

A fifth insulating layer 2041 to be a bank (also referred to as a partition wall, barrier, a mound, or the like) is formed to cover an end of the fifth conductive layer 2035. A photosensitive or non-photosensitive organic material (polyimide, acrylic, polyamide, polyimide amide, a resist, or benzocyclobutene) or a SOG film (for example, a SiOx film including an alkyl group) having a thickness of 0.8 µm to 1 µm is used as the fifth insulating layer. It is preferable to form the fifth insulating layer 2041 by using a photosensitive material, since a side face thereof becomes such a shape that the radius of curvature continuously changes and an upper-layer thin film is formed without break.

The fifth insulating layer 2041 may be a light shielding insulator in which a material absorbing visible light such as a coloring matter or a black pigment is dissolved or dispersed in the above-described organic material. For example, a material such as COLOR MOSAIC CK (trade name) manufactured by FUJIFILM OLIN Co., Ltd. is used. In this case, the fifth insulating layer serves as a black matrix; thus, the fifth insulating layer can absorb stray light from a light emitting element to be formed. Accordingly, the contrast of each pixel can be enhanced. Further, the fourth insulating layer 2031 formed of a light-shielding insulator can generate a light-shielding effect when combined with the fifth insulating layer 2041.

A layer including a light emitting material 2042 is formed over the fifth conductive layer 2035 and over the end of the fifth insulating layer 2041 by an evaporation method, a coating method, a droplet discharge method, or the like. A sixth conductive layer 2043 serving as a second pixel electrode is formed over the layer including a light emitting material 2042. Here, ITO containing silicon oxide is formed by a sputtering method. Accordingly, the fifth conductive layer 2035, the layer including a light emitting material 2042, and the sixth conductive layer 2043 can form a light emitting element. Each material of the conductive layers and the layer including a light emitting material of the light emitting element is appropriately selected and each thickness thereof is adjusted.

Note that moisture adsorbed inside or on the surface of the fifth insulating layer 2041 is removed by performing heat treatment at 200° C. at atmospheric pressure before forming the layer including a light emitting material 2042. In addition, heat treatment is preferably performed at 200° C. to 400° C., preferably, 250° C. to 350° C. under reduced pressure, and the layer including a light emitting material 2042 is preferably formed by a vacuum evaporation method or a droplet discharge method under reduced pressure without being exposed to atmospheric air.

The layer including a light emitting material 2042 may be formed of a charge injection transport material and a light emitting material containing an organic compound or an inorganic compound. The layer including a light emitting material includes one or plural kinds of layers of a low molecular weight organic compound, an intermediate molecular weight organic compound typified by dendriter, oligomer, or the like, and a high molecular weight organic compound. The layer including a light emitting material may be combined with an electron injection transport or hole injection transport inorganic compound.

As a highly electron transporting material among charge injection transport materials, a metal complex having a quinoline skeleton or a benzoquinoline skeleton such as tris(8-quinolinolato)aluminum [Alq$_3$], tris(5-methyl-8-quinolinolato)aluminum [Almq$_3$], bis(10-hydroxybenzo[h]-quinolinato)beryllium [BeBq$_2$], or bis(2-methyl-8-quinolinolato)-4-phenylphenolato-aluminum [BAlq], or the like can be used.

As a highly hole transporting material, an aromatic amine compound (in other words, a compound having a benzene ring-nitrogen bond) such as 4,4'-bis[N-(1-naphthyl)-N-phenyl-amino]-biphenyl[α-NPD], 4,4'-bis[N-(3-methylphenyl)-N-phenyl-amino]-biphenyl[TPD], 4,4',4''-tris(N,N-diphenyl-amino)-triphenylamine[TDATA], or 4,4',4''-tris[N-(3-methylphenyl)-N-phenyl-amino]-triphenylamine [MTDATA] can be used.

As a highly electron injecting material among charge injection transport materials, a compound of alkali metal or alkaline earth metal such as lithium fluoride (LiF), cesium fluoride (CsF), or calcium fluoride (CaF$_2$) can be specifically used. The highly electron injecting material may be a mixture of a highly electron transporting material such as Alq$_3$ and alkaline earth metal such as magnesium (Mg).

As a highly hole injecting material among charge injection transport materials, metal oxide such as molybdenum oxide (MoO$_x$), vanadium oxide (VO$_x$), ruthenium oxide (RuO$_x$), tungsten oxide (WO$_x$), or manganese oxide (MnO$_x$) can be used. In addition, a phthalocyanine compound such as phthalocyanine (H$_2$Pc) or copper phthalocyanine (CuPc) can be used.

A light emitting layer may perform color display by providing each pixel with light emitting layers having different emission wavelength bands. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter (colored layer) which transmits light of the emission wavelength band. Providing a light emitting side of a pixel with a filter (colored layer) can omit a circularly polarizing plate or the like which is conventionally required and can eliminate the loss of light emitted from the light emitting layer. Further, change in hue, which occurs when a pixel portion (display screen) is obliquely seen, can be reduced.

A light-emitting material forming the light emitting layer includes various materials. As to a low molecular weight organic light emitting material, 4-(dicyanomethylene)2-methyl-6-[2-(1,1,7,7-tetramethyljulolidine-9-yl)ethenyl]-4H-pyran [DCJT], 4-dicyanomethylene-2-t-butyl-6-[2-(1,1,7,7-tetramethyl julolidine-9-yl-ethenyl)]-4H-pyran[DCJTB], periflanthene, 2,5-dicyano-1,4-bis[2-(10-methoxy-1,1,7,7-tetramethyl julolidine-9-yl)ethenyl]benzene, N,N'-dimethyl quinacridon[DMQd], coumarin 6, coumarin 545T, tris(8-quinolinolate)aluminum[Alq$_3$], 9,9'-bianthryl, 9,10-diphenylanthracene[DPA], 9,10-di(2-naphthyl)anthracene[DNA], or the like can be used. In addition, another material can also be used.

A high molecular weight organic light emitting material is physically stronger than a low molecular weight material and is superior in durability of the element. In addition, a high molecular weight material can be formed by a coating method, and therefore, the element is relatively easily manufactured. A light emitting element using a high molecular weight organic light emitting material basically has the same structure as that of a light emitting element using a low molecular weight organic light emitting material, in other words, a cathode/a layer including a light emitting material/ an anode. However, a two-layer structure is employed in many cases when the layer including a light emitting material using a high molecular weight organic light emitting material is formed. This is because it is difficult to form such a laminated structure as in the case of using a low molecular weight organic light emitting material. Specifically, the light emitting element using a high molecular weight organic light emitting material has a structure of a cathode/a light emitting layer/a hole transport layer/an anode.

The emission color is determined by the material of the light emitting layer. Therefore, a light emitting element which emits desired light can be formed by selecting an appropriate material of the light emitting layer. Polyparaphenylene vinylene, polyparaphenylene, polythiophen, or polyfluorene can be used as a high molecular weight light emitting material that can be used to form the light emitting layer.

A derivative of poly(paraphenylene vinylene)[PPV], for example, poly(2,5-dialkoxy-1,4-phenylene vinylene)[RO-PPV], poly(2-(2'-ethyl-hexoxy)-5-metoxy-1,4-phenylene vinylene)[MEH-PPV], poly(2-(dialkoxyphenyl)-1,4-phenylene vinylene)[ROPh-PPV], or the like can be used as the polyparaphenylene-vinylene light emitting material. A derivative of polyparaphenylene[PPP], for example, poly(2,5-dialkoxy-1,4-phenylene)[RO-PPP], poly(2,5-dihexoxy-1,4-phenylene), or the like can be used as the polyparaphenylene light emitting material. A derivative of polythiophene [PT], for example, poly(3-alkylthiophene)[PAT], poly(3-hexylthiophene)[PHT], poly(3-cyclohexylthiophene) [PCHT], poly(3-cyclohexyl-4-methilthiophene)[PCHMT], poly(3,4-dicyclohexylthiophene)[PDCHT], poly[3-(4-octylphenyl)-thiophene] [POPT], poly[3-(4-octylphenyl)-2,2 bithiophene] [PTOPT], or the like can be used as the polythiophene light emitting material. A derivative of polyfluorene[PF], for example, poly(9,9-dialkylfluorene)[PDAF], poly(9,9-dioctylfluorene)[PDOF], or the like can be used as the polyfluorene light emitting material.

Note that properties of hole injection from an anode can be enhanced by interposing a high molecular weight organic light emitting material having hole transporting properties between the anode and the high molecular weight organic light emitting material having light emitting properties. The hole transporting material is generally dissolved into water together with an acceptor material, and the solution is applied by a spin coating method or the like. Since the hole transporting material is insoluble in an organic solvent, a laminate with the above-described light emitting material having light emitting properties can be formed. A mixture of PEDOT and camphor sulfonic acid (CSA) which serves as an acceptor material, a mixture of polyaniline [PANI] and polystyrene sulfonic acid [PSS] which serves as an acceptor material, or the like can be used as the high molecular weight organic light emitting material having hole transporting properties.

In addition, the light emitting layer can be formed to emit monochrome or white light. In the case of using a white light emitting material, a filter (colored layer) which transmits light having a specific wavelength is provided on a light emitting side of a pixel, thereby performing color display.

In order to form a light emitting layer which emits white light, for example, $Alq_3$, $Alq_3$ partially doped with Nile red that is a red light emitting pigment, p-EtTAZ, and TPD (aromatic diamine) are sequentially laminated by an evaporation method to obtain white light. When the light emitting layer is formed by a coating method using spin coating, the layer after coating is preferably baked by vacuum heating. For example, an aqueous solution of poly(ethylene dioxythiophene)/poly (styrene sulfonic acid)(PEDOT/PSS) may be entirely applied and baked to form a film that functions as a hole injection layer. Then, a polyvinyl carbazole (PVK) solution doped with a light emitting center pigment (such as 1,1,4,4-tetraphenyl-1,3-butadiene(TPB), 4-dicyanomethylene-2-methyl-6-(p-dimethylamino-styryl)-4H-pyran(DCM1), Nile red, or coumarin 6) may be entirely applied and baked to form a film that functions as a light emitting layer.

The light emitting layer can be formed to be a single layer. A 1,3,4-oxadiazole derivative (PBD) having electron transporting properties may be dispersed in polyvinyl carbazole (PVK) having hole transporting properties. Another method to obtain white light emission is to disperse PBD of 30 wt % as an electron transporting agent and to disperse four kinds of pigments (TPB, coumarin 6, DCM1, and Nile red) in appropriate amounts. In addition to the light emitting elements described here that provide white light emission, a light emitting element that provides red light emission, green light emission, or blue light emission can be manufactured by appropriately selecting materials of the light emitting layer.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is made of a triplet excitation light emitting material and pixels emitting the other light are made of a singlet excitation light emitting material. A triplet excitation light emitting material has a characteristic that the material has a good luminous efficiency and consumes less power to obtain the same luminance. When a triplet excitation material is used for a red pixel, only a small amount of current needs to be applied to the light emitting element. Thus, reliability can be improved. Pixels emitting red and green light may be made of a triplet excitation light emitting material and a pixel emitting blue light may be made of a singlet excitation light emitting material to achieve low power consumption. Low power consumption can be further achieved by forming a light emitting element which emits green light that has high visibility with a triplet excitation light emitting material.

A metal complex used as a dopant is an example of the triplet excitation light emitting material, and a metal complex having platinum that is a third transition series element as a metal center, a metal complex having iridium as a metal center, and the like are known. The triplet excitation light emitting material is not limited to the compounds. A compound having the above-described structure and an element belonging to any one of Groups 8 to 10 of the periodic table as a metal center can also be used.

The above-described materials for forming the layer including a light emitting material are just examples. The light emitting element can be formed by appropriately laminating functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

The light emitting element formed with the above-described material emits light by being biased in a forward direction. A pixel of a display device formed with a light emitting element can be driven by a simple matrix mode or an active matrix mode. In any event, each pixel emits light by applying a forward bias thereto in specific timing; however, the pixel is in a non-light-emitting state for a certain period. Reliability of the light emitting element can be improved by applying a backward bias at this non-light-emitting time. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of the light emitting device can be improved.

Subsequently, a transparent protective layer 2044 for preventing moisture entry is formed to cover the light emitting element. A silicon nitride film, a silicon oxide film, a silicon oxynitride film (a SiNO film (composition ratio: N>O) or a SiON film (composition ratio: N<O)), a thin film containing carbon as its main component (for example, a DLC film or a CN film), or the like, which can be obtained by a sputtering method or a CVD method, can be used as the transparent protective layer 2044.

According to the above steps, a light emitting display panel can be manufactured. Note that a protective circuit, typically, a diode or the like for preventing electrostatic damage may be provided between the connection terminal and the source wiring layer (gate wiring layer) or in the pixel portion. In this case, electrostatic damage can be prevented by manufacturing the protective circuit according to a similar step to that of the above-described TFT and by connecting the gate wiring layer of the pixel portion to the drain wiring layer or the source wiring layer of the diode.

Note that any of Embodiment Modes 1 to 7 can be applied to this example. Examples 3 and 4 are described using a liquid crystal display panel and a light emitting display panel, respectively, as a display panel; however, the invention is not limited thereto. The invention can be appropriately applied to an active display panel such as a DMD (Digital Micromirror Device), a PDP (Plasma Display Panel), a FED (Field Emission Display), or an electrophoretic display device (electronic paper).

EXAMPLE 5

A mode of a light emitting element which can be applied to the above example is described with reference to FIGS. 20A to 20F.

FIG. 20A shows an example of a light emitting element whose first pixel electrode 11 is formed of a light transmitting oxide conductive material. The first pixel electrode 11 is formed of an oxide conductive material containing silicon oxide with a concentration of 1 atomic % to 15 atomic %. A layer including a light emitting material 16 is formed thereover, which is a laminate of a hole injection layer or hole transport layer 41, a light emitting layer 42, and an electron transport layer or electron injection layer 43. A second pixel electrode 17 is formed with a first electrode layer 33 containing alkali metal or alkaline earth metal such as LiF or MgAg and a second electrode layer 34 formed of a metal material such as aluminum. A pixel of this structure can emit light from the first pixel electrode 11 side as indicated by an arrow in the figure.

FIG. 20B shows an example of a light emitting element which emits light through a second pixel electrode 17. A first pixel electrode 11 is formed with a first electrode layer 35 formed of metal such as aluminum or titanium or a metal material containing the metal and nitrogen with concentrations of a stoichiometric composition ratio or less and a second electrode layer 32 formed of an oxide conductive material containing silicon oxide with a concentration of 1 atomic % to 15 atomic %. A layer including a light emitting material 16 is formed thereover, which is a laminate of a hole injection layer or hole transport layer 41, a light emitting layer 42, and an electron transport layer or electron injection layer 43. A second pixel electrode 17 is formed with a third electrode layer 33 containing alkali metal or alkaline earth metal such as LiF or CaF and a fourth electrode layer 34 formed of a metal material such as aluminum. Each layer is formed to have a thickness of 100 nm or less so that the layer can transmit light. Accordingly, light can be emitted through the second pixel electrode 17.

FIG. 20E shows an example of a light emitting element which emits light from both sides, through a first pixel electrode and a second pixel electrode. A light transmitting conductive film having a high work function is used for a first pixel electrode 11. A light transmitting conductive film having a low work function is used for a second pixel electrode 17. Typically, the first pixel electrode 11 is formed of an oxide conductive material containing silicon oxide with a concentration of 1 atomic % to 15 atomic %, and the second pixel electrode 17 is formed of a third electrode layer 33 containing alkali metal or alkaline earth metal such as LiF or CaF and a fourth electrode layer 34 formed of a metal material such as aluminum, each of which has a thickness of 100 nm or less.

FIG. 20C shows an example of a light emitting element which emits light through a first pixel electrode 11 and a structure in which a layer including a light emitting material 16 is formed by sequentially laminating an electron transport layer or electron injection layer 43, a light emitting layer 42, and a hole injection layer or hole transport layer 41. A second pixel electrode 17 is formed, from the side of the layer including a light emitting material 16, with a second electrode layer 32 formed of an oxide conductive material containing silicon oxide with a concentration of 1 atomic % to 15 atomic % and a first electrode layer 35 formed of metal such as aluminum or titanium or a metal material containing the metal and nitrogen with a concentration of a stoichiometric composition ratio or less. The first pixel electrode 11 is formed with a third electrode layer 33 containing alkali metal or alkaline earth metal such as LiF or CaF and a fourth electrode layer 34 formed of a metal material such as aluminum. Each layer is formed to have a thickness of 100 nm or less so that the layer can transmit light. Accordingly, light can be emitted through the first pixel electrode 11.

FIG. 20D shows an example of a light emitting element which emits light through a second pixel electrode 17 and a structure in which a layer including a light emitting material 16 is formed by sequentially laminating an electron transport layer or electron injection layer 43, a light emitting layer 42, and a hole injection layer or hole transport layer 41. A first pixel electrode 11 is formed to have a similar structure to that shown in FIG. 20A and to be thick to the extent that the first pixel electrode can reflect light emitted from the layer including a light emitting material 16. The second pixel electrode 17 is formed of an oxide conductive material containing silicon oxide with a concentration of 1 atomic % to 15 atomic %. In this structure, the hole injection layer 41 is formed of inorganic metal oxide (typically, molybdenum oxide or vanadium oxide). Accordingly, oxygen to be introduced in forming a second pixel electrode 17 is supplied and hole injection properties are improved. Thus, drive voltage can be lowered.

FIG. 20F shows an example of a light emitting element which emits light from both sides, through a first pixel electrode and a second pixel electrode. A light transmitting conductive film having a low work function is used for the first pixel electrode 11. A light transmitting conductive film having a high work function is used for the second pixel electrode 17. Typically, the first pixel electrode 11 is formed with a third electrode layer 33 containing alkali metal or alkaline earth metal such as LiF or CaF and a fourth electrode layer 34 formed of a metal material such as aluminum, each of which has a thickness of 100 nm or less, and the second pixel electrode 17 may be formed of an oxide conductive material containing silicon oxide with a concentration of 1 atomic % to 15 atomic %.

EXAMPLE 6

An equivalent circuit diagram of a pixel of a light emitting display panel described in the above example and an operating method thereof are described with reference to FIGS. 21A to 21F. In a display device in which a video signal is digital, a method for operating a light emitting display panel includes a method in which a video signal inputted to a pixel is regulated by voltage and a method in which the video signal is regulated by current. The method in which a video signal is regulated by voltage includes a method in which voltage applied to a light emitting element is constant (CVCV) and a method in which current applied to a light emitting element is constant (CVCC). In addition, the method in which a video signal is regulated by current includes a method in which voltage applied to a light emitting element is constant (CCCV) and a method in which current applied to a light emitting element is constant (CCCC). In this example, a pixel which performs CVCV operation is described with reference to FIG. 21A and 21B. A pixel which performs CVCC operation is described with reference to FIGS. 21C to 21F.

Figure 21A:
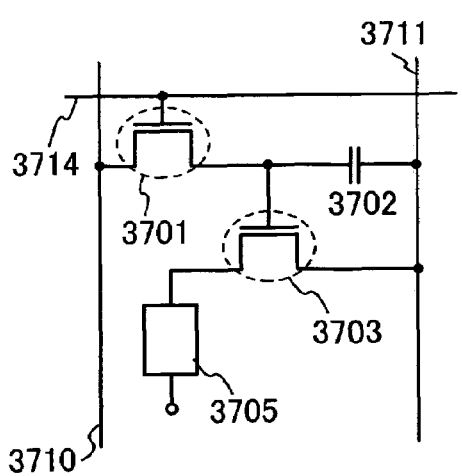
FIGS. 21A to 21F show an equivalent circuit of a pixel which can be applied to the present invention.
Figure 21B:
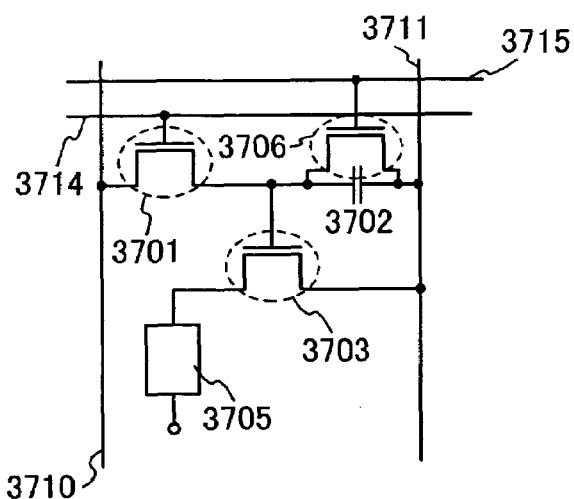

In a pixel shown in FIGS. 21A and 21B, a signal line 3710 and a power supply line 3711 are arranged in a column direction and a scanning line 3714 is arranged in a row direction. In addition, the pixel includes a switching TFT 3701, a driving TFT 3703, a capacitor element 3702, and a light emitting element 3705.

Note that the switching TFT 3701 and the driving TFT 3703 operate in a linear region when they are turned on. The driving TFT 3703 has a role of controlling voltage application to the light emitting element 3705. It is preferable from the viewpoint of manufacturing steps that both of the TFTs have the same conductivity. In this example, the TFTs are formed to be p-channel TFTs. Further, the driving TFT 3703 may be not only an enhancement mode TFT but also a depletion mode TFT. In addition, a ratio of a channel width W to a channel length L (W/L) of the driving TFT 3703 preferably ranges from 1 to 1000, although it depends on the mobility of the TFT. The higher the W/L is, the more electrical characteristics of the TFT are improved.

In the pixels shown in FIGS. 21A and 21B, the switching TFT 3701 is a TFT for controlling input of a video signal to the pixel. When the switching TFT 3701 is turned on, the video signal is inputted to the pixel. Then, voltage of the video signal is stored in the capacitor element 3702.

In FIG. 21A, an opposing electrode of the light emitting element 3705 is an anode and an electrode connected to the driving TFT 3703 is a cathode, in the case where the power supply line 3711 is Vss and the opposing electrode of the light emitting element 3705 is Vdd, in other words, in the case of FIGS. 20C and 20D. In this case, luminance variation due to variation in characteristics of the driving TFT 3703 can be suppressed.

In FIG. 21A, an opposing electrode of the light emitting element 3705 is a cathode and an electrode connected to the driving TFT 3703 is an anode, in the case where the power supply line 3711 is Vdd and the opposing electrode of the light emitting element 3705 is Vss, in other words, in the case of FIGS. 20A and 20B. In this case, voltage of the video signal is held in the capacitor element 3702 and the driving TFT 3703 operates in a linear region by inputting the video signal having higher voltage than Vdd to the signal line 3710. Therefore, luminance variation due to variation in characteristics of the TFT can be suppressed.

The pixel shown in FIG. 21B has a similar structure to that of the pixel shown in FIG. 21A except that a TFT 3706 and a scanning line 3715 are added.

In the TFT 3706, ON or OFF is controlled by the scanning line 3715 that is newly arranged. When the TFT 3706 is turned ON, an electric charge held in the capacitor element 3702 is discharged, and the TFT 3703 is turned OFF. In other words, it is possible to make a state in which current is forced not to flow through the light emitting element 3705 by disposing the TFT 3706. Therefore, the TFT 3706 can be referred to as an erasing TFT. Accordingly, in the structure in FIG. 21B, a lighting period can be started simultaneously with or immediately after a start of a writing period without waiting for writing of signals in all pixels. Consequently, a duty ratio of light emission can be improved.

In the pixel having the above operation structure, the amount of electric current of the light emitting element 3705 can be determined by the driving TFT 3703 which operates in a linear region. According to the above-described structure, luminance variation of the light emitting element, which is caused by variation in characteristics of the TFT, can be improved, and a display device with improved image quality can be provided.

Subsequently, a pixel which performs CVCC operation is described with reference to FIGS. 21C to 21F. The pixel shown in FIG. 21C is provided with a power supply line 3712 and a current control TFT 3704 in addition to the pixel structure shown in FIG. 21A.

Figure 21C:
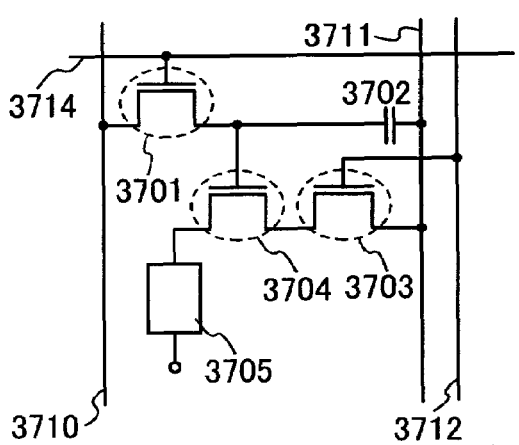
Figure 21D:
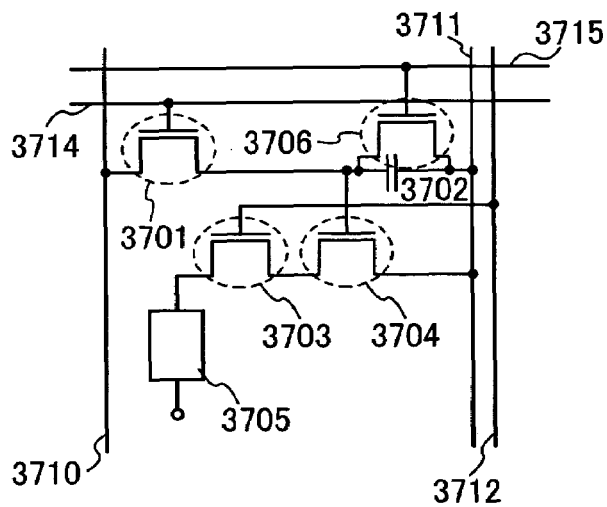
Figure 21E:
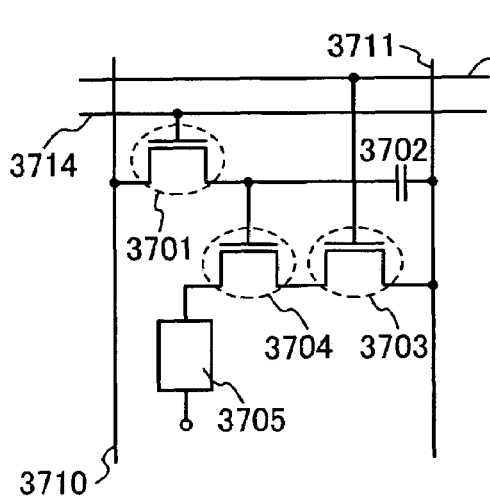

A pixel shown in FIG. 21E is different in the way that a gate electrode of a driving TFT 3703 is connected to a power supply line 3712 arranged in a row direction, but other than that, the pixel has a similar structure to the pixel shown in FIG. 21C. In other words, equivalent circuit diagrams of both of the pixels shown in FIGS. 21C and 21E are the same. However, each power supply line is formed using a conductive layer in a different layer when the power supply line 3712 is arranged in a column direction (FIG. 21C) and when the power supply line 3712 is arranged in a row direction (FIG. 21E). Here, a wiring connected to the gate electrode of the driving TFT 3703 is focused and the figures are separately shown in FIGS. 21C and 21E to show that the wirings are formed in different layers.

Note that the switching TFT 3701 operates in a linear region and the driving TFT 3703 operates in a saturation region. In addition, the driving TFT 3703 has a role of controlling the amount of electric current flowing through the light emitting element 3705, and the current controlling TFT 3704 operates in a saturation region and has a role of controlling supply of electric current to the light emitting element 3705.

Figure 21F:
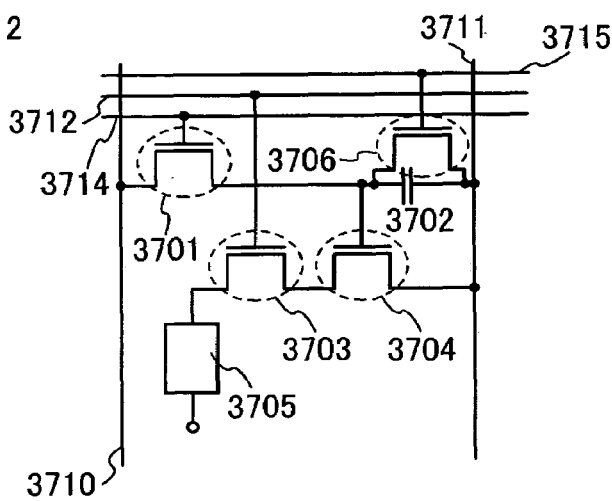

Pixels shown in FIGS. 21D and 21F has the same structure as the pixels shown in FIGS. 21C and 21E except that an erasing TFT 3706 and a scanning line 3715 are added.

Note that even the pixels shown in FIGS. 21A and 21B can perform CVCC operation. In the pixels having the operation structures shown in FIGS. 21C to 21F, Vdd and Vss can be appropriately changed as in the pixels shown in FIGS. 21A and 21B, in accordance with a current flowing direction through the light emitting element.

In the pixel having the above structure, the current controlling TFT 3704 operates in a linear region, so that slight variation in Vgs (gate-source voltage) of the current controlling TFT 3704 does not affect the value of electric current of the light emitting element 3705. In other words, the value of electric current of the light emitting element 3705 can be determined by the driving TFT 3703 which operates in a saturation region. According to the above-described structure, luminance variation of the light emitting element, which is caused by variation in characteristics of the TFT, can be improved, and a display device with improved image quality can be provided.

It is preferable to make a semiconductor film of a driving TFT large specifically in the case of forming a thin film transistor having an amorphous semiconductor or the like, since variation of the TFT can be reduced. Since the pixels shown in FIGS. 21A and 21B have a small number of TFTs, an aperture ratio can be increased.

The structure in which the capacitor element 3702 is provided is shown; however, the invention is not limited thereto. When a gate capacitor or the like can be used as the capacitor that can hold a video signal, the capacitor element 3702 may not be provided.

When the semiconductor region of the thin film transistor is formed of an amorphous semiconductor film, a threshold value is easily shifted. Therefore, a circuit which compensates the threshold value is preferably provided in the pixel or in the periphery of the pixel.

Such an active matrix light emitting device is considered to be advantageous to low voltage driving when a pixel density is increased since each pixel is provided with TFTs. On the other hand, a passive matrix light emitting device in which TFTs are provided for every column can be formed. In the passive matrix light emitting device, TFTs are not provided for each pixel; therefore, a high aperture ratio can be obtained.

In the display device according to the invention, a driving method for screen display is not particularly limited. For example, a dot-sequential driving method, a line-sequential driving method, a plane-sequential driving method, or the like can be used as the driving method. Typically, the line-sequential driving method is employed, and a time gray scale driving method or an area gray scale driving method may be appropriately used. In addition, a video signal inputted to a source line of the display device may be an analog signal or a digital signal. A driving circuit or the like may be appropriately designed in accordance with the video signal.

As described above, various pixel circuits can be used.

EXAMPLE 7

Figure 23A:
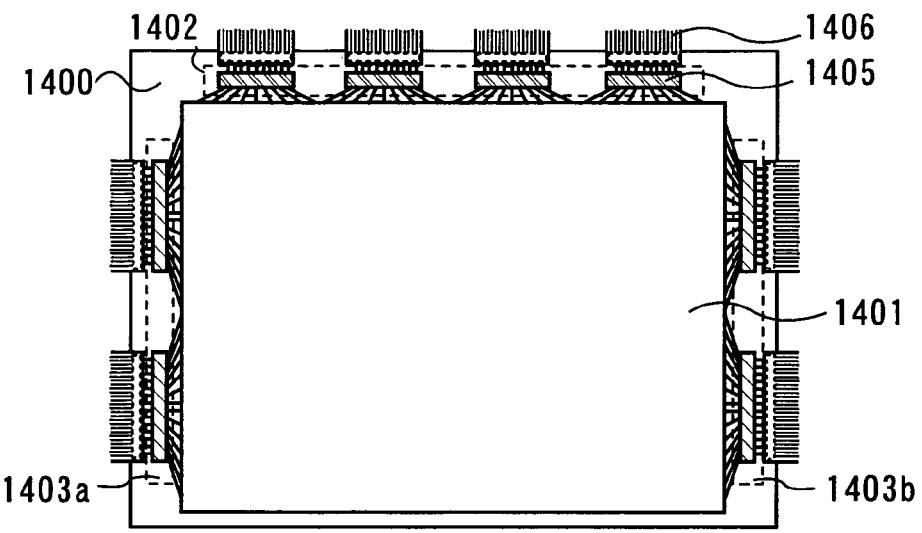
FIGS. 23A to 23C are top views showing a method for mounting a driver circuit of a display device according to the present invention.
Figure 23B:
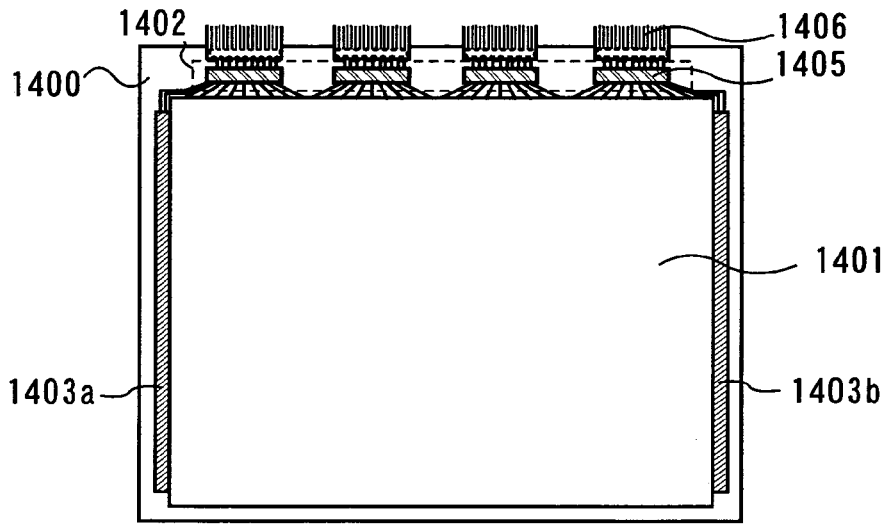
Figure 23C:
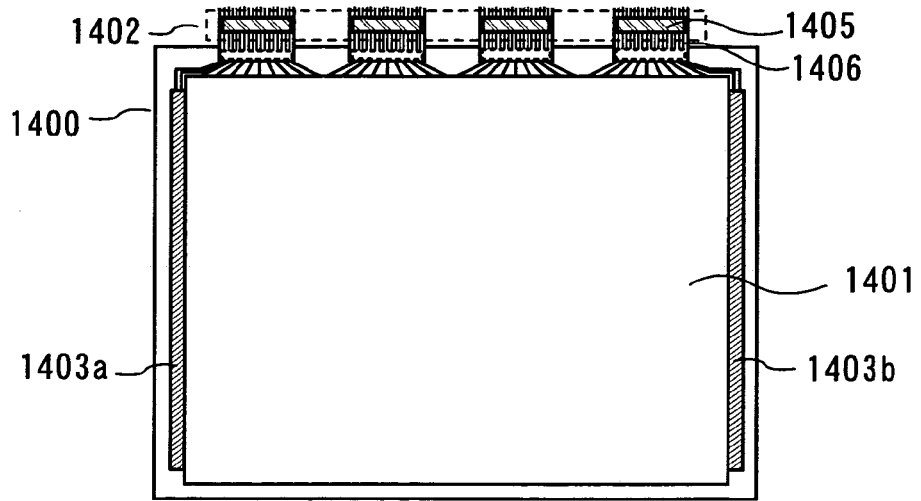

Mounting of a driver circuit on the display panel described in the above example is described in this example with reference to FIGS. 23A to 23C.

As shown in FIG. 23A, a signal line driver circuit 1402 and scanning line driver circuits 1403a and 1403b are mounted on the periphery of a pixel portion 1401. In FIG. 23A, an IC chip 1405 is mounted on a substrate 1400 by a known anisotropic conductive adhesive, a mounting method using an anisotropic conductive film, a COG method, a wire bonding method, reflow treatment using a solder bump, or the like as the signal line driver circuit 1402, the scanning line driver circuits 1403a and 1403b, and the like. Here, a COG method is used. Then, the IC chip is connected to an external circuit through an FPC (flexible printed circuit) 1406.

As shown in FIG. 23B, in the case of forming a TFT of a SAS or a crystalline semiconductor, a pixel portion 1401, scanning line driver circuits 1403a and 1403b, and the like may be integrated with a substrate, and a signal line driver circuit 1402 and the like may be separately mounted as an IC chip. In FIG. 23B, an IC chip 1405 is mounted on a substrate 1400 by a COG method as the signal line driver circuit 1402. Then, the IC chip is connected to an external circuit through an FPC 1406.

Further, as shown in FIG. 23C, a signal line driver circuit 1402 and the like may be mounted by a TAB method instead of the COG method. Then, an IC chip is connected to an external circuit through an FPC 1406. In FIG. 23C, the signal line driver circuit is mounted by a TAB method; however, a scanning line driver circuit may be mounted by a TAB method.

When the IC chip is mounted by a TAB method, the pixel portion can be largely provided with respect to the substrate, and a frame can be narrowed.

The IC chip is formed using a silicon wafer, but an IC in which a circuit is formed over a glass substrate (hereinafter referred to as a driver IC) may be provided in place of the IC chip. Since the IC chip is taken out of a circular silicon wafer, there is limitation on the shape of a mother substrate. On the other hand, the driver IC has a glass mother substrate and there is no limitation on the shape. Thus, productivity can be improved. Therefore, the geometry of the driver IC can be freely set. For example, when the driver IC is formed to have a long side of 15 mm to 80 mm in length, the necessary number of the driver ICs can be reduced compared with the case of mounting the IC chip. Accordingly, the number of connection terminals can be reduced and yield in manufacturing can be improved.

The driver IC can be formed using a crystalline semiconductor formed over a substrate, and the crystalline semiconductor may be formed by continuous wave laser light irradiation. A semiconductor film formed by continuous wave laser light irradiation has few crystal defects and has crystal grains with large grain diameters. Accordingly, a transistor having such a semiconductor film has favorable mobility and response speed and high-speed drive can be performed, which is suitable for the driver IC.

EXAMPLE 8

Figure 16:
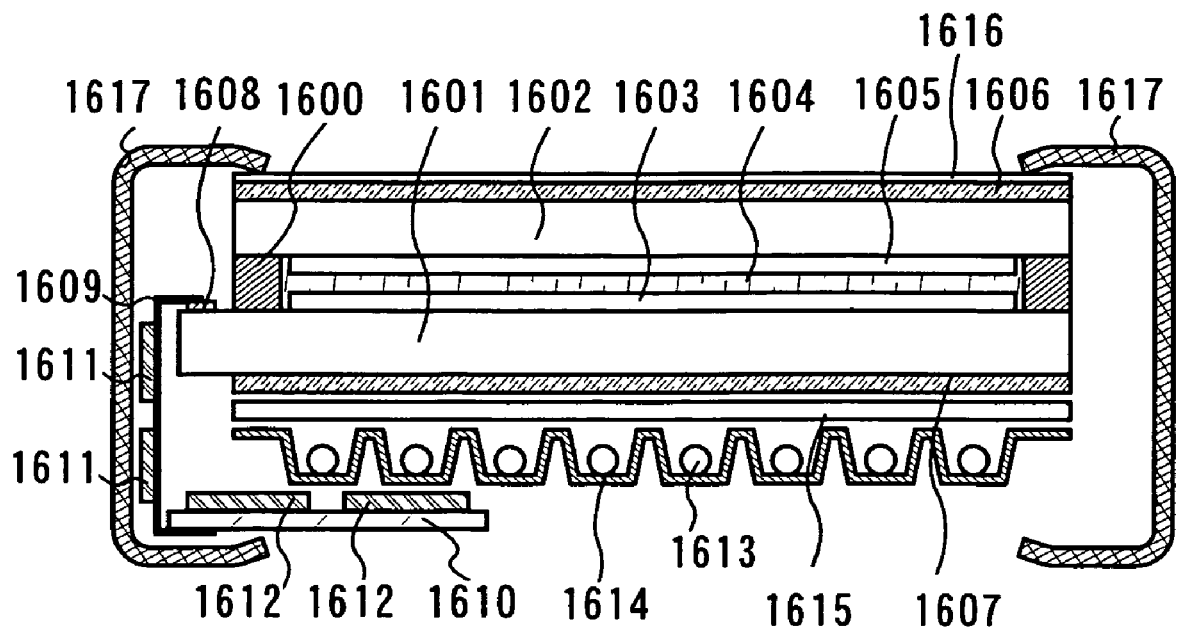
FIG. 16 shows a structure of a liquid crystal display module according to the present invention.

A display module is described in this example. Here, a liquid crystal module is described as an example of a display module with reference to FIG. 16.

An active matrix substrate 1601 and an opposing substrate 1602 are fixed to each other with a sealant 1600, and a pixel portion 1603 and a liquid crystal layer 1604 are provided therebetween to form a display region.

A colored layer 1605 is necessary to perform color display. In the case of an RGB system, a colored layer corresponding to each color of red, green, and blue is provided corresponding to each pixel. Polarizing plates 1606 and 1607 are provided outside the active matrix substrate 1601 and the opposing substrate 1602. In addition, a protective film 1616 is formed over the polarizing plate 1606, which relieves impact from outside.

A connection terminal 1608 provided for the active matrix substrate 1601 is connected to a wiring substrate 1610 through an FPC 1609. The FPC or a connection wiring is provided with a pixel driver circuit (an IC chip, a driver IC, or the like) 1611, and an external circuit 1612 such as a control circuit or a power supply circuit is incorporated in the wiring substrate 1610.

A cold cathode fluorescent tube 1613, a reflecting plate 1614, and an optical film 1615 are a backlight unit and serve as a light source to project light on a liquid crystal display panel. The liquid crystal panel, the light source, the wiring substrate, the FPC, and the like are held and protected by a bezel 1617.

Note that any of Embodiment Modes 1 to 7 can be applied to this example.

EXAMPLE 9

An appearance of a light emitting display module is described in this example as an example of a display module with reference to FIGS. 22A and 22B. FIG. 22A is a top view of a panel in which a first substrate and a second substrate are sealed with a first sealant 1205 and a second sealant. FIG. 22B corresponds to a cross-sectional view taken along line A-A' in FIG. 22A.

In FIG. 22A, reference numeral 1201 shown in dashed line denotes a signal line (source line) driver circuit; 1202, a pixel portion; and 1203, a scanning line (gate line) driver circuit. In this example, the signal line driver circuit 1201, the pixel portion 1202, and the scanning line driver circuit 1203 are in a region sealed with the first sealant and the second sealant. A high-viscosity epoxy resin including filler is preferably used as the first sealant. A low-viscosity epoxy resin is preferably used as the second sealant. The first sealant 1205 and the second sealant are preferably materials which transmit as little moisture or oxygen as possible.

A drying agent may be provided between the pixel portion 1202 and the first sealant 1205. Moreover, in the pixel portion, a drying agent may be provided over a scanning line or a signal line. It is preferable to use a substance which adsorbs water ($H_2O$) by chemical adsorption like oxide of alkaline earth metal such as calcium oxide (CaO) or barium oxide (BaO) as the drying agent. However, not limiting thereto, a substance which adsorbs water by physical adsorption, such as zeolite or silica gel, can also be used.

The drying agent can be fixed to the second substrate 1204 with a granular substance of the drying agent contained in a highly moisture permeable resin. As the highly moisture permeable resin, an acrylic resin can be used, such as ester acrylate, ether acrylate, ester urethane acrylate, ether urethane acrylate, butadiene urethane acrylate, special urethane acrylate, epoxy acrylate, amino resin acrylate, or acrylic resin acrylate. In addition, an epoxy resin can be used, such as a bisphenol A type liquid resin, a bisphenol A type solid resin, a bromine-containing epoxy resin, a bisphenol F type resin, a bisphenol AD type resin, a phenol resin, a cresol type resin, a novolac resin, a cyclic aliphatic epoxy resin, an Epi-Bis type epoxy resin, a glycidyl ester resin, a glycidyl amine resin, a heterocyclic epoxy resin, or a modified epoxy resin. In addition, another substance may be used. For example, an inorganic material such as a siloxane polymer, polyimide, PSG (phosphosilicate glass), BPSG (borophosphosilicate glass), or the like may be used.

The entry of moisture into a display element and the deterioration caused thereby can be suppressed without decreasing an aperture ratio by providing the drying agent in a region overlapped with the scanning line or by fixing the drying agent to the second substrate with a granular substance of the drying agent contained in the highly moisture permeable resin.

Note that reference numeral 1210 denotes a connection wiring for transmitting a signal to be inputted to the signal line driver circuit 1201 and the scanning line driver circuit 1203, and the signal line driver circuit 1201 and the scanning driver circuit 1203 receive a video signal or a clock signal from an FPC (flexible printed wiring) 1209 that is an external input terminal through the connection wiring.

Subsequently, a cross-sectional structure is described with reference to FIG. 22B. A driver circuit and a pixel portion 1202 are formed over a first substrate 1200 and include a plurality of semiconductor elements typified by a TFT. A signal line driver circuit 1201 is shown as the driver circuit. Note that the signal line driver circuit 1201 is formed using a CMOS circuit which is a combination of an n-channel TFT 1221 and a p-channel TFT 1222.

In this example, TFTs of the signal line driver circuit, the scanning line driver circuit, and the pixel portion are formed over one substrate. Therefore, the volume of a light emitting display device can be reduced.

The pixel portion 1202 has a plurality of pixels each including a switching TFT 1211, a driving TFT 1212, and a first pixel electrode (anode) 1213 made of a reflective conductive film which is electrically connected to the drain of the driving TFT 1212.

An interlayer insulating film 1220 of these TFTs 1211, 1212, 1221, and 1222 can be formed of a similar material to that of the second insulating layer 613 in Embodiment Mode 6.

An insulator (referred to as a bank, a partition wall, a barrier, a mound, or the like) 1214 is formed at both ends of the first pixel electrode (anode) 1213. The insulator 1214 is formed to have a curved surface at an upper end or a lower end thereof in order to increase the coverage of a film to be formed over the insulator 1214. The insulator 1214 may be covered with a protective film (planarizing layer) formed of an aluminum nitride film, an aluminum nitride oxide film, a thin film containing carbon as its main component, or a silicon nitride film. Stray light from a light emitting element to be formed can be absorbed by the insulator 1214 by using, as the insulator 1214, an organic material in which a material absorbing visible light, such as a black pigment or a coloring matter is dissolved or dispersed. Thus, the contrast of each pixel is enhanced. Further, the interlayer insulating film 1220 formed of a light-shielding insulator can generate a light-shielding effect when combined with the insulator 1214.

A layer including a light emitting material 1215 is selectively formed over the first pixel electrode (anode) 1213 by evaporating an organic compound material.

The layer including a light emitting material 1215 can appropriately have the structure described in Example 5.

Thus, a light emitting element 1217 including the first pixel electrode (anode) 1213, the layer including a light emitting material 1215, and a second pixel electrode (cathode) 1216 is formed. The light emitting element 1217 emits light to the side of the second substrate 1204.

A protective laminated layer 1218 is formed to seal the light emitting element 1217. The protective laminated layer is a laminated layer of a first inorganic insulating film, a stress relaxation film, and a second inorganic insulating film. The protective laminated layer 1218 and the second substrate 1204 are attached to each other with the first sealant 1205 and the second sealant 1206. Note that the second sealant is preferably dropped using an apparatus for dropping a sealant like the apparatus for dropping liquid crystal shown in FIGS. 15A and 15B described in Example 3. After the sealant is applied to the active matrix substrate by being dropped or discharged from a dispenser, the second substrate is attached to the active matrix substrate and ultraviolet curing is performed in vacuo. Thus, sealing can be performed.

A polarizing plate 1225 is fixed to the surface of the second substrate 1204, and a half-wave or quarter-wave retardation plate 1229 and an anti-reflective film 1226 are formed over the polarizing plate 1225. Alternatively, the half-wave or quarter-wave retardation plates 1229 and the polarizing plate 1225 may be sequentially formed from the side of the second substrate 1204. The retardation plate and the polarizing plate can prevent external light from being reflected by the pixel electrode. When the first pixel electrode 1213 and the second pixel electrode 1216 are formed of a light transmitting or semi-light transmitting conductive film and the interlayer insulating film 1220 is formed of a material which absorbs visible light or an organic material in which a material absorbing visible light is dissolved or dispersed, external light is not reflected by each pixel electrode. Therefore, the retardation plate and the polarizing plate may not be used.

A connection wiring 1208 is electrically connected to an FPC 1209 by an anisotropic conductive film or an anisotropic conductive resin 1227. Further, a connection portion of each wiring layer and a connection terminal is preferably sealed with a sealing resin. This structure can prevent moisture from a section from entering and deteriorating the light emitting element.

Note that a space between the second substrate 1204 and the protective laminated layer 1218 may be filled with an inert gas, for example, a nitrogen gas. The entry of moisture or oxygen can be further prevented.

A colored layer can be provided between the pixel portion 1202 and the polarizing plate 1225. In this case, full color display can be performed by providing the pixel portion with a light emitting element which can emit white light and by separately providing the second substrate 1204 with colored layers showing RGB. In addition, full color display can be performed by providing the pixel portion with a light emitting element which can emit blue light and by separately providing a color conversion layer or the like. In addition, each pixel portion can be provided with light emitting elements which emit red, green, and blue light, and the colored layer can be used for the second substrate 1204. Such a display module has high color purity of each RBG and can perform high-definition display.

A light emitting display module may be formed using a substrate of a film, a resin, or the like for either the first substrate 1200 or the second substrate 1204 or both thereof. A display device can be reduced in weight, size, and thickness by sealing without using an opposing substrate as described above.

Note that any of Embodiment Modes 1 to 7 can be applied to this example. A liquid crystal display module and a light emitting display module are described as an example of a display module in this example; however, the invention is not limited thereto. The invention can be appropriately applied to a display module such as a DMD (Digital Micromirror Device), a PDP (Plasma Display Panel), a FED (Field Emission Display), or an electrophoretic display device (electronic paper).

EXAMPLE 10

Various electronic devices can be manufactured by incorporating the display device described in the above example into a chassis. Examples of electronic devices can be given as follows: a television set, a camera such as a video camera or a digital camera, a goggle type display (head mounted display), a navigation system, an audio reproducing device (a car audio, an audio component, or the like), a personal computer, a game machine, a personal digital assistant (a mobile computer, a cellular phone, a portable game machine, an electronic book, or the like), an image reproducing device including a recording medium (specifically, a device capable of reproducing a recording medium such as a Digital Versatile Disc (DVD) and having a display that can display the image), and the like. Here, a television set and a block diagram thereof are shown in FIG. 25 and FIG. 24, respectively and a digital camera is shown in FIG. 26 as typical examples of the electronic devices.

Figure 24:
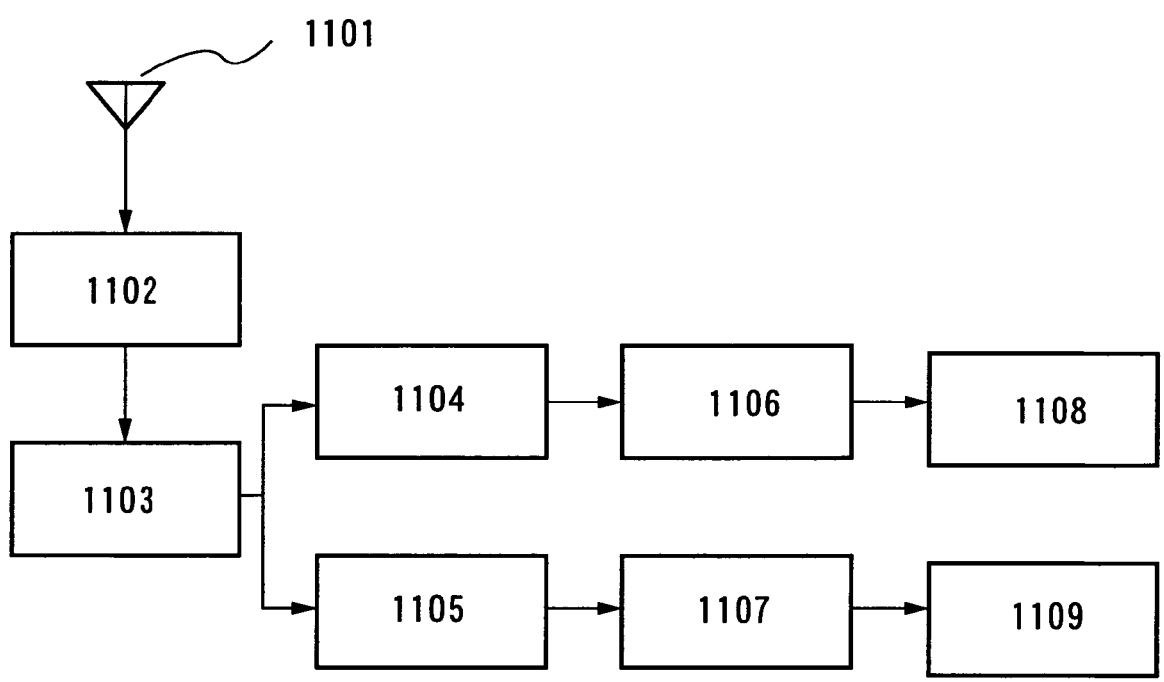
FIG. 24 is a block diagram showing a structure of an electronic device.
Figure 25:
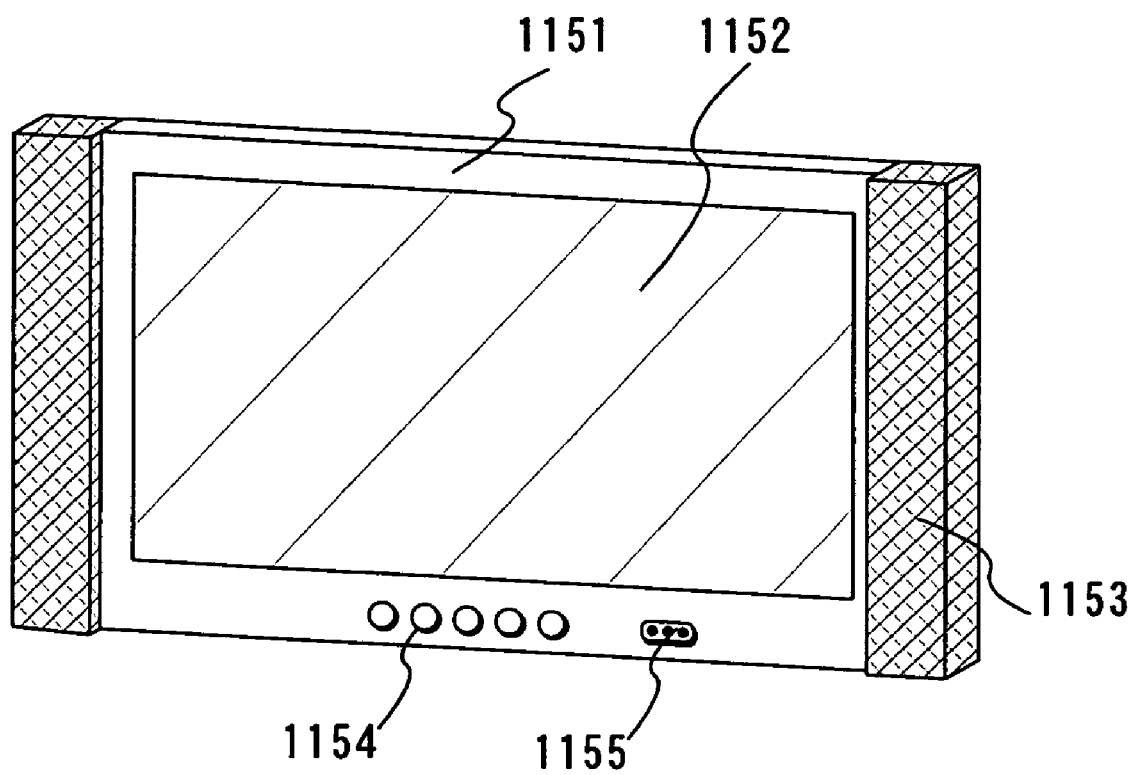
FIG. 25 shows an example of electronic devices.

FIG. 24 is a block diagram showing a typical structure of a television set that receives analog television broadcasting. In FIG. 24, the airwaves for television broadcasting received by an antenna 1101 are inputted to a tuner 1102. The tuner 1102 generates and outputs intermediate frequency (IF) signals by mixing the high frequency television signals inputted from the antenna 1101 with local repetition frequency signals that are controlled in accordance with the desired reception frequency.

The IF signals taken out by the tuner 1102 are amplified to required voltage by an intermediate frequency amplifier (IF amplifier) 1103. Thereafter, the amplified IF signals are detected by a video detection circuit 1104 and an audio detection circuit 1105. The video signals outputted from the video detection circuit 1104 are separated into luminance signals and chrominance signals by a video processing circuit 1106. Further, the luminance signals and the chrominance signals are subjected to the predetermined video signal processing to be video signals, so that the video signals are outputted to a video output portion 1108 of the display device of the invention, typically, a liquid crystal display device, a light emitting display device, a DMD (Digital Micromirror Device), a PDP (Plasma Display Panel), a FED (Field Emission Display), an electrophoretic display device (electronic paper), or the like. Note that the one using a liquid crystal display device as a display device is a liquid crystal television, and the one using a light emitting display device is an EL (Electro Luminescence) television. The same applies to the case of using another display device.

The signals outputted from the audio detection circuit 1105 are subjected to processing such as FM demodulation by an audio processing circuit 1107 to be audio signals. The audio signals are then appropriately amplified to be outputted to an audio output portion 1109 of a speaker or the like.

The television set according to the invention may be applicable to digital broadcastings such as terrestrial digital broadcasting, cable digital broadcasting, and BS digital broadcasting as well as analog broadcastings such as terrestrial broadcasting in a VHF band, a UHF band, or the like, cable broadcasting, and BS broadcasting.

FIG. 25 is a front perspective view of the television set, which includes a chassis 1151, a display portion 1152, a speaker portion 1153, an operational portion 1154, a video input terminal 1155, and the like. The television set shown in FIG. 25 has the structure as shown in FIG. 24.

The display portion 1152 is an example of the video output portion 1108 in FIG. 24, which displays images.

The speaker portion 1153 is an example of the audio output portion in FIG. 24, which outputs sound.

The operational portion 1154 is provided with a power source switch, a volume switch, a channel selection switch, a tuning switch, a selection switch, and the like to turn on and off the television set, select images, control sound, select a tuner, and the like by holding the switches down. Note that the above-described selection can be carried out also by a remote-control operation unit, though not shown in the drawing.

The video input terminal 1155 inputs video signals to the television set from an external portion such as a VTR, a DVD, or a game machine.

In the case where the television set described in this example is a wall-mounted television set, a portion for hanging on walls is provided at the rear of the body thereof.

A television set can be manufactured at low cost with high throughput and yield by applying the display device of the invention to the display portion of the television set. Consequently, a large area display medium such as a wall-mounted television set, an information display board used in a railway station, airport, or the like, and an advertisement display board on the street can be manufactured at low cost.

Figure 26A:
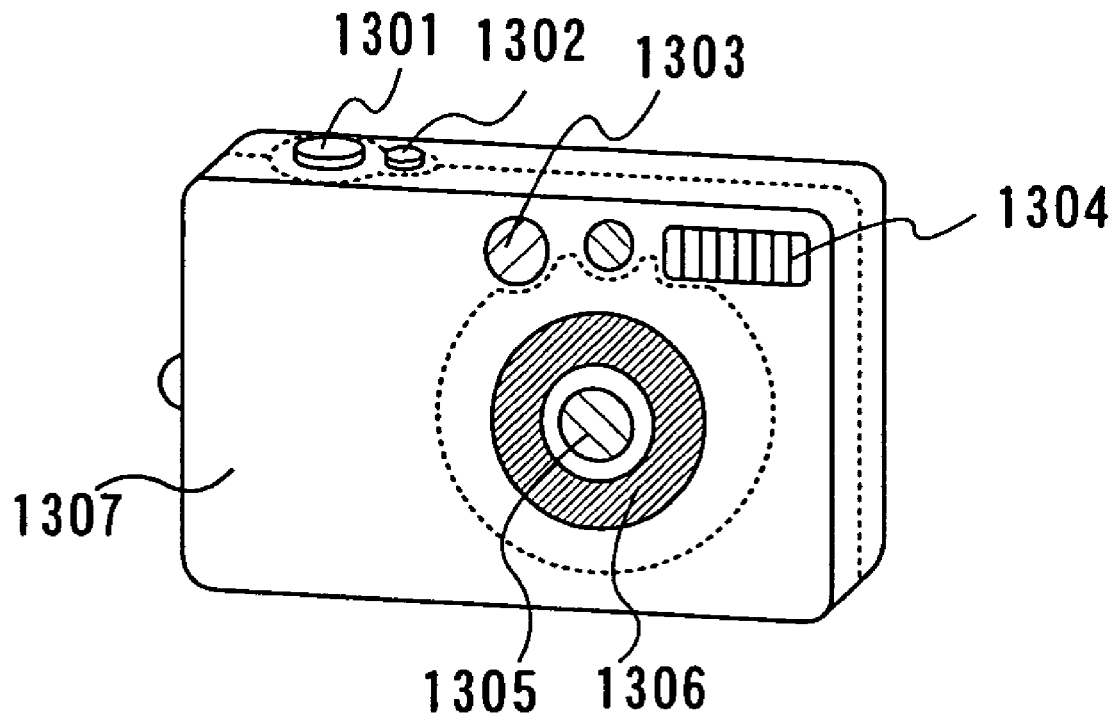
FIGS. 26A and 26B show an example of electronic devices.
Figure 26B:
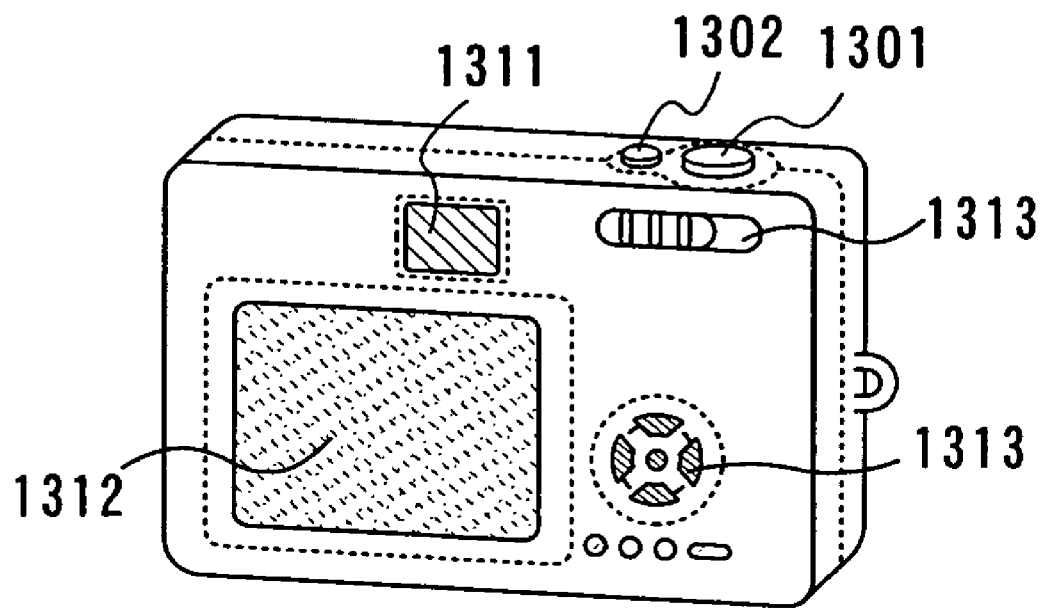

FIGS. 26A and 26B show an example of a digital camera. FIG. 26A is a front perspective view of the digital camera, and FIG. 26B is a rear perspective view thereof. In FIG. 26A, the digital camera includes a release button 1301, a main switch 1302, a viewfinder window 1303, flash 1304, a lens 1305, a lens barrel 1306, and a chassis 1307.

In FIG. 26B, the digital camera also includes a viewfinder eyepiece 1311, a monitor 1312, and an operational button 1313.

When the release button 1301 is held halfway down, a focus adjustment mechanism and an exposure adjustment mechanism are operated. Subsequently, holding the release button all the way down releases a shutter.

The digital camera is turned on or off by pressing or turning the main switch 1302.

The viewfinder window 1303 is provided above the lens 1305 on the front face of the digital camera, and is used to check a shooting range and a focusing point through the viewfinder eyepiece 1311 shown in FIG. 26B.

The flash 1304 is provided at the upper portion of the front face of the digital camera. In the case of photographing a subject of the low luminance level, auxiliary light is emitted simultaneously when the release button is held down and the shutter is opened.

The lens 1305 is provided on the front of the digital camera. The lens includes a focusing lens, a zoom lens, and the like. A shooting optical system includes the lens along with a shutter and an aperture, which are not shown in the drawing. An image sensing device such as a CCD (Charge Coupled Device) is provided at the rear of the lens.

The lens barrel 1306 is used for shifting the lens position to focus the focusing lens, the zoom lens, and the like on a subject. At the time of taking a picture, the lens barrel is protruded from the body so that the lens 1305 is shifted toward a subject. At the time of carrying the digital camera, the lens 1305 is stored inside the main body to be compact. Note that, although the lens barrel can be protruded to take a close-up picture of a subject in this example, the invention is not limited to the structure. The invention may be applied to a digital camera which can take a close-up picture without protruding a lens barrel due to a structure of a shooting optical system inside the chassis 1307.

The viewfinder eyepiece 1311 is provided at the upper portion of the rear of the digital camera, through which the shooting range and the focusing point are checked by sight.

The operational button 1313 is a button for various kinds of functions and is provided at the rear of the digital camera. The operational button includes a setup button, a menu button, a display button, a functional button, a selection button, and the like.

A digital camera can be manufactured at low cost with high throughput and yield by applying the display device of the invention to a monitor.

The invention claimed is:

1. A method for manufacturing a display device, comprising the steps of:
    forming a first conductive film over an insulating surface;
    forming a first film pattern over the first conductive film;
    forming a second film pattern over the first conductive film and in the outer periphery of the first film pattern;
    exposing a part of the first conductive film by removing the first film pattern after the step of forming the second film;
    forming a pixel electrode by removing the exposed part of the first conductive film;
    forming a gate electrode over the insulating surface;
    forming a gate insulating film over the gate electrode and over the pixel electrode,
    forming a semiconductor region over the gate electrode with the gate insulating film therebetween; and
    forming a second conductive layer over the semiconductor region,
    wherein the second conductive layer is electrically connected to the semiconductor region and to the pixel electrode.

2. A method for manufacturing a display device according to claim 1, wherein the conductive film comprises any one of indium tin oxide, indium zinc oxide, and gallium-added zinc oxide.

3. A method for manufacturing a display device according to claim 1, wherein the first film pattern is formed by any one of a droplet discharge method, an ink-jet method, and a printing method.

4. A method for manufacturing a display device according to a claim 1, wherein wettability of the first film pattern is lower than that of the second film pattern.

5. A method for manufacturing a display device according to claim 1, wherein the first film pattern is formed by forming an insulating layer and exposing the surface of the insulating layer to fluorine plasma.

6. A method for manufacturing a display device according to claim 1, wherein the first film pattern comprises a compound including an alkyl group or a fluorocarbon chain.

7. A method for manufacturing a display device according to claim 1, wherein wettability of the second film pattern is higher than that of the first film pattern.

8. A method for manufacturing a display device according to claim 1, further comprising the step of forming a thin film transistor including a gate electrode, a gate insulating film, a semiconductor region, a source electrode and a drain electrode, after forming the pixel electrode, wherein any one of the source electrode and the drain electrode is connected to the pixel electrode.

9. A method for manufacturing a display device according to claim 8, wherein the thin film transistor is a top gate thin film transistor.

10. A method for manufacturing a display device according to claim 8, wherein the thin film transistor is a bottom gate thin film transistor.

11. A method for manufacturing a display device according to claim 8, wherein the thin film transistor is a coplanar thin film transistor.

12. A method for manufacturing a display device according to claim 8, wherein the thin film transistor is a staggered thin film transistor.

13. A method for manufacturing a display device, comprising the steps of:
    forming a first conductive film over an insulating surface;
    forming a first film pattern over the first conductive film;
    forming a second film pattern over the first conductive film and in a region except for a region where the first film pattern is formed;
    exposing a part of the first conductive film by removing the first film pattern after the step of forming the second film;
    forming a pixel electrode by removing the exposed part of the first conductive film;
    forming a gate electrode over the insulating surface;
    forming a gate insulating film over the gate electrode and over the pixel electrode,
    forming a semiconductor region over the gate electrode with the gate insulating film therebetween; and
    forming a second conductive layer over the semiconductor region,
    wherein the second conductive layer is electrically connected to the semiconductor region and to the pixel electrode.

14. A method for manufacturing a display device according to claim 13, wherein the conductive film comprises any one of indium tin oxide, indium zinc oxide, and gallium-added zinc oxide.

15. A method for manufacturing a display device according to claim 13, wherein the first film pattern is formed by any one of a droplet discharge method, an ink-jet method, and a printing method.

16. A method for manufacturing a display device according to a claim 13, wherein wettability of the first film pattern is lower than that of the second film pattern.

17. A method for manufacturing a display device according to claim 13, wherein the first film pattern is formed by forming an insulating layer and exposing the surface of the insulating layer to fluorine plasma.

18. A method for manufacturing a display device according to claim 13, wherein the first film pattern comprises a compound including an alkyl group or a fluorocarbon chain.

19. A method for manufacturing a display device according to claim 13, wherein wettability of the second film pattern is higher than that of the first film pattern.

20. A method for manufacturing a display device according to claim 13, further comprising the step of forming a thin film transistor including a gate electrode, a gate insulating film, a semiconductor region, a source electrode and a drain electrode, after forming the pixel electrode, wherein any one of the source electrode and the drain electrode is connected to the pixel electrode.

21. A method for manufacturing a display device according to claim 20, wherein the thin film transistor is a top gate thin film transistor.

22. A method for manufacturing a display device according to claim 20, wherein the thin film transistor is a bottom gate thin film transistor.

23. A method for manufacturing a display device according to claim 20, wherein the thin, film transistor is a coplanar thin film transistor.

24. A method for manufacturing a display device according to claim 20, wherein the thin film transistor is a staggered thin film transistor.

25. A method for manufacturing a display device, comprising the steps of:
    forming a first conductive film over an insulating surface;
    forming a first film pattern over the first conductive film;
    forming a second film pattern over the first conductive film and in the outer periphery of the first film pattern;
    removing the first film pattern after the step of forming the second film;
    forming a pixel electrode by removing a part of the first conductive film using the second film pattern as a mask;
    forming a gate electrode over the insulating surface;
    forming a gate insulating film over the gate electrode and over the pixel electrode,
    forming a semiconductor region over the gate electrode with the gate insulating film therebetween; and
    forming a second conductive layer over the semiconductor region,
    wherein the second conductive layer is electrically connected to the semiconductor region and to the pixel electrode.

26. A method for manufacturing a display device according to claim 25, wherein the conductive film comprises any one of indium tin oxide, indium zinc oxide, and gallium-added zinc oxide.

27. A method for manufacturing a display device according to claim 25, wherein the first film pattern is formed by any one of a droplet discharge method, an ink-jet method, and a printing method.

28. A method for manufacturing a display device according to a claim 25, wherein wettability of the first film pattern is lower than that of the second film pattern.

29. A method for manufacturing a display device according to claim 25, wherein the first film pattern is formed by forming an insulating layer and exposing the surface of the insulating layer to fluorine plasma.

30. A method for manufacturing a display device according to claim 25, wherein the first film pattern comprises a compound including an alkyl group or a fluorocarbon chain.

31. A method for manufacturing a display device according to claim 25, wherein wettability of the second film pattern is higher than that of the first film pattern.

32. A method for manufacturing a display device according to claim 25, further, comprising the step of forming a thin film transistor including a gate electrode, a gate insulating film, a semiconductor region, a source electrode and a drain electrode, after forming the pixel electrode, wherein any one of the source electrode and the drain electrode is connected to the pixel electrode.

33. A method for manufacturing a display device according to claim 32, wherein the thin film transistor is a top gate thin film transistor.

34. A method for manufacturing a display device according to claim 32, wherein the thin film transistor is a bottom gate thin film transistor.

35. A method for manufacturing a display device according to claim 32, wherein the thin film transistor is a coplanar thin film transistor.

36. A method for manufacturing a display device according to claim 32, wherein the thin, film transistor is a staggered thin film transistor.

37. A method for manufacturing a display device, comprising the steps of:
    forming a first conductive film over an insulating surface;
    forming a first film pattern over the first conductive film;
    forming a second film pattern over the first conductive film and in a region except for a region where the first film pattern is formed;
    removing the first film pattern after the step of forming the second film;
    forming a pixel electrode by removing a part of the first conductive film using the second film pattern as a mask;
    forming a gate electrode over the insulating surface;
    forming a gate insulating film over the gate electrode and over the pixel electrode,
    forming a semiconductor region over the gate electrode with the gate insulating film therebetween; and
    forming a second conductive layer over the semiconductor region,
    wherein the second conductive layer is electrically connected to the semiconductor region and to the pixel electrode.

38. A method for manufacturing a display device according to claim 37, wherein the conductive film comprises any one of indium tin oxide, indium zinc oxide, and gallium-added zinc oxide.

39. A method for manufacturing a display device according to claim 37, wherein the first film pattern is formed by any one of a droplet discharge method, an ink-jet method, and a printing method.

40. A method for manufacturing a display device according to a claim 37, wherein wettability of the first film pattern is lower than that of the second film pattern.

41. A method for manufacturing a display device according to claim 37, wherein the first film pattern is formed by forming an insulating layer and exposing the surface of the insulating layer to fluorine plasma.

42. A method for manufacturing a display device according to claim 37, wherein the first film pattern comprises a compound including an alkyl group or a fluorocarbon chain.

43. A method for manufacturing a display device according to claim 37, wherein wettability of the second film pattern is higher than that of the first film pattern.

44. A method for manufacturing a display device according to claim 37, further comprising the step of forming a thin film transistor including a gate electrode, a gate insulating film, a semiconductor region, a source electrode and a drain electrode, after forming the pixel electrode, wherein any one of the source electrode and the drain electrode is connected to the pixel electrode.

45. A method for manufacturing a display device according to claim 44, wherein the thin film transistor is a top gate thin film transistor.

46. A method for manufacturing a display device according to claim 44, wherein the thin film transistor is a bottom gate thin film transistor.

47. A method for manufacturing a display device according to claim 44, wherein the thin film transistor is a coplanar thin film transistor.

48. A method for manufacturing a display device according to claim 44, wherein the thin film transistor is a staggered thin film transistor.

* * * * *